(12) United States Patent
Fallon et al.

(10) Patent No.: US 6,759,738 B1
(45) Date of Patent: *Jul. 6, 2004

(54) SYSTEMS INTERCONNECTED BY BUMPS OF JOINING MATERIAL

(75) Inventors: Kenneth Michael Fallon, Vestal, NY (US); Christian Robert Le Coz, Endicott, NY (US); Mark Vincent Pierson, Binghamton, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 698 days.

(21) Appl. No.: 09/250,524

(22) Filed: Feb. 16, 1999

Related U.S. Application Data

(62) Division of application No. 08/510,401, filed on Aug. 2, 1995, now Pat. No. 5,872,051.

(51) Int. Cl.[7] .......................... H01L 23/48; H01L 29/40
(52) U.S. Cl. ...................... 257/690; 257/700; 257/737; 257/738
(58) Field of Search .................... 438/613; 228/180, 228/22; 257/737, 738, 690, 700

(56) References Cited

U.S. PATENT DOCUMENTS 5,194,930 A * 3/1993 Papathomas et al.
5,251,806 A * 10/1993 Agarwala et al.
5,252,857 A * 10/1993 Kane et al.
5,297,333 A * 3/1994 Kusaka
5,406,701 A * 4/1995 Pepe et al.
5,448,114 A * 9/1995 Kondoh et al.
5,477,419 A * 12/1995 Goodman et al.
5,532,612 A * 7/1996 Liang
5,798,285 A * 8/1998 Bentlage et al.
5,825,629 A * 10/1998 Hoebener et al.

* cited by examiner

Primary Examiner—David E. Graybill
(74) Attorney, Agent, or Firm—John R. Pivnichny

(57) ABSTRACT

A substrate is provided with vias communicating with surface contacts or bumps. Joining material paste is forced through holes in a screen onto an area array of the contacts on the substrate then the screen is biased against the substrate as the paste is heated and cooled to transfer the joining material onto the contacts. Alternately, joining material paste is forced into the screen and then a substrate is placed onto the screen with an area array of bump contacts of the substrate in contact with the solder paste, and then the paste is heated and cooled to transfer the material onto the bumps. The joining material may be a solder paste, conductive adhesive paste, or transient liquid bond paste. The substrate may be a semiconductor chip substrate, flexible or rigid organic substrate, or a metal substrate coated to form a dielectric surface. Also, the substrate may be a computer chip, chip carrier substrate or a circuit board substrate. The process may be used to produce flip chips, ball grid array modules, column grid array modules, circuit boards, and attachment structures of the preceding components including information handling systems.

3 Claims, 51 Drawing Sheets

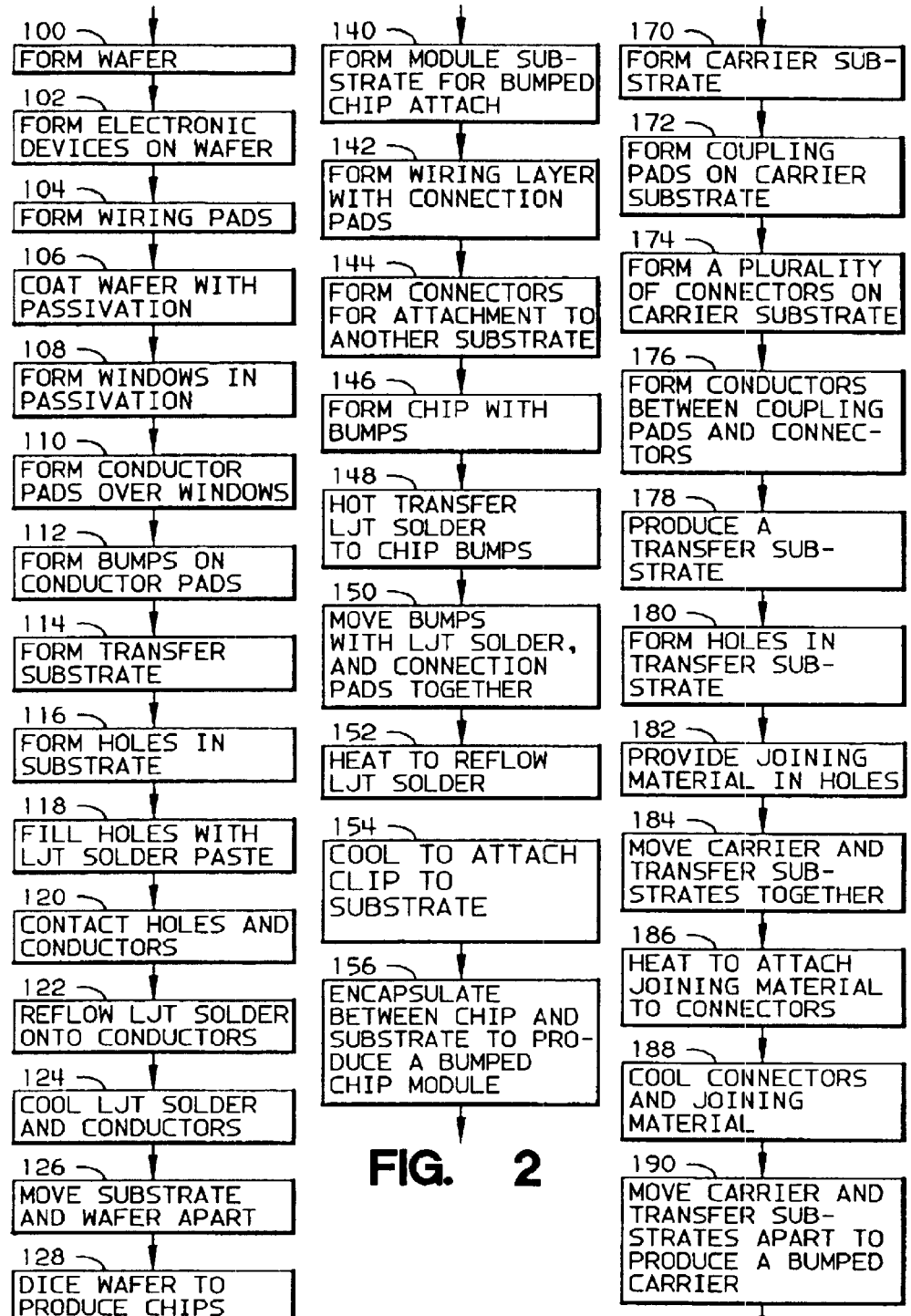

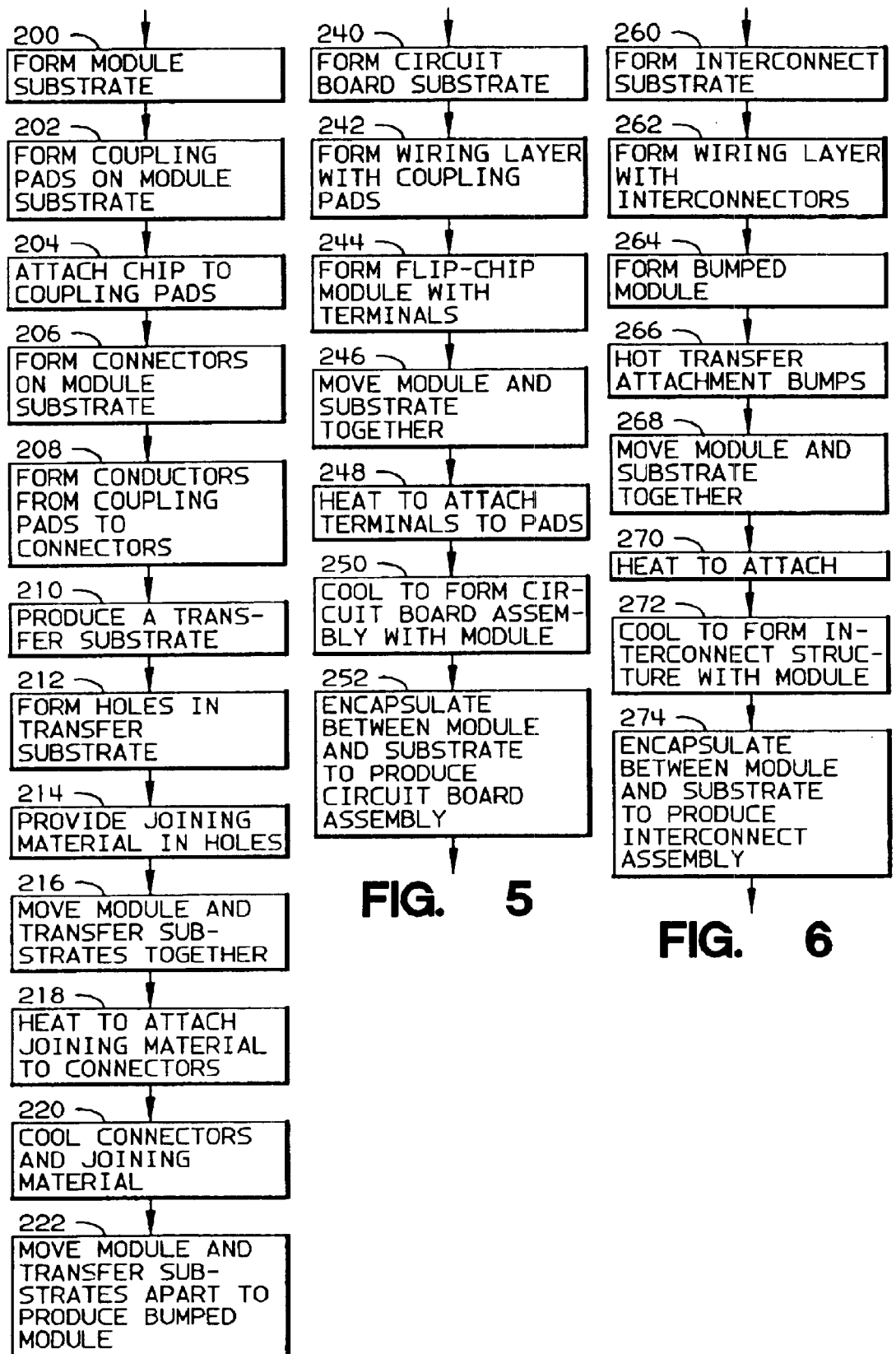

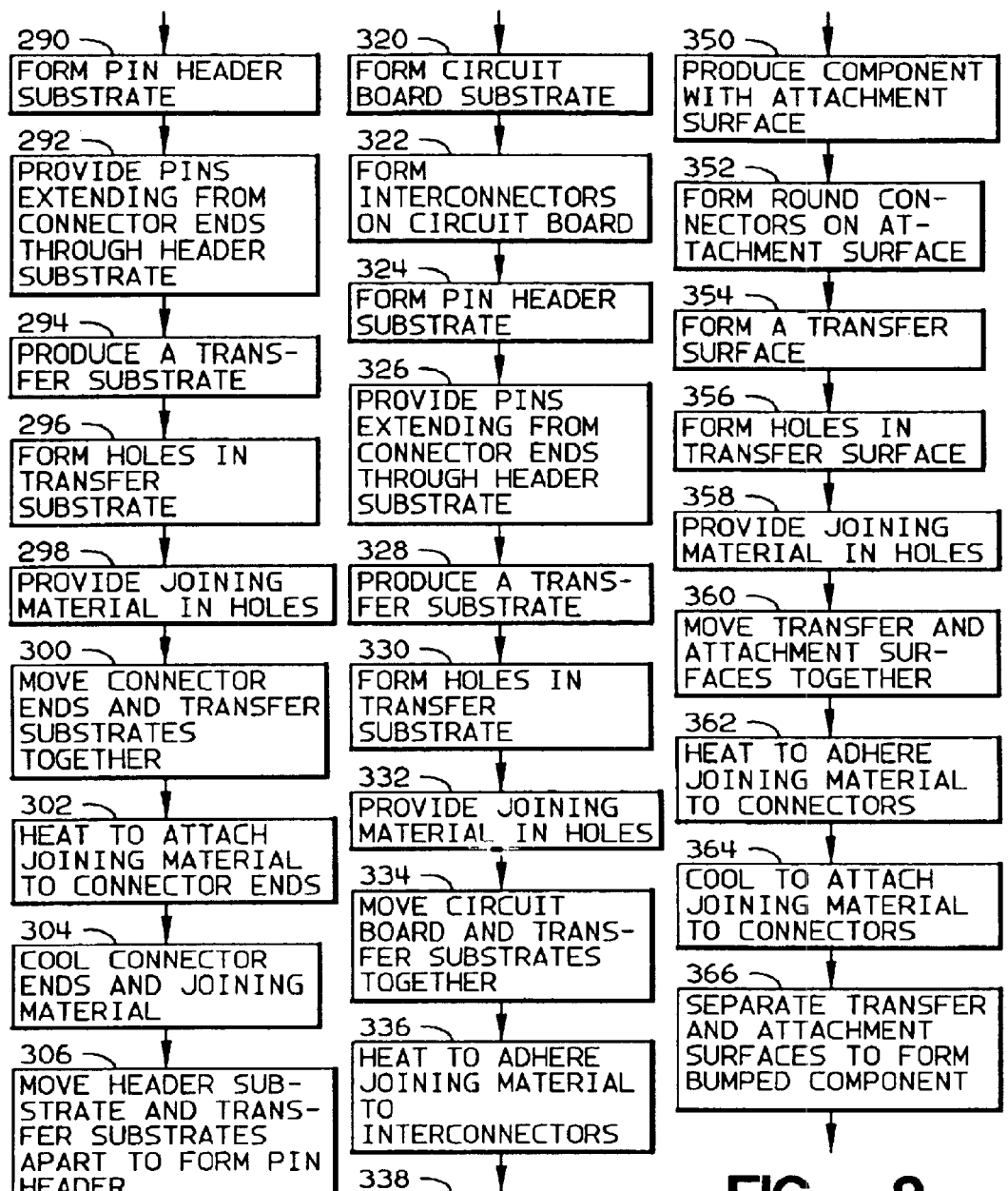

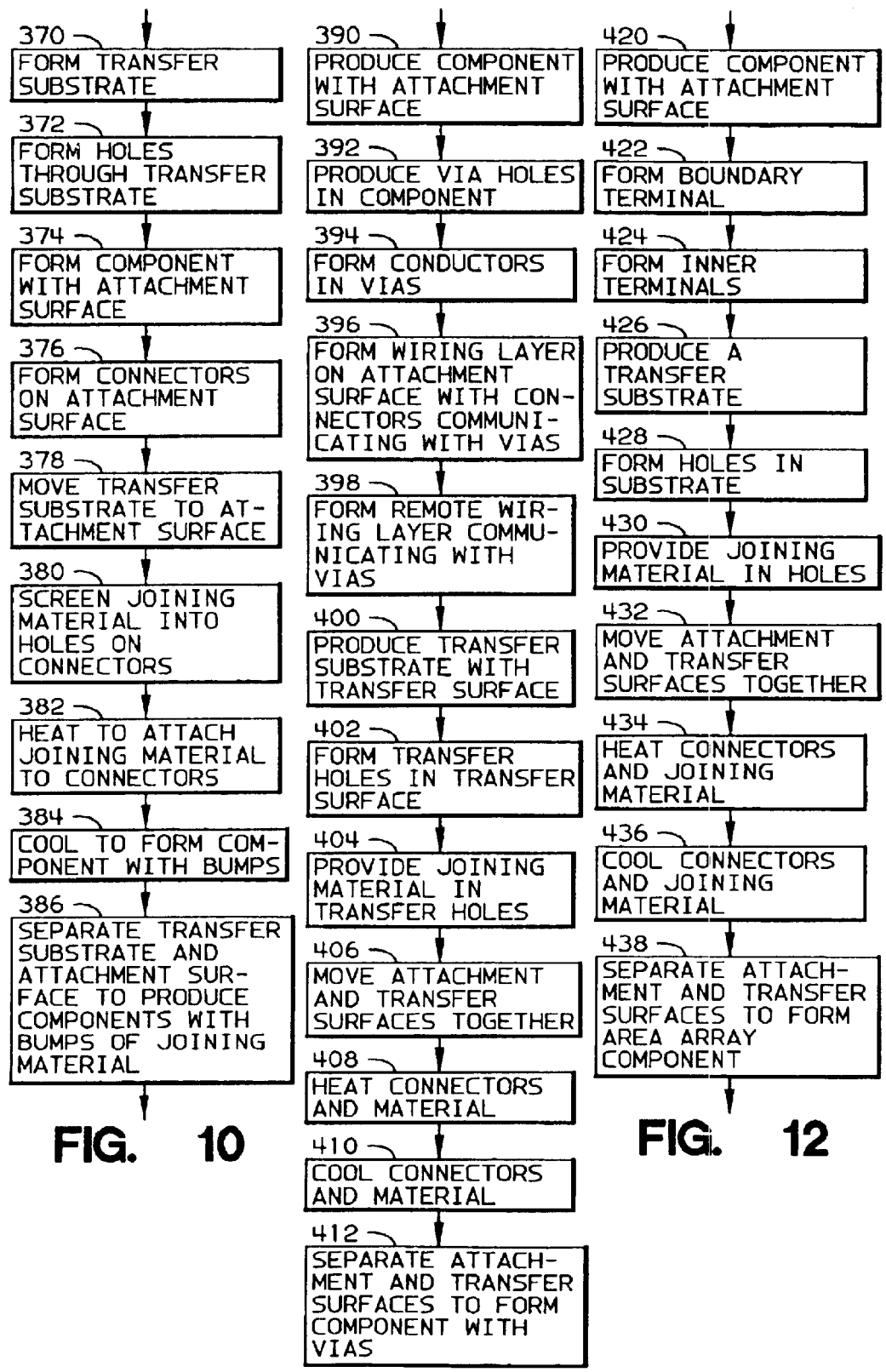

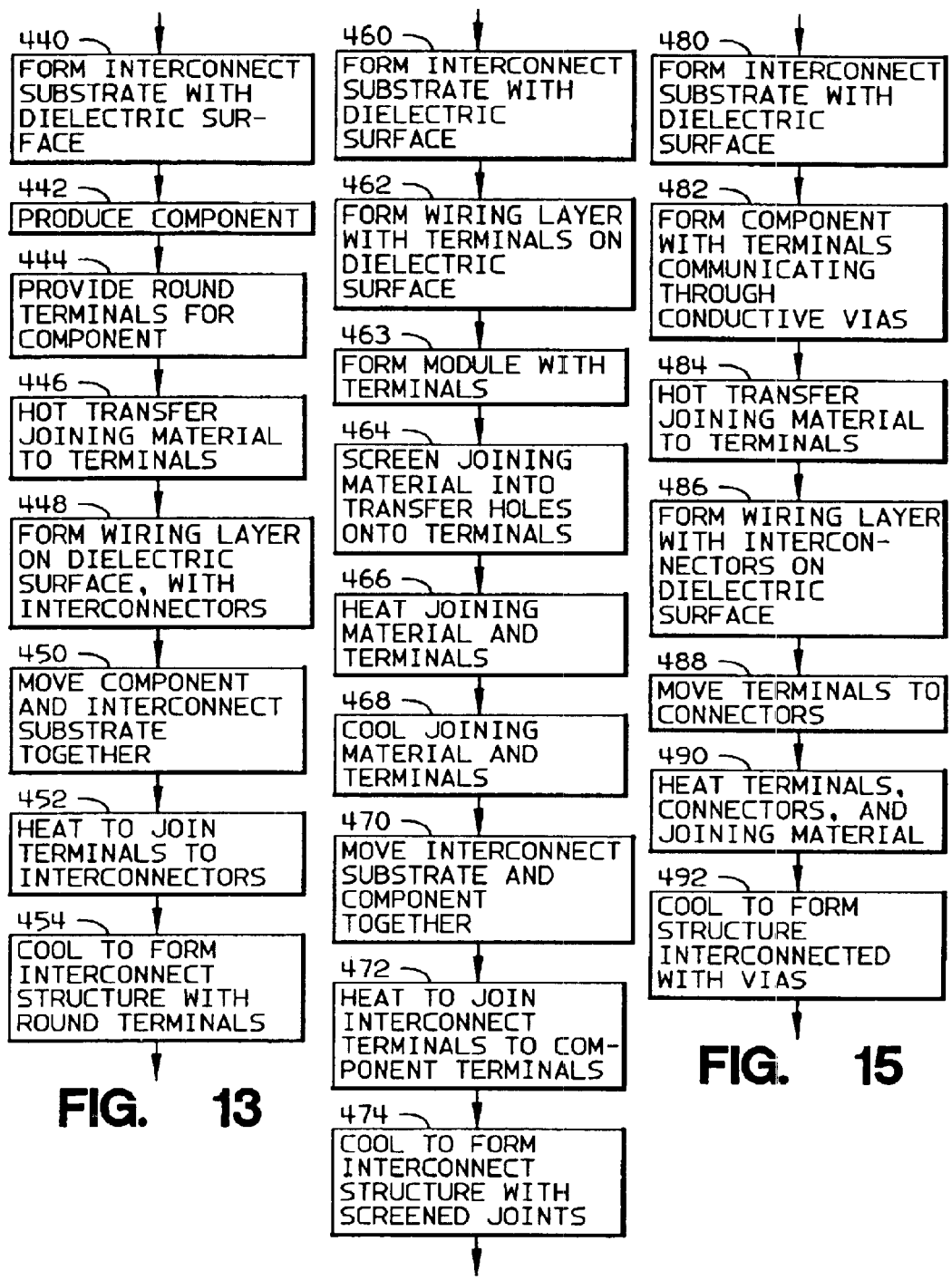

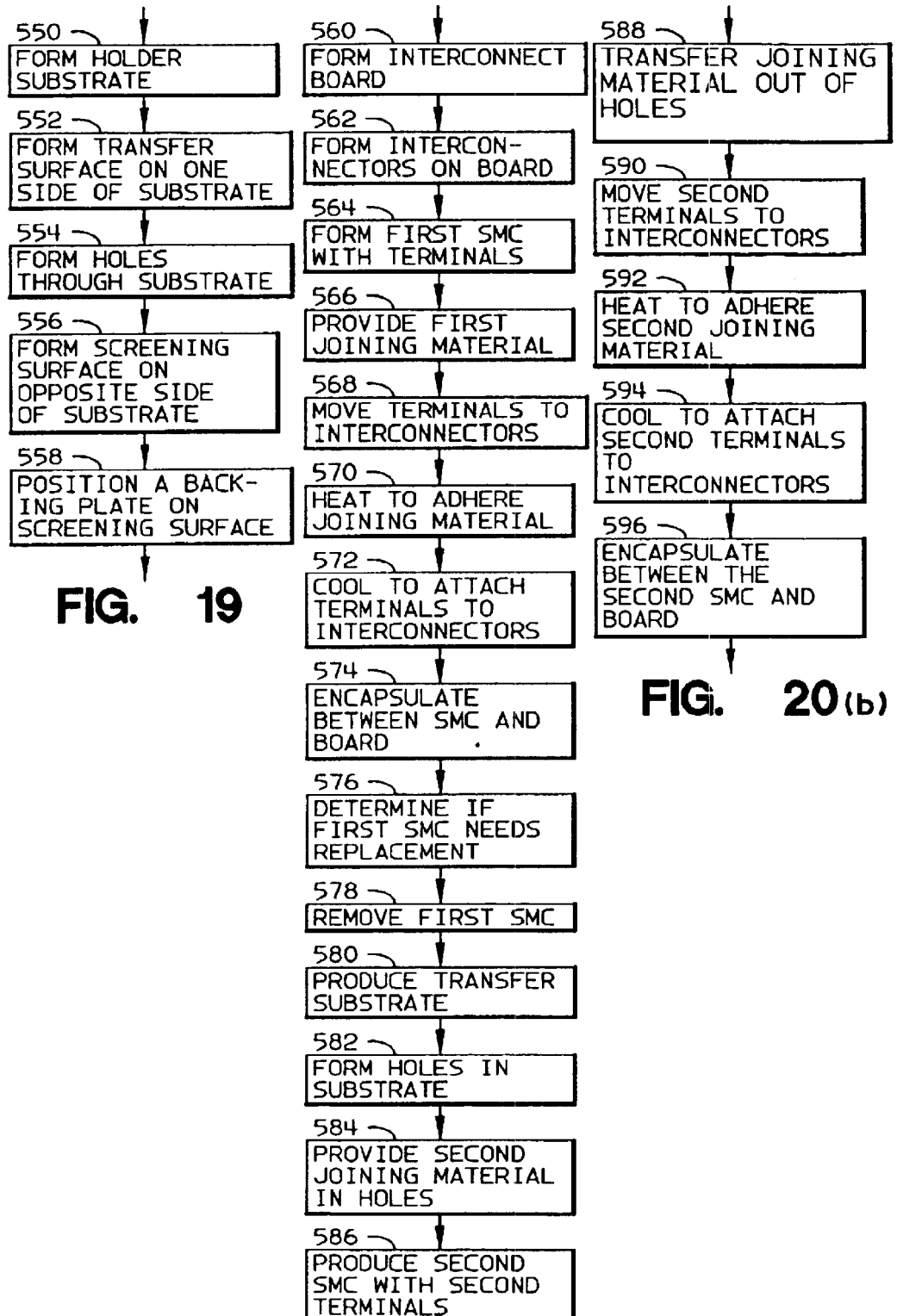

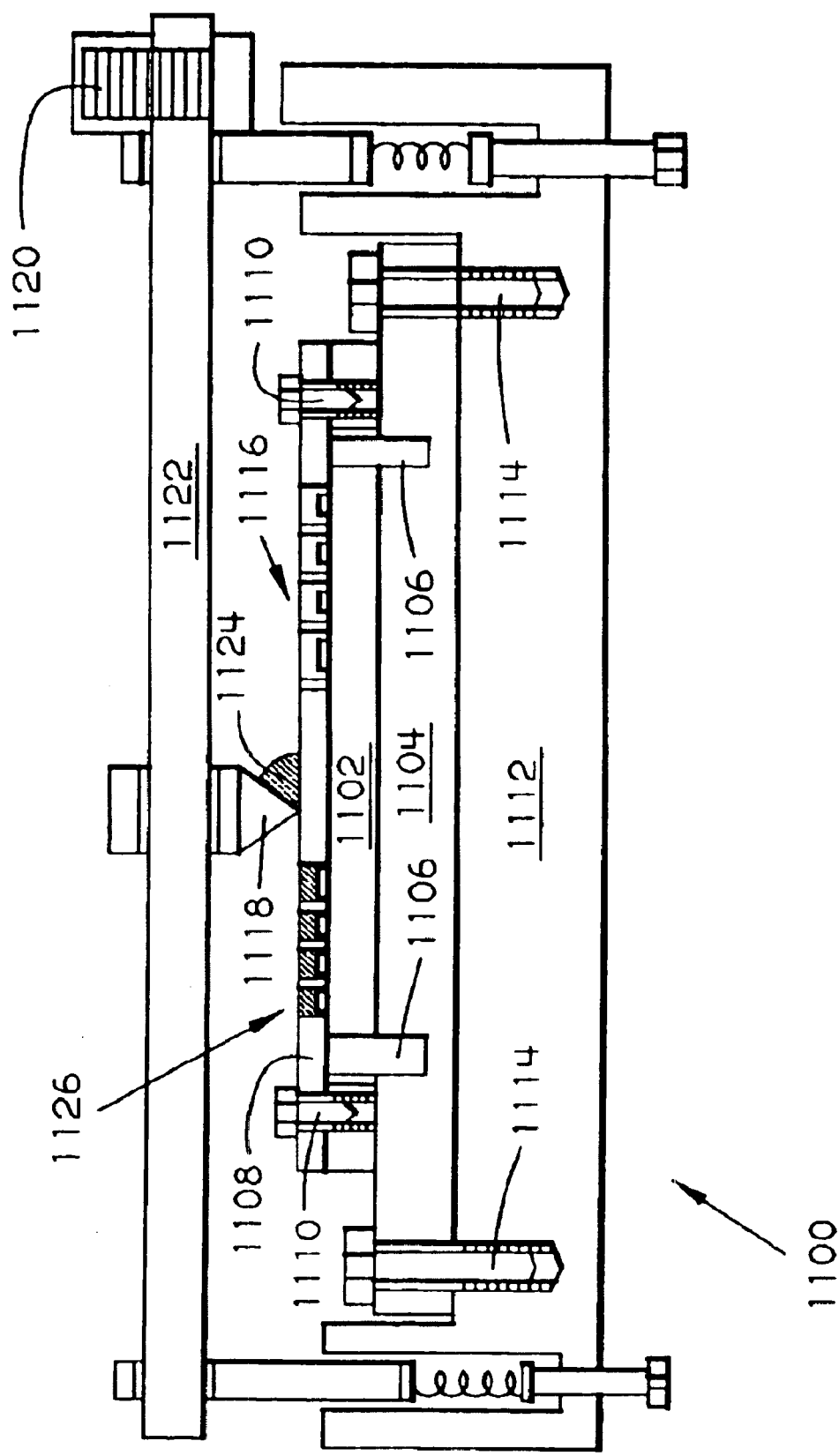

SYSTEMS INTERCONNECTED BY BUMPS OF JOINING MATERIAL

This is a Division of Ser. No. 08/510,401 filed on Aug. 2, 1995 U.S. Pat. No. 5,872 051

FIELD OF THE INVENTION

The fields of this invention are the production of flip-chips, the reflow solder attachment of flip-chips to chip carriers to form modules, the making of chip carriers, modules, and other components including surface mount components, especially surface-to-surface attachment components such as ball grid array (BGA) modules, and especially the deposition of solder on terminals of these surface mount components (SMC's), reflow solder attachment of such components to circuit-boards, use of resulting assemblies in manufacturing information handling systems, print screening, screen printing machines, production of printing screens, production of solder preforms, and deposition of solder paste and solder preforms onto substrates especially reflow transfer from an applicay.

The following background along with the other parts of this application enables those skilled in the art in utilizing the inventions of this application without undo experimentation and is not an admission regarding priority or claim that a search has been performed.

BACKGROUND OF THIS INVENTION

Solder bump connections have been used for mounting IC's (integrated computer chips) using the C4 (controlled collapse chip connection) technology since first suggested in U.S. Pat. No. 3,401,126 and 3,429,040 by Miller. In *Packaging Electronic Systems* by Dally (McGraw-Hill 1990 p. 113) "Chip bond pads are deployed in an area array over the surface of the chip. . . . These bonding pads are 5 mil in diameter on 10 mil centers. Matching bonding pads are produced on a ceramic substrate so that the pads on the chip and the ceramic coincide. Spheres of solder 5 mil in diameter are placed on the ceramic substrate pads . . . and the chip is positioned and aligned relative to the substrate. The assembly is heated until the solder spheres begin to soften and a controlled collapse of the sphere takes place as the solder simultaneously wets both pads. A myriad of solder structures have been proposed for mounting IC chips as well as for interconnection to other levels of circuitry and electronic packaging."

Reflow transfer of solder from decals has been developed for depositing eutectic solder for attaching flip chips to metal pads on organic substrates. Stainless steel decals are coated with a thin layer of photoresist which is photo-developed to provide windows in the same pattern as C4 connectors on a flip chip. A thick layer of eutectic Pb/Sn solder is electroplated onto the decals at the windows. The decal is positioned on an organic carrier aligned with connection pads and heated to reflow transfer the solder from the decal onto the pads on the carrier. Then a flip chip is placed on the carrier with C4 pads on the solder and reflow:heated to connect the chip to the pads.

Use of epoxy encapsulants to enhance fatigue life of flip-chip connection is suggested in U.S. Pat. Nos. 4,999,699; 5,089,440, and 5,194,930 mall to Christie. U.S. Pat. No. 4,604,644 to Beckham suggests materials and structures for encapsulating C4 connections. U.S. Pat. No. 4,701,482 to Itoh and U.S. Pat. No. 4,999,699 of Christie et al. disclose epoxies and provide guidance in selecting epoxies for electronic applications.

"Ball grid arrays: the hot new package" by Terry Costlow and "Solder balls make connections" by Glenda Derman both in Electronic *Engineering Times* Mar. 15, 1993, suggest using solder balls to connect ceramic or flexible chip carriers to circuit-boards. Ball grid array modules include components with plastic (organic), ceramic, and tape carrier substrates known as PBGA, CBGA, and TBGA molues respectively.

Fabrication of multi-layer ceramic chip carriers is suggested in U.S. Pat. Nos. 3,518,756; 3,988,405; and 4,202,007 as well as "A Fabrication Technique For Multi-Layer Ceramic Modules" by H. D. Kaiser et al., *Solid State Technology,* May 1972, pp. 35–40 and "The Third Dimension in Thick-Films Multilayer Technology" by W. L. Clough, *Microelectronics,* Vol. 13, No. 9 (1970), pp. 23–30. Common ceramic materials for electronic packaging substrates include alumina, beryllia, and aluminum nitride. "Pinless Module Connector" by Stephans in *IBM Technical Disclosure Bulletin* Vol. 20, No. 10, March 1978, suggests a ceramic ball grid array module with copper balls. U.S. Pat. No. 5,118,027 to Braun suggests placing solder balls in an alignment boat, vacuum holding the balls while eutectic solder is deposited on the balls, aligning the boat with conductive pads on a substrate, reflowing in an oven and then removing the boat. EP 0,263,222 A1 to Bitaillou suggest attaching solder balls to vias in a ceramic substrate to form a ball grid array module.

U.S. Pat. No. 4,914,814 to Behun, suggests casting columns onto pads to form ceramic column grid array modules, a graphite plate is drilled with through-holes corresponding to metal pads on the bottom of a chip carrier substrate, then preforms of 3/97 Sn/Pb solder are placed in the holes. Then the plate and carrier substrate are heated to melt the preforms to connect liquid solder to the pads, then the plate and carrier substrate are cooled and the plate is moved away from the carrier leaving the columns cast to the pads.

U.S. Pat No. 4,752,027 to Gschwend suggests methods of bumping printed circuit boards for attaching modules, including screening solder paste, reflowing the paste to form bumps, and using:rollers to flatten the solder bumps. U.S. Pat No. 4,558,812 to Bailey suggests using a vacuum plate to simultaneously deposit an array of solder balls on a substrate.

Fabrication of multi-layer rigid organic circuit-boards is suggested in U.S. Pat Nos. 3,554,877; 3,791,858; and 3,554, 877. Thin film Techniques are suggested in U.S. Pat. No. 3,791,858.

Flexible film chip carriers (known in the art as Area Tape Automated Bonding (ATAB) modules or TBGA modules) are suggested in U.S. Pat Nos. 4,681,654 and 5,159,535 and 4,766,670. In ATAB a flexible circuit-board chip carrier is mounted on a circuit-board using solder ball connect. U.S. Pat. No. 5,057,969 to Ameen, and U.S. Pat. Nos. 5,133,495, 5,203,075, and 5,261,155 to Angulas suggests using solder balls to connect TBGA modules to circuit boards.

U.S. Pat No. 5,261,593 to Casson suggests providing solder paste on a plurality of contact pads on a flexible printed circuit substrate (polyimide); placing flip-chips on the substrate with solder bumps of the flip-chip in registration with the pads; and heating to reflow the paste to electrically connect the bumps to the pads. According to Casson bumped flip-chips are un-packaged meaning they have no plastic shells nor metallic leads. Casson describes bumping chips (C4) by sputtering titanium/tungsten to promote adhesion to a passivation layer; sputtering copper; applying and developing a photoresist; electroplating copper and then 3/97 to 10/90 Sn/Pb or 63/35/2 Pb/Sn/Ag solder; removing the photoresist; and wet etching the exposed copper and titanium/tungsten to form 9 mil diameter bumps about 4.5 mil high (60 mils$^3$). He also suggests producing flexible Novaclad® (polyimide film with sputtered copper by E. I Du Pont de Nuemers) circuit substrates; optical alignment of stencils with substrates; screening 63/37 Sn/Pb solder paste through a 4 mil stencil with 14 mil openings with a round squeegee of 90 durometer at 1.5 inches/second and 22 psi pressure to provide 6E-7 in$^3$ deposits on pads of flexible substrates; self alignment during reflow heating using vapor phase or in IR or convection ovens; and epoxy chip encapsulation.

U.S. Pat No. 3,781,596 suggests a single layer interconnection structure of metallic conductors on a polyimide film (e.g. KAPTON. by E. I. DuPont de Numers). U.S. Pat No. 3,868,724 suggests metallic conductors sandwiched between polyimide film, which projects through the film. U.S. Pat No. 5,112,462 to Swisher suggests producing adhesivless flexible substrates of polyimide film and copper sputtered and then electroplated onto the film.

Floropolymer based films have been proposed for flexible circuit-boards such as PTFE filled with ceramic, or glass particles or fibers such as woven fiberglass, and Kevlar® (by Chemfab Corporation). Gore Company makes woven PTFE fabrics for impregnating with resins to form flexible dielectric substrates. Also molded thermoplastics have been used for flexible one sided and double sided circuit-boards.

Connecting components directly to one side of a single-layer flexible circuit-board is described by McBride in "Multi-function Plug for IC Package", *IBM Technical Disclosure Bulletin*, Vol, 21, February 1979, pp. 3594–3595. I/O terminals on the bottom of a chip are soldered to pads on top of a thin polyimide flexible decal. Also, a depression in a heat sink cover is bonded onto the top of the chip. Connecting lower power chips to a bottom side of a multi-layer flexible circuit-board and high power chips to the top side of the flexible circuit-board in order to connect the high power chips to the module cap is suggested by McBride, "Multi-layer Flexible Film Module", *IBM Technical Disclosure Bulletin* Vol 26, May 1984, p 6637. In that article I/O pins connect the flexible film to a metalized ceramic substrate, and smaller pins interconnect the layers of the film. Schrottke, "Removal of Heat from Direct Chip Attach Circuitry" *IBM Technical Disclosure Bulletin* Vol 32, September 1989, pp. 346–348 describes a flexible circuit-board with two rows of Direct Chip Attach (DCA) chips attached by controlled collapse chip connections (C4). The flexible circuit-board is folded around a stiff heat spreader of copper-INVAR-copper (INVAR is a trademark of Creusot-Loire for nickel-iron alloys) the coefficient of thermal expansion (CTE) of INVAR can be controlled by varying the ratio of nickel and iron and by varying the thickness of plated metal coatings such as copper.

U.S. Pat No. 4,967,950 to Legg suggests tinning contact pads with eutectic solder metal and positioning a flip-chip with C4 bumps on the solder on the pads.

U.S. Pat No. 5,147,084 to Behun, suggests using a HMP (high melting point) solder ball in association with a LMP (low melting point) solder. "A part 10 is to be joined to a board 11. Part 10 has internal metallurgy 14 which terminates at the surface at a bonding pads 12. A . . . LMP solder 16 is applied to a bonding pad 12. A . . . HMP solder ball 18 is placed in contact with LMP solder 16 and the assembly is heated to reflow the LMP solder which then wets to the non-molten HMP solder ball. . . . Board 11 is also illustrated with internal metallurgy 15, terminating on the surface bonding pad 17. . . . the assembled part 10 . . . is brought into contact with part 11 having pad 17 and LMP solder 13, and the two are heated to a temperature sufficient to reflow the LMP solder but not sufficient to melt the HMP solder ball. The LMP solder 13 which is attached to the bonding pad 17, on board 11, will wet the HMP ball and connection will be achieved."

Solders have a melting temperature range extending from a solidus temperature to a liquidious temperature in which range they have a pasty consistency that varies with temperature from solid to liquid respectively over the range. Molten refers to heating sufficiently to wet to another material or cure to another material in the case of epoxies and thermoplastics containing solvents.

U.S. Pat No. 4,825,034 to Auvert suggests a micro-beam laser machine for acting on thin layers of materials especially integrated circuits. Laser cutting and welding machines for making stencils are available from Messerch-mitt Bolkow Blohm, Northern Plant, 7312 Kirchheim/Teck Nobern.

"Ball Grid Array Module Solder Stencil Template" by Isaacs et al. in *IBM Technical Disclosure Bulletin* vol. 37, No. 06B, June 1994, p. 225, suggests a template or spacer to supporting a stencil to screen solder paste onto distal ends of ball grid array balls and column grid array columns for rework. "Solder Preform Technique for Fine Pitch Surface Mount Technology components" by Nilsen et al. in *IBM Technical Disclosure Bulletin*, Vol. 36, No. 02, February 1993, p. 397, suggests solder carriers the size of an SMT component for depositing solder on substrates. The solder is screened into cavities (blind holes) in the carrier, then the carrier is placed on a PC card.

In one embodiment the carrier consists of three parts including a screen plate with through holes aligned with holes in a carrier plate and a solid back plate. The screen plate is removed, the carrier plate is placed on the card, the back plate is removed, the component is placed on the carrier plate, and the solder paste is reflowed. In a second embodiment using the same three parts, the back plate is removed, the carrier plate is placed on the card, the solder is reflowed, the screening plate is removed, a component is placed on the carrier plate and the solder is reflowed again. In a third embodiment using the same three parts, the solder is reflowed then the back plate is removed, the carrier plate is placed on the card, the solder is reflowed again, the screen plate is removed, a component is placed on the carrier plate and the solder is reflowed for the third time.

In a final embodiment the carrier is one plate with cavities filled with solder paste, which is placed cavity down on the PC card and the solder paste is reflowed to deposite the solder onto the card, then the plate is mechaniclly removed or, disolved by solvent. Then the component is placed on the site and the solder is reflowed.

U.S. Pat No. 5,196,726 to Nishiguchi suggests packaging substrates with recesses containing plated electrode terminals (100 μm dia) covered by a vacuum deposited solder with a lower melting temperature than the bumps (e.g. Au/20%Sn or Pb/40%Sn).; Bumps of an IC chip (80 μm dia and 30 μm high) fit the recesses.

U.S. Pat No. 5,024,372 to Altman suggests forming solder bumps by applying at least a 10 mil preferably 15 mil, thick layer of photo definable solder resist to a ceramic, polyimide, or circuit-board substrate; selectively removing resist to form wells over metal pads in a grid array on the substrate; using a squeegee to apply solder paste into the wells; reflowing the paste; and removing the resist. It also suggests connecting a solder bumped member to a substrate by forming the wells filled with a solder paste (having a melting temperature lower than the solder bumps) over pads on the substrate in a pattern corresponding to the solder bumps; positioning the member over the substrate so that the bumps settle into the solder paste; and reflow heating to melt the solder paste but not the solder bumps to wet the metal pads and blend with the solder bumps.

U.S. Pat No. 5,388,327 to Trabucco discloses injecting liquid solder into holes formed through a disolvable film carrier onto contact pads of a ball grid array module to form solder balls. The film may be soluble in water, acitone, or in a flux solvent such as CFCs or turpenes.

JP 4-263433 A to Watanabe suggests recessions in a surface which are filled with a metallic paste by a sliding squeegee, and then heating to 230° C. using a heating head to melt the paste and form metallic balls. Then electrode pads of an IC chip are pressure-fixed to the balls in the recessions to form electric connection contacts.

U.S. Pat No. 4,311,267 to Lim suggests connecting leads (tins) to SIP or DIP packages by: forming interconnected conductive pads on a alumina ceramic substrate (0.5 by 1.0 inches), by thick film techniques and including lead pads (70 by 80 mils) and component pads (70 mils square); clipping leads (10 by 20 mil) to the substrate edge at lead pads; and screening solder paste through a stencil onto the leads, lead pads, and component pads. The citation suggests chemically milling brass stencils from both sides by: coating with photoresist; applying artwork negatives to both sides; exposing to light through the artwork; developing and washing away the unexposed resist; and etching from both sides. Then a 1 mil layer of nickel is plated onto the stencil plate to improve abrasion resistance by increasing surface hardness. The citation suggests several sources of screen printing machines for printing solder paste and describes their operation.

U.S. Pat Nos. 5,211,764 and 5,346,118 to Degani suggests printing Sn/Pb/Bi 43/43/14 solder through a 21 mil (up to 30 mil) thick stencil with rectangular openings which taper at an angle 5–10° (less than 45°) from vertical from a narrow top opening (60 mil) to a wider bottom opening (64 mil) onto a 10 by 10 grid array of about 33 mil pads on 100 mil centers (as low as 30 mil pads on 60 mil centers)-to produce bumps (up to 30 mil high have been demonstrated) on an IC circuit on a wafer. The bottom opening area is up to 5 times larger than the pad area and double printing (i.e. print and reflow, then print and reflow again) can be used to increase paste volume. The paste includes a special flux and additives to provide low stickiness and metal loading is increased to as high as 80% by volume by using two different sized powers. Using paste with a high ratio of metal volume minimize slump so that (hole bottom diameter)/(stencil thickness) can be as low as 1.5, but preferably 2.5, and (hole bottom diameter)/(pad spacing) can be as low as 0.75.

U.S. Pat No. 4,722,470 to Johary suggests forming an array of two rows of rectangular, non-reentrant cavities in a solid block or plate of titanium (a material non-wetted by solder), in a pattern matching a pattern of J-leads on a PLCC; loading the cavities with solder paste by wiping solder paste on the plate surface with blade or squeegee to force the paste into the cavities; coating all but the end portion of the J-lead with solder resist; aligning the J-leads in registration with the cavities with an exposed portion of each J-lead in contact with the paste; and reflowing the paste to form a mass of molten solder on the end portion of each J-lead. Johary suggests "Lead to lead spacing of 0.050 inch are common, and closer spacing such as 0.025 inch are anticipated"; also "Surface mount techniques are used to secure a wide variety of components or devices" and "the invention is applicable as well to other lead configuration such as outwardly extending gull-wing leads, downwardly extending I leads and other leads or metallizations of various types."

The entire disclosure of the above citations is hereby incorporated by reference.

OBJECTS OF THE INVENTIONS

It is an object of this-invention to provide a simpler, less critical, more accurate, and less expensive method for bumping flip-chips and for bumping carrier modules.

It is an object of this invention to form small bumps on flip-chips by providing high melting temperature (HMT) solder onto flat metal pads of wafers or dies to form flip-chips for subsequent attachment to ceramic substrates, and to provide the solder economically, reliably and at a high production rate.

It is another object to provide small quantities of low joining temperature (LJT) solder onto small bumps of HMT solder (C4 bumps) on flip-chips, for subsequent attachment to organic carrier substrates for more economical, reliable, and higher production of attachment than by the common process of screening solder on the attachment substrate, especially for rework.

It is another object to form small, LJT bumps on flip-chips by providing LJT solder directly on the flat bottom side pads of wafers or flip-chips for subsequent attachment to flexible organic substrates, or organic coated substrates of a base with about the same CTE as the chip, or for subsequent attachment to other substrates for applications with moderate temperature variations.

It is another object of this invention to provide small balls of HMT or LJT materials on substrates for attaching unbumped chips (wire bond type chips) face down with flat pads on the face of the chip on the bumps.

It is another object to provide larger balls (greater than 0.2 mm) of HMT solder on ceramic carrier substrates for producing ball grid array modules for subsequent connection to an organic substrate.

It is another object to apply small bumps of LJT solder to pads of flexible substrates; or rigid substrates such as INVAR based organic coated substrates with a CTE similar to the chip; or rigid organic substrates for use in low temperature variation applications; for attaching flat pads on the face of unbumped chips to the substrate.

It is another object to provide solder for attaching pin headers to organic substrates.

It is another object to provide solder on connectors of a substrate with conductive vias through the substrate communicating with the connectors.

It is also an object of this invention to apply larger bumps of LJT solder to pads on organic substrates to form plastic ball grid array modules; or peripherally bumped modules; or for connecting another substrate such as a chip carrier module to the organic substrate.

It is another object to produce a stencil for screening paste onto substrates.

It is another object to produce circuit-boards with reworked components.

It is another object to produce a preform holder for providing solder.

It is another object to produce tooling for biasing a stencil against a substrate.

It is another object to produce a bottom plate under the circuit-board for the screening process and methods for using the new bottom plate.

It is another object to produce a printing machine for screening solder paste onto substrates which allows the screen and substrate to be removed as a unit, and to provide a method of using the machine.

Finally it is an object of this invention to produce information handling systems using the improved method of manufacture.

In this description the words "connector" and "interconnector" refer to either a flat pad or a bump of conductive material on a surface of a component. The word "bump" refers to connectors that extend higher from the underlying substrate then the typical wiring in the wiring layer on the component or higher than the wiring layers typically found on the respective type of component such as flip-chips, ball grid array (BGA) modules, quad flat packs, flexible and rigid organic substrates, ceramic substrates, etc. Bumps include balls which have their greatest diameter away from the surface. Bumps also include solder columns with round cross sections that extend about perpendicularly from a component surface to a height greater than the diameter of the bump. The word "terminal" is used generically to include pads, bumps, and leads such as gull-wing-leads J-leads, and I-leads.

The term "grid array" is used in describing the arrangement of C4 bumps on the bottoms of flip-chips and the arrangement of balls on the bottom of ball grid array (BGA) modules and the arrangement of columns on the bottom of a column grid array (CGA) module, in which the connectors are typically positioned in a square matrix with rows perpendicular to column with regular, equal spacing between the connections in the rows and column (like the corners of a checkers board). Although convenient for layout, there is no technical requirement that the pattern of connections for such components be so regular, and the invention contemplates connectors that are not included at some grid locations and even grids of random spacing. Thus, in this application the term array refers to any arbitrary pattern of connection terminals; peripheral array refers to two or more rows of two or more terminals that define a boundary (such as a rectangle defined by leads of a duel in line package); area array and grid array refer to regular or irregular patterns that include both a peripheral array of terminals and other internal terminals spaced significantly inwardly away from the boundary of peripheral terminals (e.g. at least the minimum spacing between boundary connections).

SUMMARY OF THE INVENTION

In one embodiment of the invention holes through a transfer substrate are aligned with connectors of a component then joining material paste is screened into the through-holes directly onto the connectors then the transfer substrate and component are heated while biased together and cooled to transfer the joining material onto the connectors, then the transfer substrate is mechanically removed. This allows bumps of joining material to be formed on flat connection pads or allows LJT joining material to be deposited on HMT bumps or other terminals of a component. The joining material paste may be a LJT solder paste or HMT solder paste or transient liquid phase (TLP) paste or an electrically conductive adhesive paste. The component may be a leaded component such as a quad flat pack; or a bumped component such as a flip-chip or BGA or CGA module or an interconnect structure such as a circuit board.

In a second embodiment joining material is deposited into blind holes (cavities) in a transfer member then a component is aligned with bumps in contact with the joining material and the component and transfer member are heated and then cooled together to transfer the joining material onto the bumps, then the component is mechanically removed from the transfer member. The joining material may be a joining material paste as described above or another joining material such as HMT solder or LJT solder which has been injected into the holes. The bumped component may be an area array component such as bumped flip-chips, CGA modules, and BGA modules.

In a third embodiment joining material is deposited into through holes in a transfer plate then a component is aligned with terminals in contact with the joining material and the component and transfer member are heated and then cooled together to transfer the joining material onto the terminals. A backing plate may be used to facilitate depositing material into the through holes and may be removed or left in place during heating and cooling.

This invention will be described in greater detail with reference to the following drawings.

BRIEF DESCRIPTION OF THE DRAWINGS

FIG. 1 illustrates a process of the invention for producing bumped chips.

FIG. 2 illustrates the process of the invention for making module with bumped chips.

FIG. 3 shows the process of the invention for producing a bump array chip carrier.

FIG. 4 illustrates the process for producing a bump array module of the invention.

FIG. 5 illustrate a method of the invention for making a circuit-board assembly.

FIG. 6 illustrate a method of the invention for making an interconnect structure.

FIG. 7 shows the process of the invention for producing a header.

FIG. 8 illustrates the method of the invention for producing a circuit-board with connection pins.

FIG. 9 illustrates the method of the invention for producing a component with round terminals.

FIG. 10 shows the method of the invention for screen printing to produce components.

FIG. 11 shows a method of the invention for producing components with vias.

FIG. 12 shows the steps of the process of the invention for producing an area array component.

FIG. 13 exhibits the method of the invention for producing structure interconnected by round terminals.

FIG. 14 presents the process of the invention for producing interconnect structures by screening.

FIG. 15 shows the process of the invention for producing structures interconnected with vias.

FIG. 19 illustrates the process of the invention for producing a joining material screen.

FIGS. 20a and 20b illustrate the method of the invention for producing an interconnect structure with replaceable components.

FIG. 38b illustrates an alternate embodiment of the bumps of FIG. 8a.

FIG. 39 shows a bottom view of the carrier of FIG. 38a.

FIG. 68 shows a printing machine of the invention with a unit for biasing the stencil against the component.

DETAILED DESCRIPTION

Figures 16, 17, 18:
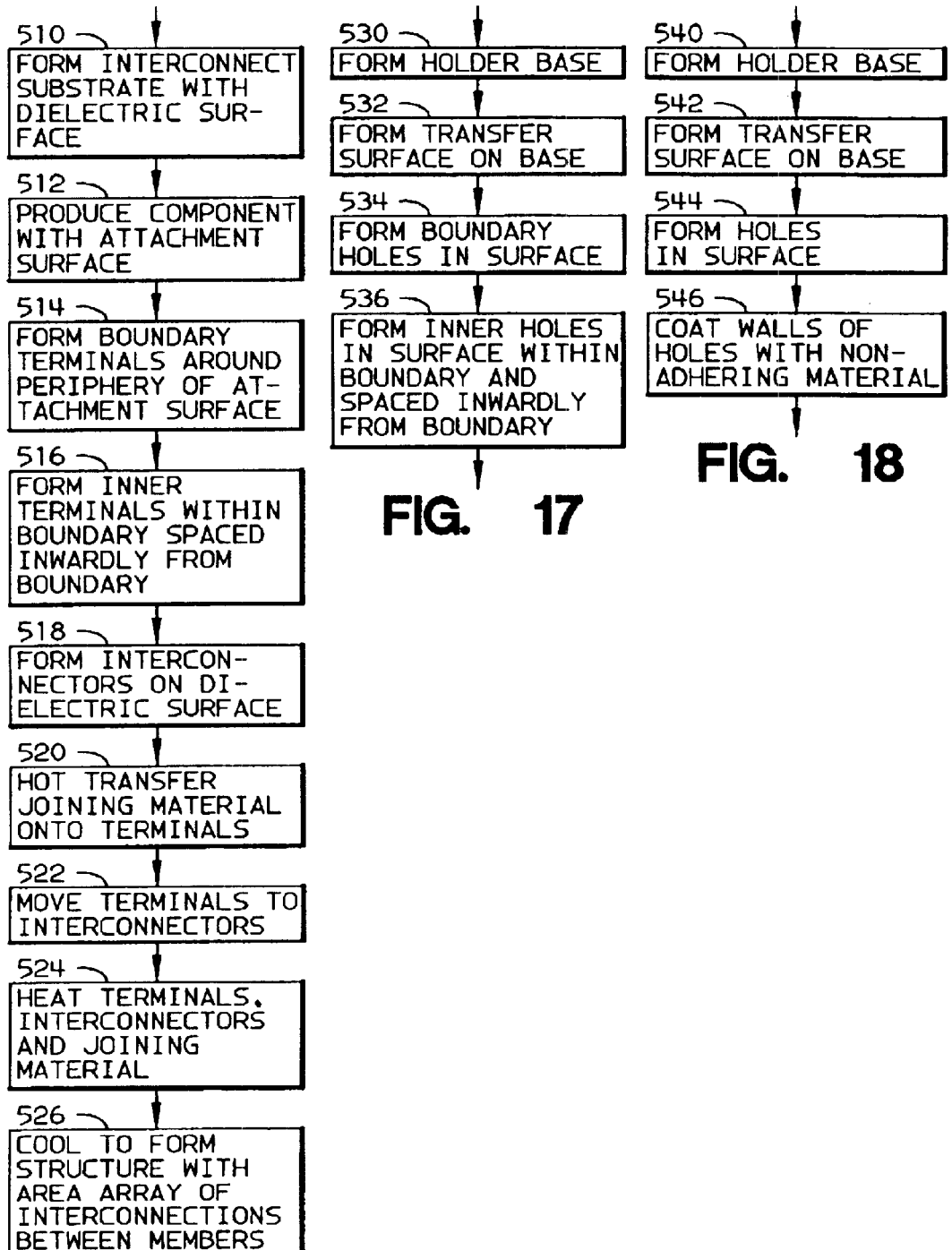
FIG. 16 presents the process of the invention for producing interconnect structures with area array interconnection.
FIG. 17 discloses the method of the invention for producing a joining material array holder for a component.
FIG. 18 illustrates the process of the invention for providing a coated joining material holder.

FIG. 1 illustrates a specific embodiment of the process of the invention for producing flip chips. In step 100 of FIG. 1, a silicon wafer attachment substrate with an attachment surface is formed. For example, a seed of silicon is inserted in a crucible of molten silicon and a single about cylindrical crystal of silicon is pulled by a motor as the crucible spins about the axis of the cylinder, in relation to the cylinder. The crystal is sawed by a band or disk saw, or by laser into thin wafers which are polished in a mechanical polisher to form the substrates and the substrates are inspected.

In step 102 electronic devices are formed on the surface of the substrate. A photographic process similar to that described below is used to control the addition of dopant in a dry deposition process such as vacuum evaporation, or more preferably by sputtering, to form electronic devices such as transistors, diodes, triodes, etc. on the surface of the wafer. The devices are organized into memory devices, registers, and logic gates.

In step 104, one of more wiring layers including wiring pads on the attachment surface and wires connecting the pads to the electronic devices are formed. The wiring layers commonly include a layer of polysilicon wires and one or more layers of metal wires which are commonly of aluminum. The wiring layers are separated by a dielectric which is commonly silicon dioxide. The top wiring layer includes the wiring pads that form an array for electrically connecting the wiring layer to a chip carrier. The wiring layers are produced photographically by dry depositing photoresist, exposing to electromagnetic rays by laser or through a artwork mask, rinsing or dry or wet etching to selectively remove the photoresist, and dry depositing metals. The metals can be selectively deposited by depositing a blanket of metal over the patterned photoresist to form a wiring layer pattern when the photoresist is stripped. Alternatively, a patterned photoresist can be formed over the metals and then the exposed metal is wet or dry etched to selectively remove the metal and form the wiring layers. Then if desired the photoresist may be stripped off the wafer. The wiring layers include wiring pads electrically connected by wiring conductors of the wiring layers and conductive vias between layers, to the electronic devices.

In step 106 a passivation layer commonly of silicon dioxide, glass, and/or polyimide is dry deposited over the wiring layers and wiring pads, and in step 108 windows are formed through the passivation layer at the wiring pads. Step 108 may be performed after step 106 by using a photo resist for the passivation layer or by depositing the layer over a photoresist which is then removed, or a photoresist may be deposited over the passivation, developed, and the exposed passivation etched away which may be followed by removing the resist or any of the know process for forming passivation layers of chips may be used.

Wiring pads for flip-chips usually include a peripheral array of pads that define a rectangular boundary and interior pads within the boundary which are spaced significantly inward toward the center of the rectangle from the boundary. Preferably, the pads are positioned at the intersection of two groups each of two or more equally spaced apart lines, with the lines in each group perpendicular to the lines in the other group, to form a square grid array (like common graph paper). Preferably, the pads define at least three concentric rectangles preferably about square rectangles. Wire bond pads of wire bond chips form only a peripheral array and the bond pads and windows are usually much larger in area than are the wiring pads for area array flip-chip connection.

In step 110 for flip-chips, flat connector pads are formed on the passivation layer. A layer of chromium, titanium, or tungsten is deposited on the passivation to promote adhesion of the connectors. Then conductive connectors are built on the passivation surface. Copper may be deposited for conduction because it is highly conductive, inexpensive, and methods for depositing copper are simple, inexpensive, and well known. However, when copper is used and solder will be reflowed in contact with the pads, a layer of aluminum may be deposited to protect the copper from dissolving in the solder. A photoresist pattern is developed on the surface and then the layer is selectively etched to provide the connector pads extending out on the passivation layer from the windows.

In step 112 which is optional, HMT bumps may be provided on the pad connectors to form bump connectors.

The HMT material may be a thick layer of dry deposited aluminum, or preferably the layer of copper has been made thick by electroplating, or more preferably an HMT solder is provided. HMT solder may be applied by dry deposition over photo-patterned resist which is then stripped. Alternately, a thin flash layer may be dry deposited, a photoresist layer patterned, and then additional solder electroplated in the pattern followed by stripping and etching to remove the exposed flash. Then the deposited solder may be reflowed to form hemispherical bumps or balls of solder. More preferably HMT solder is transferred from a transfer substrate by reflowing as described below. Such transferred HMT solder may be provided in the transfer substrate as paste or as liquid solder. Also, the HMT material may be placed on the connectors as preforms, which are then reflow attached by melting the HMT solder or by melting a LJT joining material between the connector pad and preform. The HMT preforms preferably communicate with flux during reflow to remove any oxide coating on the preform. Flux can be sprayed onto the preforms and connector pads after placement, or flux such as formic acid, can be mixed in a gas and delivered from a nozzle during reflow, but preferably the preforms are coated with flux by dipping, spraying, or foam coating prior to placement and most preferably the attachment surface and connector pads are dipped, sprayed or foam coated with sticky flux prior to placing the preforms in order to hold the preforms in place. If LJT paste is used to reflow connect an HMT preform to-the connector pads, the paste may contain the flux.

Melting temperatures of common HMT solders range from 230° C. to 320° C. Preferably, the HMT solder is a high Pb solder alloy such as 3% to 15% Sn, or more preferably less than about 10% Sn and most preferably about 6/94% Sn/Pb. Pb solder with 3% to 10% Sn has a softening temperature (solidus) around 300° C. Other HMT solders are available for example the solidus temperature for 90/5/5 Pb/In/Ag is 290° C., for 95/5 Pb/In its 315° C., and for 95/5 Sn/Sb its 236° C. The HMT solder should be reflowable at a temperature that will not damage the substrate, electronic devices, wiring, or passivation layer.

The bumps preferably have sufficient solder to extend 10% to 300% of the diameter of the connector pads out from the attachment surface. More preferably the bumps extend 40% to 200% of the pad diameter, and most preferably 80% to 160% of the pad diameter. The larger the connector pads and the further the bumps extend in relation to the maximum sized pads, the lower the thermal fatigue, but the size of pads that can be reliably formed and reflowed without solder bridging is limited by the center to center spacing between the connection pads and a minimum spacing between pad edges required to reliably prevent solder bridging, which also depends on the positional accuracy of the pad edges. The size of reflowed balls is limited by the pad spacing and the positional accuracy to prevent bridging between balls during reflow.

After reflow the HMT material may be flattened using a pneumatic flattener to press an anvil against the bumps of HMT joining material on the connectors of the attachment surface. Alternately rollers may be used to flatten the bumps. Flattening is especially advantageous when the component is to be placed on hemispherical ended bumps on another substrate since confronting hemispherical bumps may interact during placement and subsequent vibrations to bias the component out of position.

In step 114 a transfer substrate with a transfer surface is produced, and in step 116 a plurality of holes are formed in the transfer surface in a mirror image pattern to the pattern of the connectors on the attachment substrate. The walls of the holes (and preferably also the transfer surface) must not significantly adhere to a joining material so that the joining material can be successfully transferred from the holes to the connectors on the attachment surface. The holes may be produced by a mechanical or laser drill (pulsed YAG laser) or chemically by photolithographic equipment similar to those described above. Blind holes (cavities) produced by a mechanical drill typically have round openings, cylindrical side walls, and a conical bottom wall, but flat bottomed cavities can be produced by machining or special drills, and special drills are also available to produce other shapes such as square holes. Blind holes may also be formed by providing a transfer substrate with through-holes and providing a backing plate. Preferably, the backing plate is biased against the transfer substrate (for example by adhesive lamination) to prevent transportation of joining material between the holes. Through-holes with tapered walls can be produced by chemical etching through a mask, by special drills or other machining or by laser. Preferably, the holes are about perpendicular to the transfer surface.

The transfer substrate may be produced from a solid plate or other shape of a material to which the joining material inherently does not significantly adhere or the walls of the holes and preferably also the transfer surface, may be coated with a material to which the joining material does not significantly adhere. Also the surfaces (of the holes and attachment surface) may be treated to reduce adhesion by applying a lubricant or release material such as those used in casting and molding of metals, ceramics, and organics or more preferably by micro-etching. For joining materials of RMT solder the base material of the transfer substrate may be titanium, molybdenum, or nickel (which has been oxidized at elevated temperatures), stainless steel, or more preferably high chromium stainless steel or a ceramic such as SiC or AlN to which molten solder does not wet. Alternately a coated substrate may be used with a base of iron, INVAR, Cu-INVAR-Cu, or for transfer of joining material to a silicon attachment substrate, more preferably a silicon transfer substrate is used. These materials may be coated by another metal or ceramic to which solder does not significantly wet and which can be reliably deposited on the base material preferably by dry deposition preferably sputtering. Such materials include chromium, molybdenum, titanium, tungsten, nickel (which has been subsequently oxidized) and combinations thereof and preferably ceramics such as titanium nitride. For one or the preferred embodiments for through-holes in the transfer substrate, the substrate is preferably a magnetic material (preferably a magnetic stainless steel or a coated magnetic steel) for biasing the transfer substrate against the attachment surface by magnetism during screening and/or during reflow heating and possibly also during cooling. For LJT materials such as conductive adhesives or eutectic Sn/Pb solder, or TLP systems, organic substrates such as epoxy filled with woven fiberglass or polyimide substrates may be used. Also for LJT materials, organic coatings such as organic solder resist may be used over a metal or organic base for such LJT materials. Preferrably the organic material is not wettable by liquid solder to serve as a dewetting agent. One example material is PRIBIMER®(Ciba-Geigy Corp).

For some applications two transfer substrates may-be desired. A first substrate has holes for an HMT joining material to form bump connectors as in step 112 above for maintaining separation when the attachment surface is connected to another substrate. A second transfer substrate has holes for a LJT material for connecting between the bumped connectors and interconnectors on the surface of the other substrate. In this case the volume of the LJT material after reflow should be from 10% to 70% of the volume of the HMT material after reflow.

Assuming the same pad and ball diameters for attaching a BGA module to a circuit-board pad, if the volume of reflowed eutectic solder connecting a HMT ball to a pad falls below 10% of the volume of the ball then stresses begin to increase dramatically, but if the reflowed volume of the LJT solder exceeds 25% of the volume of the ball then the eutectic will flow onto the joint between the carrier substrate and the ball, and if the volume of the eutectic exceeds 50% of the volume of the ball then the ball will begin to bulge significantly. Some conductive joining materials such as liquid solder have the same volume after joining as during application, but other joining materials such as conductive adhesives and solder pastes have substantially smaller cured volumes. For example the volume of reflowed solder paste is typically only 40% to 60% of their application volumes. Thus for example to provide a second solder with 50% of the volume of a first solder bump formed by injecting HMT liquid solder in the holes of the first substrate and then using a LJT solder paste for the second solder which shrinks to 40% of its screened volume, the holes in the second plate would preferably have 125% of the volume of the holes in the first plate.

For photo-lithographically forming small holes in the transfer substrate, the transfer surface is covered with a coating of photoresist which is selectively exposed to electromagnetic radiation by positioning a mask between a source of such radiation and the transfer surface or by directed radiation such as from a laser, or by a particle beam. Then the radiated or the un-radiated (depending on the type of photoresist) is removed by a solvent or water rinse or by wet or dry etching. Then holes are etched into the plate at selectively exposed locations. If the holes are through-holes they can be formed by simultaneously etching from both sides of the plate. Although rectangular holes hold more joining material for the same width round holes are usually easier to make, and round holes or at least rounded corners release the joining material more easily.

The walls between holes should be sufficiently thick to reliably form the walls depending on the thickness tolerances, and to prevent damaging the walls during screening and reflow to prevent significant amounts of solder from migrating between holes. Currently, we prefer the width at least 0.025 mm for round holes and 0.050 mm for rectangular holes which are more critical. Preferably, holes are as wide as spacing between centers allows and this allows the reflowing bumps to reach up to contact the connectors. Thus, holes larger than 0.2 mm are preferably rectangular and smaller than 0.2 mm are preferably round.

The configuration of the holes is selected to provide the desired amount of joining material at each connection pad. Preferably, the holes are sized to provide bumps with a height between 10% and 200% of the diameter of the connector pads, more preferably the bumps have a height between 40% and 180% of the width of the pads and most preferably 80% to 160% of the width of the pads. If the HMT solder balls are reflow attached directly to the pads then the diameter of solder balls will be slightly larger than the height of the balls. For example solder balls with a height of 150% of pad diameter, the ball diameter would be 167% of pad diameter. For flip-chips holes should be from about 0.1 mm to 1 mm wide, and for bumped chip carriers they should be from 0.5 mm to 3.54 mm wide. Preferably, the solder bump diameters are smaller than the hole diameters in order to prevent damage to the structure during cooling and minimize binding between the bumps and the sides of the holes when the attachment surface is moved away from the transfer surface. The depth of the holes should be from 0.1 to 10 times of their width, more preferably 0.3 to 3 times their width, most preferably 0.5 to 0.9 times their width. For blind holes the depth of the cavity is preferably less than the height of the bumps in order for the bump to extend significantly up from the hole.

For example, flip-chip pads are typically 0.13 mm dia on 0.23 mm centers and preferably the diameters of the balls are slightly larger than the pad diameter e.g. 0.18 mm, requiring about 0.00305 mm$^3$ of solder. For a solder paste that shrinks 50% in volume during reflow, 0.0061 mm$^3$ are required. Therefore, for cylindrical holes with 0.2 mm dia, the holes need to be about 0.19 mm deep, and for etched cavities with curved bottom walls the holes would need to be slightly deeper at the center. More preferably the cavities are 0.18 mm square holes 0.18 mm deep.

Steps 114–116, related to preparing the transfer substrate, and may be performed before, after, or simultaneously with steps 100–112 in which prepare the attachment substrate is prepared.

In step 118 joining material is provided in the holes of the transfer substrate. The material may be HMT material to form joining bumps on the connection pads or an LJT material to form such joining bumps or to cover previously made bumps of HMT materials for joining the bumps to connectors on another substrate. Generally HMT materials have joining temperatures that are too high for use with organic substrates. LJT materials have sufficiently low joining temperatures for use with the relevant organic materials without significant damage, which typically ranges below 230° C. When a LJT solder is used to prevent disturbing HMT solder during reflow, the liquidus temperature of the LJT solder should be substantially below the solidus temperature of the HMT solder, such as a difference of at least 50° C. and more preferably 100° C. For example the solidus temperature of 6/94% Sn/Pb is about 316° C. and the liquidus temperature of eutectic 63/37 Sn/Pb solder is 183° C., of 42/58 Sn/Bi is 138° C., of Sn/Pb/Bi 43/43/14 is about 181° C., and of In/Sn 52/48 is 117° C. The joining material may be placed as liquid solder metal to directly form metal preforms in the holes. Alternately, the material may be a transient liquid phase (TLP) bond system such as a mixture of Sn and either Pb, Cu, Ag, or Au particles or Sn covered Pb, Cu, Ag or Au particles or Pb, Cu, Ag or Au covered Sn particles, or other TLP metal systems in a liquid carrier to form a paste or in an epoxy carrier, or in a conductive adhesive carrier with a solvent. Preferably, the joining material is a solder paste of metal particles (alloy particles or mixtures of pure metal particles or a combination thereof) in a carrier such as a liquid (water or alcohol) that forms a molten solder alloy during reflow. Preferably, the paste is a water-clean paste that includes a flux which leaves a residue after reflow that is water soluble or can be removed by flushing with water, or more preferably a no-clean paste which contains a no-clean flux such as adipic or citric acid that leaves only a small quantity of substantially inert residue.

The residue is identifiable as resulting from use of no-clean flux. The material can be placed in the holes by injecting liquid solder metal in the holes for molding preforms in site, or the material can be dispensed from a syringe which can be pre-loaded with solder paste. Preferably, the paste is applied by dumping paste such as solder or TLP paste onto the transfer surface and sliding a organic or metal blade such as a rubber squeegee over the surface to force the paste into the holes.

Alternately, both preformed spheres of HMT material and also LJT material may be placed into the holes provided the holes are larger than the preforms. If the holes are deeper than the preforms then the preforms can be placed in the holes and paste stenciled into the holes over the preforms, but preferably the paste is stenciled first or both before and after preform placement. If the HMT material contains a constitute which is soluble in the heated LJT material (such as Pb in 95/5 Pb/Sn HMT solder which is soluble in 37/63 Pb/Sn LJT solder) the heating is preferably to a minimum temperature and for a minimum time to connect the HMT preforms to the connectors in one step without melting the preforms and preferably with forced cooling to minimize the dissolution.

In step 120 the attachment and transfer surfaces are moved relatively together with a plurality of the connectors aligned with a corresponding plurality of the holes. Preferably, the transfer substrate is optically aligned with the attachment surface for example by using a machine vision system such as a CCD camera and a computer system with a vision recognition program. Preferably, the substrates are positioned horizontally before they are moved together. For cavities the attachment surface is positioned above the transfer surface. For through-holes in the transfer surface, the transfer surface is positioned above the attachment surface.

In the case of transfer plates with through-holes step 120 of moving the transfer and attachment surfaces together can be performed prior to step 118 of providing joining material in the holes. Performing step 118 before 120 in such case, allows the transfer substrate to be used as a stencil in a printing machine to screen joining material into the holes directly onto the connectors. The transfer substrate is preferably biased tightly against the attachment surface during screening and subsequent heating to prevent forming conductive bridges between the connectors. Preferably, the surfaces are held together by providing a transfer substrate of magnetic material and providing permanent magnets positioned in a bottom plate under the attachment surface for attracting the transfer surface down onto the attachment surface. In an alternate preferred embodiment the bottom plate is slightly rounded and the attachment and transfer substrates are stretched slightly bent against the bottom plate to hold them together. In another alternate embodiment the transfer substrate is a bent plate which is held flat on the bottom plate to bias the plates together. These methods can be combined is desired.

In step 122 the joining material and connectors are heated to adhere the joining material to the connectors on the attachment surface and then in step 124 the joining material and connectors are cooled. The heating may be performed using a heating head or directed hot air, and is more preferably performed using an infra red (IR) reflow oven, vapor phase chamber, or a convection reflow oven. Preferably, the wafer is moved from a screen printing machine and placed on a track or conveyor belt and transported through a convection reflow oven.

Preferably, the geometry of the transfer and attachment substrates, and the heating and cooling methods provide for the transfer substrate and attachment surface to simultaneously expand and then simultaneously shrink together during heating and cooling so that they stay sufficiently aligned for the accurate transfer of the joining material and do not disturb the joining material during cooling.

Preferably, materials with about the same CTE are selected for the transfer and attachment substrates, more preferably the same materials. Also, preferably the thickness of the transfer substrate and attachment substrates are selected in view of the heat capacities of their respective materials and the method of heating so that the substrates heat up and cool down together so the alignment is maintained during heating and then cooling. Preferably, for silicon wafers, the attachment substrate is also a silicon wafer with about the same mass per area and exposed to about the same heating conditions so the connectors and holes in the respective wafers about maintain approximate alignment during heating and cooling. The silicon transfer substrate may be coated to prevent weting by the joining material.

The heating temperature and heating profile are determined by the joining material and the resistance of the joined members to damage due to heat. Conductive adhesive joining materials require relatively low heating temperatures to cure.

In step 126 the transfer and attachment surfaces are moved relatively apart from each other. The transfer and attachment surfaces may be separated before cooling (i.e. performing step 126 before 124) to provide a shape that does not have indentations of the walls of the holes and the joining material is not broken off the connectors by forces between the joining material and walls of the holes of the transfer substrate and attachment. If a cavity that is shorter than the resulting solder bump is provided, then the end of the bump will have the shape of the bottom of the cavity. Advantageously, if the bottom is flatter than a hemisphere during reflow the bump will ball and reach out to connect after placement, and if about flat the bump will not tend to bias the component out of alignment with an array of confronting hemispherical connection bumps before reflow.

For solder joining material, after reflow the solder bumps may be flattened using a pneumatic flattener to press an anvil against the bumps on the connectors of the attachment surface. Flattening is especially advantageous when the component is to be placed on hemispherical ended bumps on another substrate since un-flattened bumps may interact during placement and subsequent vibrations to bias the component out of alignment relative to such hemispherical bumps.

In step 128 the wafer is diced into a plurality of integrated computer (IC) chips. This step may be performed anywhere in the process of FIG. 1, but is preferably done at the end to allow the entire wafer to be simultaneously processed in the method of the invention.

FIG. 2 illustrates a method of making the module of the invention with a bumped chip. In step 140 an interconnect chip carrier substrate is formed with a dielectric surface. The substrate may include an organic material such as a thermoset (epoxy), a polyimide, a PTFE, or a thermoplastic. Rigid organic substrates are preferably filled with dielectric particles such as ceramic or glass, or more preferably dielectric fibers which are rigid in an axial direction even more preferably the fibers are woven glass cloth (e.g. G-10 or FR-4) or PTFE fiber cloth. Alternately, the substrate may include a base of ceramic such as beryllia or aluminum nitride and preferably alumina. Also, the substrate may be include a base of metallic material such as INVAR, Cu-INVAR-Cu or Cu which is coated with a dielectric. Organic, ceramic, and metal substrates may be coated with organic dielectrics such as polyimides, thermosets, thermoplastics, preferably a common solder resist is used. In addition to the preceding coatings, ceramic and metallic substrates may also be coated with dielectric ceramics preferably SiC or AlN for example by sputtering.

In step 142 a wiring layer is formed on the dielectric surface including a plurality of interconnectors which adhere to the joining material when heated. The inter-connectors may be one pattern for one chip or preferably multiple patterns for a plurality of chips. The pads are preferably about the same size as the pads on the chip. The material of the wiring layer may be etched copper foil, or may be dry deposited or chemically and/or electrically deposited copper for a flexible laminated board or rigid organic board. The wiring material may be conductive ink screened onto ceramic or metals sputtered through a mask onto ceramic. The wiring layer may consist only of inter-connectors which may be only vias extending through the dielectric layer or may include lands surrounding such vias, but preferably the interconnectors are flat pads or bumps of copper and the wiring layer includes conductors connected to the interconnectors, the conductors may connect between the interconnectors and conductive vias, other interconnectors for the semiconductor component, other interconnectors for other components, or interconductors for connecting from the wiring layer to another interconnect substrate. The interconnectors may be coated with a thin layer of solder by hot air solder leveling (HASL) or an organic such as Benzotriazole which is compatible with soldering to prevent oxidation of the interconnectors. Alternately a bump of HMT solder may be formed on a ceramic or metal substrate or placed on an organic substrate as a preform ball. Also steps 120–126 may be performed on the carrier substrate instead of on the wafer so that the flat conductive pads of an unbumped chip may be connected to joining material bumps on the interconnect structure.

A respective wiring layer may be formed on the two opposite dielectric surfaces of the interconnect substrate with pads for connecting computer chips to both surfaces.

In step 146 a flip-chip is produced. Step 146 includes the steps 100–112 described above in reference to FIG. 1. In step 148 attachment bumps of joining material are produced. Step 148 may include steps 112–128 described above in reference to FIG. 1. Alternatively, the bumps of joining material may be produced on the interconnectors on the dielectric surface of the interconnect substrate rather than on the connectors on the attachment surface of the attachment substrate on the flip chip as in steps 112–128 above. Also, HMT bumps may be formed on one of the connectors and interconnectors, and LJT material deposited on the other one. Steps 144 and 146 may be performed at any time before, during, or after performing steps 140 and 142 above.

The following steps 150–154 must be performed after the step 148. In step. 150 the attachment and dielectric surfaces are moved together with the connectors aligned with the interconnectors. If there are multiple chip sites then preferably the chips are placed sequentially, preferably in a single process step before any of the chips are reflowed. Preferably, the interconnect substrate is optically aligned with the attachment substrate for example by using the machine vision system described above. Preferably, flux is applied to clean any oxide off the connectors and interconnectors during reflow. The flux may be a water-clean flux which forms a residue which can be rinsed off using water after reflow. Preferably, the flux is a no-clean flux which leaves an inert residue which can be identified as residue of no-clean flux.

In step 152 the attachment and interconnect substrates are maintained in about fixed relative position together and heated by directed hot forced air, contact with a heating head, directed infra red (IR) radiation, a vapor phase heating chamber, or preferably by a convection and/or conduction reflow oven. Preferably, during reflow the attachment substrate is allowed to float on the joining material between the connectors and interconnectors and move into precise alignment by forces generated by the surface tension of the joining material, acting on the connectors and interconnectors.

In step 154 the attachment and interconnect substrates cool together to attach them together. Typically they are moved out of the oven or the source of heat is removed and the package cools by interaction with ambient air to form a solid joint between the connections and interconnections.

In step 156, encapsulant is dispensed in the volume between the semiconductor surface and the dielectric surface around the joints. Eutectic solder between connection pads on the chip and interconnect pads on the attachment surface result in joints that bulge substantially from the pads. Providing bumps of HMT solder provides much more separation and much less bulging with the same volume of solder. Preferably, the encapsulant is an organic material (preferably epoxy) and is preferably filled with glass particles to provide a CTE intermediate between the semiconductor base material and the interconnection substrate.

Step 156 is optional since the module may be a circuit-board assembly which may not require further connection to another substrate or may be a chip carrier requiring connectors to connect the chip carrier module to a circuit-board. In step 156 terminals are provided to connect the module to another substrate such as a circuit-board. The terminals may be peripheral leads such as gull-wing, J-wing, I-wing, with 0.3, 0.4, 0.635 or 1.27 mm center spacing (or an intermediate spacing) clipped to the edge of the substrate.: Alternatively, the terminals may be pins extending through the attachment substrate to form conductive vias. Alternately, the terminals may be bumps such as solder balls attached to a surface of the transfer substrate. For example after screening LJT solder paste on flat 1.0 mm connector pads on 1.27 mm center-to-center spacing (more preferably about 0.635 mm spacing), then 1.1 mm dia preformed balls of HMT solder may be placed on the paste and the paste reflowed to connect the balls to the terminal pads.

For example, on a ceramic substrate with a dry deposited copper wiring layer on the top surface, gull-wing leads are clipped onto the substrate on the pads at 0.3 mm centers along all four edges. A stencil is positioned on the top surface of a ceramic substrate and HMT solder paste is deposited on the peripheral pads and a rectangular row of connection pads for a wire bond chip. The assembly is placed in an IR oven and reflowed, and then removed from the oven to cool. The stencil is removed, and the wirebond chip is placed with flat peripheral wirebond pads on the reflowed HMT solder bumps of the ceramic substrate. Then the assembly is reflowed again to connect the HMT solder directly to the wire bond chip pads. Then the volume between the chip and ceramic surface around the connections is filled with encapsulant.

FIG. 3 illustrates the process of the invention for producing a bump array chip carrier. In step 170, an attachment substrate with an attachment surface and a carrier surface is formed. This step is similar to step 140 in FIG. 2 of forming a chip carrier substrate. The attachment and carrier surfaces can be on opposite side of the attachment substrate or on the same side of the attachment substrate. If on the same side, the carrier surface is preferably enclosed by a symmetric border of attachment surface.

In step 172 coupling pads are formed on the carrier surface for coupling a chip to the attachment substrate. Multiple sets of coupling pads may be provided for multiple chips. The pads may be flat pads for flip-chips i.e. bumped chips or bumped pads for unbumped flip or wire bond chips as described above for step 142 of FIG. 2. Alternately, the pads may be flat pads for bonding wires between the coupling pads and wire bond chips.

In step 174 a plurality of connectors are formed on the attachment surface for connecting the carrier to another substrate such as a circuit-board. The connectors may be flat connector pads or bumps may be formed on the flat connector pads. The same HMT materials may be used to form the bumps as described for step 112 above for HMT bumps on flip-chips. The HMT material should be joinable to the pads at a temperature that will not damage the attachment substrate, or wiring layer. For example, a HMT solder may be selectively applied to the connector pads and reflowed to form bumps (balls) in site. HMT solder may be applied by dry deposition over photo-patterned resist, or through a mask or by dry depositing a thin layer over which additional solder is electroplated. More preferably any HMT solder is transferred from a transfer substrate by reflowing as described below. Then the deposited solder is reflowed to form bumps or balls of solder. Alternatively, LJT material may be screened onto the flat connector pads and preformed shapes of HMT solder may be placed on the pads, and then the LJT material heated to connect the preforms to the pads to form connector. Another alternative is to deposit sticky flux onto the connector pads and then place preforms on the pads and then heating to connect the preforms to the pads.

Preferably, the connectors are 0.3 to 2.0 mm wide with centers spaced in rows at 1.1 to 3 times their width, more preferably the connectors are 0.35 to 1.1 mm wide and spaced less than 2 times their width. Preferably, the reflowed bumps have sufficient solder to extend more than about 10% of the diameter of the connector pads out from the substrate more preferably they extend more than about 40% to 180% of the pad diameter, and most preferably extend 80% to 150%. Alternatively, preformed balls of HMT solder may be placed on sticky flux on the pads and reflowed at high temperature or welded to the pads. Another alternative is to screen LJT material (solder, conductive adhesive, TLP material) on the connector pads, place the ball on the pads, and then heat to adhere the balls to the pads. The larger the connector pads and the further the bumps extend, the lower the thermal fatigue, but the size of pads and balls that can be reliably formed and reflowed without solder bridging is limited by the spacing between the connector pads. After reflow the solder may be flattened using a pneumatic flattener to press an anvil against the attachment surface to produce a flat area on the distal ends of the balls. Flattening is especially advantageous when the attachment substrate is to be placed on hemispherical ended bumps on an interconnect substrate since confronting un-flattened bumps tend to interact to bias the chip carrier out of position.

In step 176 conductors are formed between the coupling pads and connectors. Where the coupling pads and connectors are within a single wiring layer the conductors preferably include wires within the wiring layer. The conductors may also be routed through conductive vias to another layer especially where multiple wiring layers are specialized for certain directions or where the coupling pads are accessed from a different side of the attachment substrate than the connectors.

In steps 178 a transfer substrate is produced with a transfer surface, and in step 180 a plurality of holes are formed on the transfer surface in a mirror image arrangement to the plurality of connectors, with walls that are significantly less adhesive to the joining material than the connectors. The above discussion for steps 114 and 116 of FIG. 1 relating to forming a transfer substrate with transfer surface and forming holes in a mirror image to connectors, is also applicable to step 178 and 180 respectively.

The size of the holes in the transfer substrate depends on the type of joining material and the desired volume of joining material and the spacing between holes. For example, for a plastic ball grid array with 0.8 mm peripheral connection pads spaced at 1.27 mm centers, 1 mm$^3$ of LJT solder paste which shrinks 50% in volume during reflow may be deposited using a 0.8 mm thick stencil with 1.1 mm square holes. The substrate and stencil are placed in a convection oven and reflowed to form 1.0 mm dia balls of LJT solder on the pads.

The discussion for steps 118–126 for FIG. 1 above generally also applies to steps 182–190. In step 182 joining material is provided in the holes; in step 184 the attachment and transfer surfaces are moved relatively together with the connectors aligned with the holes and in position to contact the joining material; in step 186 the connectors are heated in contact with the joining material; in step 188 the connectors and adhering joining materia is cooled, and in step 190 the transfer and attachment substrates are moved relatively apart with substantially all the joining material attached to the connectors.

FIG. 4 illustrates the process for producing a bump array module of the invention. In step 200, an attachment substrate with an attachment surface and a carrier surface is formed. This step is similar to the step 140 in FIG. 2 of forming a chip carrier substrate. As in step 170 in FIG. 3, the attachment and carrier surfaces can be on the same or on opposite sides of the attachment substrate.

In step 202 coupling pads are formed on the carrier surface for coupling a chip to the attachment substrate. This step is similar to steps 172 of FIG. 3 and 142 of FIG. 2, described above.

In step 204 a computer chip is connected to the coupling pads. For chips mounted face down this step may be the same as steps 146–156 of FIG. 2 described above. Alternatively other methods for bumping chips or coupling pads may be used. For example, bumps may be made by placing sticky flux on pads, placing preformed joining material on the pads, heating to form the bumps on the pads, and flattening the bumps if desired. For example flux and HMT solder is placed on face pads of a flip-chip, and the solder is reflowed to form bumps on the face pads, and flux and LJT solder preforms are placed on the coupling pads, reflowed to form bumps, and flattened. Then the flip-chip is placed on the substrate with the hemispherical HMT solder bumps on the flattened LJT solder, and then reflowed to connect the chip to the substrate. Bumps can also be made using a wire bond machine by forming a bump at the end of a wire bond wire, compression connecting the bump to the pad, and breaking the wire off at the bump. For wirebond chips, the back of the,chip is bonded at the center of a rectangle of coupling pads using adhesive such as epoxy, and then aluminum or gold wires are bonded from bond pads on the peripheral edges of the chips to the connection pads on the carrier surface.

The discussion of steps 174–180 for FIG. 3 above generally applies to the following steps 206–212. In step 206 a plurality of connectors are formed on the attachment surface for connecting the module to another substrate such as a circuit-board. In step 208 conductors are formed between the coupling pads and connectors. In steps 210 a transfer substrate is produced with a transfer surface, and in step 212 a plurality of holes are formed on the transfer surface in a mirror image arrangement to the plurality of connectors, with walls that are significantly less adhesive to the joining material than the connectors.

The discussion for steps 118–126 for FIG. 1 above, also generally applies to the following steps 214–222. In step 214 joining material are provided in the holes; in step 216 the attachment and transfer surfaces are moved relatively together with the connectors aligned with the holes and in position to contact the joining material; in step 218 the connectors are heated in contact with the joining material; in step 220 the connectors and adhering joining materia is cooled, and in step 222 the transfer and attachment substrates are moved relatively apart with substantially all the joining material attached to the connectors.

FIG. 5 illustrate a method of the invention for making a circuit-board assembly. In step 240 a circuit-board substrate with a coupling surface is formed.

The substrate may be a dielectric coated metallic such as INVAR, Cu-INVAR-Cu, or Cu. Preferably, the substrate is an organic such as a thermoset (e.g. FR-10, G-10), a polyimide, a PTFE, or a thermoplastic. Such organics are preferably filled with dielectric particles of ceramic or glass, or more preferably dielectric fibers even more preferably woven PTFE or glass fiber cloth. Organic and metal substrates may be coated with organic dielectrics such as polyimides, thermosets, thermoplastics, preferably a common solder resist is used. Ceramic substrates are very rarely used as a substrate to which modules are attached due to expense, fragility, and weight.

In step 242 a wiring layer is formed on the coupling surface including a plurality of coupling pads which adhere to a second joining material when heated. The pads are preferably about the same size as the pads on the module. The material of the wiring layer may be etched copper foil, or may be dry deposited or chemically and/or electrically deposited copper for a flexible laminated board or rigid organic board. The wiring layer may consist only of interconnectors which may be only vias extending through the dielectric layer or may include lands surrounding such vias, but preferably the interconnectors are flat pads or bumps of copper and the wiring layer includes conductors connected to the interconnectors, the conductors may connect between the interconnectors and conductive vias, other interconnectors for the semiconductor component, other interconnectors for other components, or interconductors for connecting from the wiring layer to another interconnect substrate. Preferably, the interconnectors are copper. The interconnectors may be coated with a thin layer of immersion tin or solder deposited by HASL or an organic such as Benzotriazole which is compatible with soldering, to prevent oxidation of the interconnectors. Alternately a bump of HMT solder may be placed on an organic substrate as a preformed ball. The second joining material may be the same material used in producing the bumped chip module of FIG. 2, but preferably has a lower joining temperature than the melting temperature of the joining material of the bumped chip module. The interconnectors typically include multiple patterns for a plurality of surface mount components.

In step 244 a bumped chip module is produced as described above for FIG. 2.

In step 246 the attachment and dielectric surfaces are moved together with the connectors aligned with the interconnectors. If there are multiple component sites then preferably the components are placed sequentially preferably in one process step before any of the components are reflowed. Preferably, the interconnect substrate is optically aligned with the attachment substrate for example by using the machine vision system described above.

In steps 248 the attachment and interconnect substrates are maintained in about fixed relative position together and heated by directed hot forced air, contact with a heating head, directed infra red (IR) radiation, a vapor phase heating chamber, or preferably by a convection and/or conduction reflow oven. Preferably, the attachment substrate is allowed to float on the joining material between the connectors and interconnectors and move slightly into precise alignment by surface tension forces of the joining material, acting on the connectors and interconnectors.

In step 250 the attachment and interconnect substrates cool together to attach them together. Typically they are moved out of the oven or the source of heat is removed and the package cools by interaction with ambient air to form a solid joint between the connections and interconnections.

In step 252, encapsulant is dispensed in the volume between the attachment surface and the dielectric surface around the joints. Eutectic solder between connection pads on the chip and interconnect pads on the attachment surface result in joints that bulge substantially from the pads. Providing bumps of HMT solder provides much more separation and much less bulging with the same volume of solder. Preferably, the encapsulant is an organic material (preferably epoxy) and is preferably filled with particles of a solid material to provide a CTE intermediate between the base materials of the module and interconnection substrate.

FIG. 6 illustrated a method of the invention for making an interconnect structure. In step 260 a circuit-board substrate with a dielectric surface is formed. In step 262 a wiring layer is formed on the interconnect surface including a plurality of interconnectors which adhere to the joining material when heated. The above discussion of substrates and wiring layers for steps 240 and 242 for FIG. 5 is generally applicable to steps 260 and 262.

In step 264 a module is produced as in steps 210–214 above described in relation to FIG. 4. In step 266 bumps of joining material are formed for interconnecting the module to the interconnect substrate. Step 266 may include steps 216–222 described above referring to FIG. 4. Alternatively, in step 266 the joining material bumps may be formed on the attachment substrate in a manner similar to steps 216–222 as described above for FIG. 4.

In step 268 the attachment and dielectric surfaces are moved together with the connectors aligned with the interconnectors.

In steps 270 the attachment and interconnect substrates are maintained in about fixed relative position together and heated.

In step 272 the attachment and interconnect substrates cool together in contact to attach them together. In step 274, encapsulant is dispensed in the volume between the attachment surface and the dielectric surface around the joints. The above discussion of moving, heating, cooling, and encapsulating in steps 246 and 252 for FIG. 5 is generally applicable to steps 268 through 274.

FIG. 7 shows the process of the invention for producing a pin header. In step 290, an attachment substrate is formed with an attachment surface. Substrates for modules is discussed above for step 140 in FIG. 2. Preferably, the substrate is a dielectric organic or ceramic to prevent undesired conduction between pins.

In step 292 a plurality of metal pins are provided extending from connector ends at the attachment surface, through the attachment substrate, and outward to distal ends. Preferably, the pins form at least one row and more preferably two rows to provide a high number of connectors. Again this step may be performed while forming the substrate by molding slip around the pins to make greensheets, forcing the pins into greensheets, or forcing the pins through uncured B-stage fiberglass preforms. Alternately the pins may be placed into the holes for example by force fitting the pins into holes or bending or swaging the pins to hold them in the holes. The holes can be made at the time of forming the substrate such as by molding the substrate with holes already in place, or punching greensheets, or the holes may be formed after the substrate is formed by laser or mechanical drilling or punching. Preferably, the pins are highly conductive metal, such a aluminum or preferably copper, and more preferably at least the distal ends of the pins are coated with a thin non-oxidizing material such as nickel, chrome, silver, or preferably gold for improved electrical contact. Due to material costs, the layer should be as thin as possible while reliably preventing oxidation and providing good electrical contact over the life of the product. The connector ends may include flat heads formed against the attachment surface or spaced from the attachment surface.

The above discussion in steps 114–118 of FIG. 1, is generally applicable to steps 294–306. In step 294 a transfer substrate with a transfer surface is formed. In step 296 a plurality of holes with walls which adhere less to a joining material then the connection ends of the pins adhere to the joining material, are formed in a the transfer surface in a mirror image arrangement to the connection end of the pins. In step 298 joining material is provided in the holes. In step 300, the attachment and transfer surfaces are moved relatively together with the plurality of connectors aligned with and in position to contact the joining material in corresponding holes. In step 302, the joining material and the connector ends are heated for adhering the material to the pins. In step 304, the joining material and connector ends are cooled. In step 308 the transfer and attachment substrates are moved relatively apart with substantially all of the joining material remaining on the connector ends.

FIG. 8, illustrates the method of the invention for producing a circuit-board with connection pins. The above discussion of substrates and wiring layers for steps 240 and 242 for FIG. 5 is generally applicable to steps 320 and 322. In step 320, a circuit-board substrate is formed with a dielectric surface, and in step 322 a wiring layer is formed on the dielectric surface including a plurality of interconnectors which adhere to the joining material.

In step 324, a pin header substrate is formed; and in step 326 pins are provided extending from connector ends through the pin header substrate and out to distal ends. The discussion of steps 290–292 above with reference to FIG. 7 is applicable to these steps 324–326.

The above discussion in steps 114–126 of FIG. 1, is generally applicable to steps 328–338. In step 328 a transfer substrate with a transfer surface is formed. In step 330 a plurality of holes with walls which adhere less to a joining material then the connection ends of the pins adhere to the joining material, are formed in a the transfer surface in a mirror image arrangement to the connection end of the pins. In step 332 joining material is provided in the holes. In step 334, the attachment and transfer surfaces are moved relatively together with the plurality of connectors aligned with and in position to contact the joining material in corresponding holes. In step 336, the joining material and the connector ends are heated for adhering the material to the pins. In step 338, the joining material and connector ends are cooled. In step 340 the transfer and attachment substrates are moved relatively apart with substantially all of the joining material remaining on the connector ends.

In step 341, the attachment and dielectric surfaces are moved relatively together with the plurality of connector ends and respective plurality of interconnectors aligned and communicating with the joining material. In step 342, the connector ends and interconnectors are heated together with the joining material to adhere the joining material between the connector ends and interconnectors. In step 344 the connector ends, interconnectors and joining material are cooled to attach the connector ends to the interconnectors.

FIG. 9 illustrates the method of the invention for producing a component with round terminals. In step 350, a component with an attachment surface is formed; and in step 352 a multitude of terminals with round cross-sections, are attached to the component. The component may be a flip-chip or wire bond chip with round connectors on the attachment surface formed in a manner similar to steps 100–112 discussed above with reference to FIG. 1; or the component may be a chip carrier substrate formed in a manor similar to steps 140 and 142 with reference to FIG. 2, with terminals formed as in step 144 with round cross sections; or the component may be a circuit-board substrate formed with interconnectors as discussed above for steps 260 and 262 with reference to FIG. 6; or the component may be a pin header as discussed above for steps 290–292 with reference to FIG. 7 with round pins; or any other components with round terminals. The following steps 354–358 may be performed before, during, or after steps 350–352.

In steps 354 a transfer member is produced with a transfer surface; and in step 356 a plurality of holes are formed on the transfer surface in a mirror image arrangement to the plurality of terminals of the component. The above discussion for steps 114 and 116 is generally applicable to steps 354 and 356. In step 358 joining material is provided in the holes. The discussion for step 118 above with reference to FIG. 1 generally applies to step 358.

In step 360 the attachment and transfer surfaces are moved relatively together with the terminals aligned with the holes and in position to contact the joining material. Step 360 may be performed prior to step 358 in the case of a transfer substrate with through-holes to form a stencil. In step 362 the terminals are heated in contact with the joining material; in step 364 the terminals and adhering joining material is cooled; and in step 366 the transfer and attachment substrates are moved relatively apart with substantially all the joining material attached to the terminals.

FIG. 10 shows the method of the invention for screen printing to produce components. In step 370 a transfer substrate is produced with a transfer surface and a screening surface on an opposite side of the substrate; and in step 372 holes are formed from the transfer surface to the screening surface through the transfer substrate. The discussion of step 114 and 116 with relation to FIG. 1 above, is generally relevant to steps 370 and 372. In step 374 a component with an attachment surface is produced. In step 376 a multitude of terminals are attached to the component, of a metal which is substantially more adhesive to a screening material than walls of the holes of the transfer substrate, positioned in a mirror-image arrangement with respect to the through-holes in the transfer substrate. Subsequently bumps of screening material are formed on the terminals as described below. The component may be a semiconductor substrate with bumped connectors for attachment to a carrier, formed as discussed above for steps 100–112 of FIG. 1, or the substrate may be a chip carrier with bumped connectors for attaching a bumped or unbumped chip as discussed above for steps 140–144 of FIG. 2, or the component may be a chip carrier or module with bumped connectors for attachment to a circuit-board as discussed above for steps 170–176 of FIG. 3 and 200–208 of FIG. 4, or the component may be a pin header as discussed above for steps 290–292 of FIG. 7, or the component may be a leaded component with gull-wing leads, I-leads, J-leads, or the component may be a circuit-board with bumped connectors for connecting a surface mount component with bumped or unbumped terminals, as discussed above for steps 240–242 of FIG. 6,. Steps 374 and 376 may be performed before, after, or during the performance of steps 370 and 372, and the following steps 378–386 are performed after the performance of steps 370–376.

In step 378 the transfer and attachment surfaces are moved relatively together with a plurality of the connectors aligned with a corresponding plurality of respective through-holes in the mirror image arrangement of through-holes. Preferably, the component and attachment substrate are positioned horizontally with the transfer substrate above the component. In step 380 screening material is provided on the screening surface and forced into the holes and on top of the connectors by a blade. Preferably, the blade is a squeegee. The above discussion of joining materials for step 118 with reference to FIG. 1 generally apply to screening materials in step 380.

In step 382 the transfer substrate and component are heated while their aligned position together is maintained to adhere the screening material to the connectors. Then in step 384 the transfer and screening material are cooled. In step 386 the component and transfer substrates are moved relatively apart with substantially all the screening material remaining attached to the connectors of the component. The component and the transfer substrate may be moved apart before cooling the screening material, depending on the material, but preferably they are cooled together.

FIG. 11 shows a method of the invention for producing components with vias. In step 390 a component with an attachment surface and a remote plane is produced. In step 392 via holes are formed at least partially through the component for communication between the attachment surface and remote plane, and in step 394 the vias are made conductive. In step 396 a wiring layer communicating with the vias, is produced on the attachment surface including a multitude of connectors communicating with the vias. In step 398 a remote wiring layer communicating with the vias is produced in the remote plane. The component may be a semiconductor substrate with vias through silicon dioxide between wiring layers or through the passivation layer between a wiring layer and surface connector for attachment to a carrier, formed as discussed above for steps 100–112 of FIG. 1, or the substrate may be a chip carrier with connectors on a bottom surface and bumped couplers on a top surface for attaching a bumped or unbumped chip as discussed above for steps 140–144 of FIG. 2, or the component may be a chip carrier or module with couplers on a top surface for connecting a bumped or wire bond chip and bumped connectors on a bottom surface for attachment to a circuit-board as discussed above for steps 170–176 of FIG. 3 and 200–208..of FIG. 4, or the component may be a pin-in-hole component (e.g. DIP or PBGA) in which case the connectors are on a top wiring layer and the ends of the pins are the remote layer, or the component may be a leaded component with gull-wing leads, I-leads, J-leads, with the leads connected to one of two or more wiring layers or the component may be a circuit-board with multiple layers with bumped connectors for connecting a surface mount component with bumped or unbumped terminals, as discussed above for steps 240–242 of FIG. 5.

In steps 400 a transfer member is produced with a transfer surface; and in step 402 a plurality of holes are formed on the transfer surface in a mirror image arrangement to the connectors on the attachment surface. A joining material adheres less to walls of the holes and the transfer surface than to the connectors of the attachment surface, when heated. The above discussion for steps 114 and 116 is generally applicable to steps 400 and 402. In step 404 the joining material is provided in the holes. The discussion for step 118 above with reference to FIG. 1 generally applies to step 404. Steps 400 and 404 may be performed before, after, or during the performance of steps 390–398, and the following steps 406–412 are performed after the performance of steps 390–404.

In step 406 the transfer and attachment surfaces are moved relatively together with a plurality of the connectors aligned with a corresponding plurality of respective holes in the mirror image arrangement of holes.

In step 408 the transfer substrate and component are heated while their aligned position together is maintained to adhere the joining material to the connectors. Then in step 410 the connectors and joining material are cooled. In step 412 the component and transfer substrates are moved relatively apart with substantially all the joining material remaining attached to the connectors of the component. The component and the transfer substrate may be moved apart before cooling the screening material, depending on the material, but preferably they are cooled together.

FIG. 12 shows the steps of the process of the invention for producing an area array component. In step 420 a component with an attachment surface is produced. In step 422 boundary terminals are formed which define a peripheral boundary, and in step 424 inner connectors are formed within the boundary significantly spaced inwardly toward the center of the bounded area. Preferably, one or more of the inner connectors are spaced inwardly at least the minimum spacing between connectors along the boundary. The terminals could be for example multilayer gull wing leads, or gull wing leads and J-leads on each component edge, or preferably the terminals are bumps on the bottom of the component for attachment to a circuit board. Preferably, the bumps form multiple concentric boundaries formed by rows defining equilateral rectangular boundaries.

In steps 426 a transfer member is produced with a transfer surface; and in step 428 a plurality of holes are formed on the transfer surface in a mirror image arrangement to the connectors on the attachment surface. A joining material adheres less to walls of the holes and the transfer surface than to the connectors of the attachment surface, when heated. The above discussion for steps 114 and 116 is generally applicable to steps 426 and 428. In step 430 joining material is provided in the holes. The discussion for step 118 above with reference to FIG. 1 generally applies to step 430. Steps 426–430 may be performed before, after, or during the performance of steps 420–424, and the following steps 432–438 are performed after the performance of steps 420–428.

In step 432 the transfer and attachment surfaces are moved relatively together with a plurality of the connectors aligned with a corresponding plurality of respective holes in the mirror image arrangement of holes. Step 430 may be performed after step 432 for a transfer member with through-holes.

In step 434 the transfer substrate and component are heated while their aligned position together is maintained to adhere the joining material to the connectors. Then in step 436 the connectors and joining material are cooled. In step 438 the component and transfer substrates are moved relatively apart with substantially all the joining material remaining attached to the connectors of the component. The component and the transfer substrate may be moved apart before cooling the screening material, depending on the material, but preferably they are cooled together.

FIG. 13 exhibits the method of the invention for producing a structure interconnected by round terminals. In step 440 an interconnect substrate with a dielectric surface is formed similar to the substrates for step 240 with reference to FIG. 5. In step 442 a component with an attachment substrate is produced, and in step 444 a multitude of terminals with round cross section are produced. The discussion above for steps 350 and 352 with reference to FIG. 9, for terminals with round cross sections also applied to these steps 440 and 442.

In step 446 a transfer substrate is used to deposit bumps of joining material on the connectors of round cross section. This step corresponds to steps 354–366 above described with reference to FIG. 9. In step 448 a wiring layer is formed on the dielectric surface including a plurality of interconnectors to which a joining material adheres. The above discussion of forming wiring layers on substrates for steps 242 with reference to FIG. 5 generally applies to step 448. In step 450 the attachment and dielectric surfaces are moved relatively together with the round terminals aligned with the interconnectors and with the corresponding plurality of interconnectors in position for contacting the joining material on the terminals. In step 452 the interconnectors and round terminals with joining material are heated to adhere the joining material to the interconnectors, and in step 454 the terminals, interconnectors, and joining material are cooled to form an interconnect structure with components connected by round terminals.

FIG. 14 presents the process of the invention for producing interconnect structures by screening. In step 460 an interconnect substrate with dielectric surface is formed as discussed above for step 240 with reference to FIG. 5. In step 462 a wiring layer is formed on the dielectric surface including a plurality of interconnectors which adhere to a joining material when heated. The above discussion of forming wiring layers on substrate for step 242 for FIG. 5 is generally applicable to steps 462. In step 463 a component is formed with interconnection terminals in corresponding mirror-image arrangement with a plurality of the interconnectors of the interconnect substrate. In step 464 a transfer substrate is produced and through-holes are formed in the transfer substrate, then the transfer substrate is positioned over the module with the holes aligned with the terminals and the transfer substrate is used as a screen to deposit joining material in the holes onto the terminals. The discussion of steps 114–118 for FIG. 1 regarding screening is generally applicable to step 464. In step 466 the joining material is heated within the holes to adhear to joining material to the terminals and in step 468 the joining material and terminals are cooled in contact to deposit the joining material on the terminals. Steps 460–468 generally correspond to steps 370–386 for FIG. 10. In step 470 the attachment and dielectric surfaces are moved relatively together with the terminals aligned with the interconnectors and with the corresponding plurality of interconnectors in position for contacting the joining material on the terminals. In step 472 the interconnectors and round terminals with joining material are heated together to adhere the joining material to the interconnectors, and in step 474 the terminals, interconnectors, and joining material are cooled to form an interconnect structure with components connected to the terminals by the screened joining material.

FIG. 15 presents the process of the invention for producing structures interconnected with vias. In step 480 an interconnect substrate with dielectric surface is formed as discussed above for step 240 with reference to FIG. 5. In step 482 a component is formed with terminals communicating through conductive vias. Step 482 corresponds to the steps of FIG. 11. In step 484 joining material is hot transferred onto distal ends of the terminals. In step 486 a wiring layer is formed on the dielectric surface including a plurality of interconnectors which adhere to a joining material when heated, with a plurality of the interconnectors in a mirror image arrangement to a corresponding plurality of the terminals. The above discussion of forming wiring layers on a substrate for step 242 for FIG. 5 is generally applicable to step 486. In step 488 the attachment and dielectric surfaces are moved relatively together with the terminals aligned with the interconnectors and with the corresponding plurality of interconnectors in position for contacting the joining material on the terminals.

In step 490 the interconnectors and round terminals with joining material are heated together to adhere the joining material to the interconnectors, and in step 492 the terminals, interconnectors, and joining material are cooled to form an interconnect structure with components connected to the terminals by the screened joining material.

FIG. 16 presents the process of the invention for producing interconnect structures with area array interconnection. In step 510 an interconnect substrate with dielectric surface is formed as discussed above for step 240 for FIG. 5. In step 512 a component is formed with a dielectric attachment surface. In step 514 boundary terminals are formed at the periphery of the substrate. In step 516 inner terminals are formed within the bounday. The above discussion of steps 420–424 are generally applicable to steps 512–516 respectively. In step 518 a wiring layer is formed on the dielectric surface including a plurality of interconnectors which adhere to the joining material when heated, with a plurality of the interconnectors in a mirror image arrangement to a corresponding plurality of the terminals. The above discussion of forming wiring layers on substrates for step 242 for FIG. 5 is generally applicable to steps 518. In step 520 the joining material is hot transferred from the holes onto the terminals or interconnectors. In step 522 the attachment and dielectric surfaces are moved relatively together with the terminals aligned with the interconnectors and with the corresponding plurality of interconnectors in position for contacting the joining material on the terminals.

In step 524 the interconnectors and round terminals with joining material are heated together to adhere the joining material to the interconnectors, and in step 526 the terminals, interconnectors, and joining material are cooled to form an interconnect structure with components connected to the terminals by the screened joining material.

FIG. 17 discloses the method of the invention for producing a joining material array holder for a component. In step 530 a holder base is formed of a material that remains rigid at a joining temperature of a joining material. In step 532 a transfer surface is formed on the base, of a material to which the joining material does not significantly adhere when heated to the joining temperature. The above discussion of forming a transfer substrate with an attachment surface in step 114 generally applies to steps 530 and 532. In step 534 boundary holes are formed in the transfer surface with the centers of the holes defining the boundary of an area of a simple geometric shape e.g. triangle, rectangle, rhombus, parallelogram, etc. In step 536 inner holes are formed within the boundary with a plurality of the inner holes spaced inwardly toward the center of the area, significantly away from the boundary. Preferably, one or more of the inner holes are spaced from the boundary at least about the minimum distance along the boundary between the boundary holes. The walls of the boundary and inner holes do not significantly adhere to a joining material when heated to the joining temperature, and the pattern of holes is in a mirror image to the leads of the component for transferring the joining material to the leads of the component. The above discussion for steps 114 and 116 is generally applicable to this Figure.

FIG. 18 illustrates the process of the invention for providing a coated joining material holder. In step 540 a holder base is formed of a material that remains rigid at a joining temperature of a joining material. In step 542 a transfer surface is formed on the base. In step 544, holes are formed in the transfer surface, in a mirror image to the leads of a component for transferring the joining material to the leads of the component. In step 546 the walls of the holes are coated with a material to which the joining material is substantially less adhesive when heated to the joining temperature, than to the material of the transfer surface. Preferably, the transfer surface is also coated. The above discussion for steps 114 and 116 is also generally applicable to this FIG. 18.

FIG. 19 illustrates the process of the invention for producing a joining material screen. In step 550 a holder substrate of a material that remains rigid at a joining temperature of a joining material is formed. In step 552, on one side of the substrate, a transfer surface is formed which does not significantly adhere to the joining material when heated. In-step 554, holes are formed in the transfer surface, through the substrate, with walls to which the joining material does not significantly adhere when heated, and in a mirror image pattern to the pattern of terminals of a component. In step 556 a screening surface is formed on an opposite side of the holder substrate from the transfer surface. Preferably, the screening surface does not significantly adhere to the joining material when heated. Step 558 is an optional step. In step 558 a backing plate is provided on a screening surface which is on the opposite side of the holder substrate from the transfer surface, to provide cavities. If 558 is not performed than the joining material holder can positioned over components with the holes aligned with component terminals and joining material on the screening surface can be screened directly into the through holes onto the component terminals. On the other hand, if step 558 is performed than the holder substrate can be used to screen material into the cavities onto the backing plate and then a component can be positioned with terminals in position to contact the paste in respective cavities. In either case the joining material can be heated in the holder substrate and then cooled to attach the joining material to the terminals. Preferably, the holder substrate includes multiple patterns of holes for simultaneous use for multiple components and more preferably the holder substrate has patterns of holes for use with a wafer with multiple chip patterns.

FIG. 20 shows the method of the invention for producing an interconnect structure with replaceable components. In step 560 an interconnect substrate with a dielectric surface is formed. In step 562 a multitude of interconnectors are formed on the dielectric surface. In step 564 a first surface mount component with a plurality of terminals in a mirror image arrangement to a plurality of the interconnectors is formed. In step 566 a first joining material is provided. In step 568 the surface mount component and interconnect substrate are moved relatively together with the plurality of terminals aligned with a corresponding plurality of the interconnectors. In step 570 the terminals, interconnectors, and joining material are heated in communication. In step 572 the terminals, interconnectors, and joining material are cooled to attach the first surface mount component to the interconnect substrate. In step 574 which is optional and generally only applies to flip-chips but may also apply to ball grid array components, the volume between the bottom of the component and interconnect structure around the joints is encapsulated. In step 576 it is determined whether the first surface mount component needs replacement. The replacement may be the result of testing the board or component or as a result of engineering changes. Depending on the determination the following step 578–594 are performed only if replacement is required.

In step 578 the first surface mount component, interconnectors, and first joining material are heated to soften the first joining material. Then the first surface mount component is pulled off the interconnect substrate and the remaining joining material is removed from the interconnect substrate or equalized on the interconnectors. Removal of solder can be accomplished for example, by using a block of sintered copper particles or by placing a stencil over the hot joining material and brushing away excess material. Alternately, in step 578 for bump connect components, the component may be removed (e.g. by mechanical milling), leaving of the bumps and then the encapsulant and bumps are planarized (e.g. by grinding) to form a flat surface with interconnectors for subsequent processing. This milling and planarizing proceedure is especially advantageous for bumped components (e.g. flip-chips and SMC's) that have previously been encapsulated around the bumps with a thermoset epoxy encapsulant. In step 580 a transfer member with an transfer surface is produced. In step 582 a multitude of holes are formed in the transfer surface. In step 584 a second joining material is provided in the holes.

In step 586 a second surface mount component with a plurality of terminals is provided. In step 588 the joining material is heated and cooled to transfer the joining material out of the holes in communication with the interconnectors, terminals or both. In step 590 the component and dielectric surfaces are moved relatively together with the plurality of the terminals aligned with a corresponding plurality of interconnectors, with interconnectors in position for contacting the second joining material. In step 592 the interconnectors and terminals of the second component are heated in communication with the second joining material to ahear the joining material between the interconnectors and connectors of the second component. In step 594 the terminals of the second component and interconnectors are cooled together to attach them together. Finally if desired, in step 596 the volumn between the second component and interface board is encapsulated.

Figure 21:
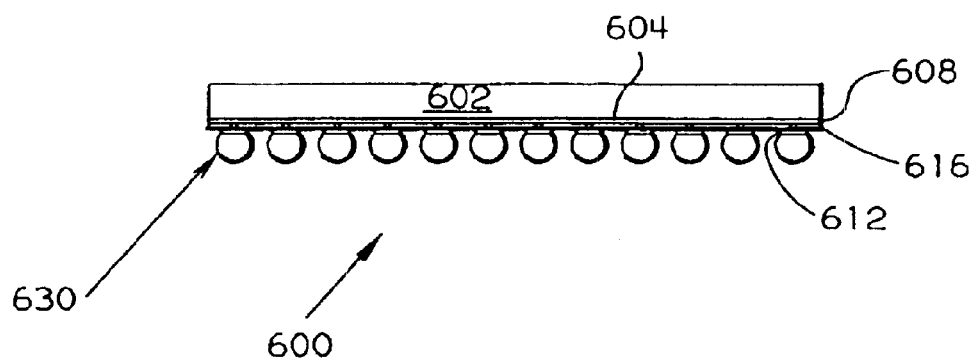
FIG. 21 illustrates flip-chip of the invention with bumps on pads.
Figure 22:
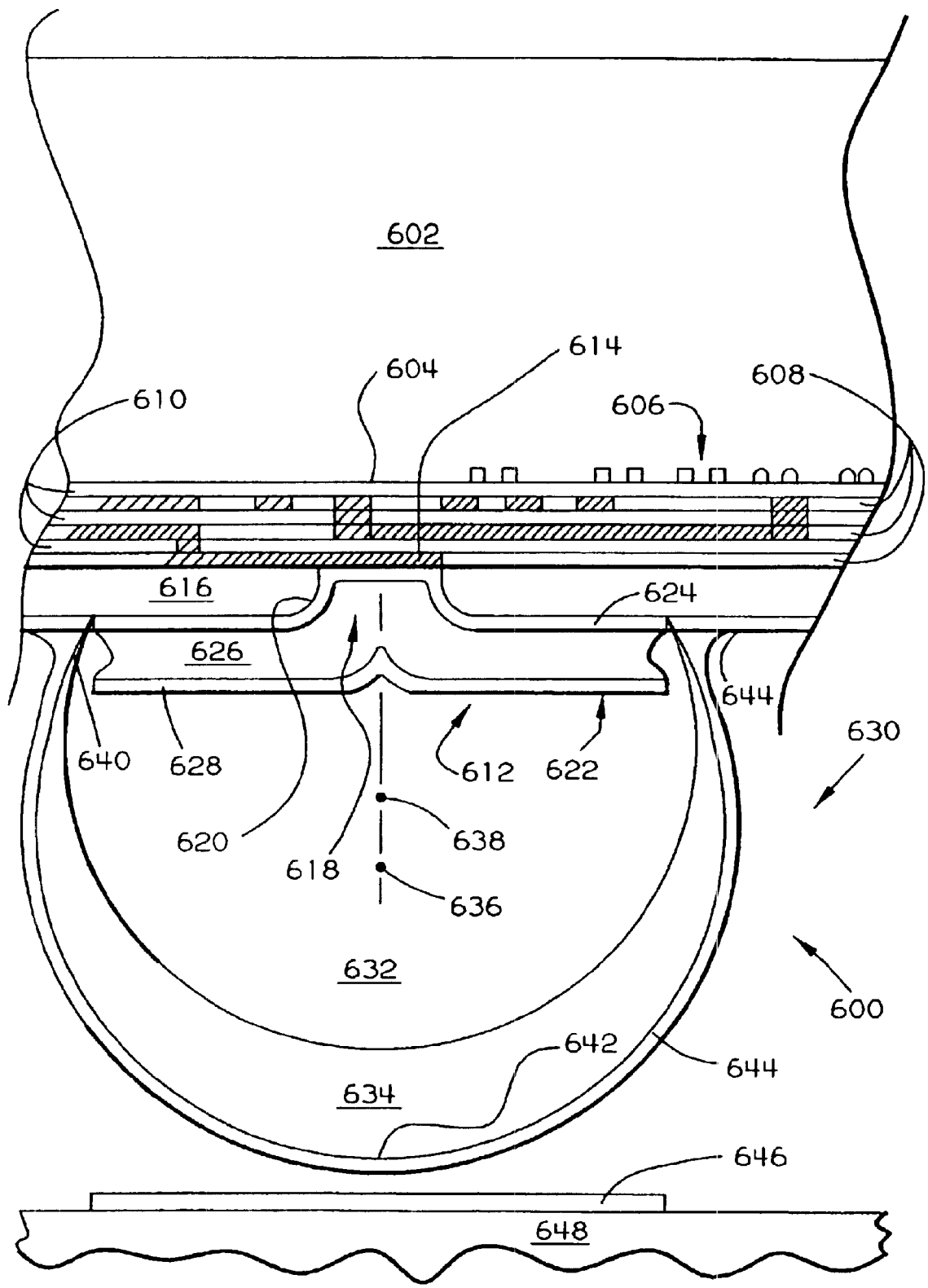
FIG. 22 shows a more detailed view of one of the bumps of the chip n FIG. 21.

FIG. 21 illustrates flip-chip 600 of the invention, and FIG. 22 shows a more detailed view of part of the chip. In FIG. 22, substrate 602 (preferably a diced rectangular chip of silicon metal) has a semiconductor surface 604 preferably of polished silicon (see above discussion of FIG. 1 step 100). Electronic devices 606 (e.g. transistors of doped silicon regions) on the semiconductor surface are interconnected by one or more wiring layers 608 (e.g. polysilicon and multiple patterned aluminum layers) filled and separated by silicon dioxide dielectric layers 610. Preferably, all the wiring and dielectric layers have a dry deposited structure. The wiring layers are connected to an array of metal connectors 612 including round wiring pads 614 of a HMT metal. Preferably, for area array flip chips the wiring pads are less than 0.1 mm wide and consist of aluminum metal and have a dry deposited structure. Alternately, the connectors may include only peripheral pads which can be used for wire bonding and which are being bumped for flip chip connection in which case they would be about 0.5 mm wide.

A layer of passivation 616 (e.g. silicon dioxide, glass, or preferably spin coated polyimide) covers the wiring layers and includes via holes or windows 618 which extend through the passivation with tapered about cylindrical wall 620 at the wiring pads.

For area array chips the vias are made conductive by depositing metal in the hole. Preferably, they are filled with metal including a dry deposit metal. Preferably, connectors 612 also include preferably round, exterior pads 622 of HMT material which may extend outward from the window onto the passivation around the window, as shown. The exterior pads may include one or more layers of metal (preferably exhibiting the metallurgy of dry deposited layers) which may include at least one layer 624 for adhesion to the passivation layer, of chromium, titanium, or tungsten; layer 626 of copper (which may include layers having a dry deposited metallurgy and layers with an electroplated metallurgy); and layer 628 of aluminum to protect the copper from dissolving in the joining material.

Bumps 630 of round cross-section may be formed on pads 622. Bumps 630 may include a bump 632 of a second, different, conductive, HMT metal which may be attached to the pads as shown. The HMT metal of the bump may be dry deposited aluminum or dry deposited and/or electroplated copper, but preferably the HMT material is HMT solder alloy. Preferably, the HMT bumps exhibit the metallurgy of reflowed solder paste. Preferably, the HMT metal is solder, preferably of Pb and 2–15% Sn, more preferably 3–10% Sn. Alternately the solder may be 90/5/5 Pb/In/Ag, or 95/5 Pb/In or 95/5 Sn/Sb or another similar solder with a solidus temperature between 230° C. and 330° C. Preferably, bumps 632 have a melting temperature sufficiently below the melting temperature of pads 614 and 622 and the temperature at which the passivation and electronic components are damaged to allow reflowing the HMT bumps. Also the HMT metal preferably has sufficient surface tension to form the hemispherical shape as shown during reflow. Preferably, the diameter of the bumps is larger than the diameter of external pads 622. The bumps may extend outward from the external pad from 10% to 300% of the diameter of the pad, preferably the bumps extend outward 40% to 200% of the diameter of the pads, and more preferably 80% to 160% of the diameter of the pads.

Bumps 630 are preferably made or covered with a LJT joining material 634 (preferably exhibiting the metallurgy of reflowed LJT solder paste). Preferably, the LJT material has a melting temperature sufficiently below the melting temperature of HMT bumps 632 to form the LJT covered bumps without significantly effecting the HMT bumps or damaging the carrier and the molten LJT bumps have sufficient surface tension to form a hemispherical shaped surface as shown. Preferably, the LJT joining material is a metal solder alloy. Preferably, HMT solder bumps are reflowed to form a hemispherical shape and then LJT solder is deposited and reflowed without melting the HMT bumps to fully enveloping the HMT bumps with a center 636 of the LJT bump higher and collinear with the center 638 of the HMT bumps in a line perpendicular to the plane of semiconductor surface 604. The thickness of such LJT solder bumps extends from about zero at 640 where the HMT bumps meet the solder resist to a thickest cross section at the distal end 642 of the LJT bump. Preferably, the LJT solder is an alloy of Pb and 40% to 85% Sn, more preferably 50% to 75% Sn, even more preferably an about eutectic solder alloy, most preferably about 37/63% Pb/Sn. Preferably, the LJT bumps have a melting temperature (liquidus) between 110° C. and 230° C. and between 20° C. and 120° C. less than the melting temperature (solidus) of the HMT bumps. For solder bumps formed by reflowing, a substantially inert residue of no-clean flux may be contained in the HMT bump, or on the exterior surface of the HMT bump, or to the covering LJT material or on the exterior surface of the LJT material.

Flux 644 may be applied to bump 600 or entire chip before placing the chip on a connector 646 of carrier 648. Preferably, the flux is a no-clean flux which eliminates the step of rinsing to clean the residue after connection. Preferably, the flux is sticky to hold the chip on the connectors between placement and reflowing.

Figure 23:
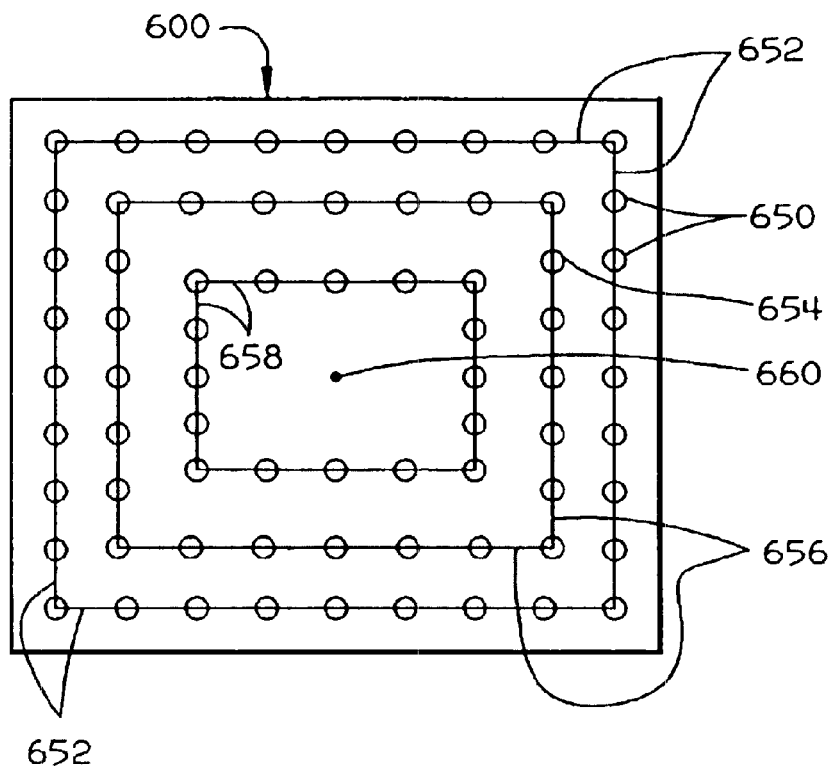
FIG. 23 shows the arrangement of the pads on the flip chip of FIG. 21.

FIG. 23 shows the arrangement of the pads on the flip chip. The pads are preferably arranged in an area array including peripheral pads 650 defining boundary 652 of simple geometric shape such as rectangle and inner pads 654 spaced significantly inward from the boundary toward the center of the shape at 660 (preferably about the minimum distance between pads in the peripheral rows). Preferably, the pads define multiple concentric rectangles 652, 656, 658 about center 660 of boundary 652. Preferably, the diameter of the pads is between 30% and 90% of the spacing between pad centers, more preferably 70% to 80% and most preferably as large as reliable connection without bridging allows. Although only a 91 pad area array is shown, preferably the pads number more than about 200, more preferably greater than about 400, and most preferably greater than 800. Although the pads are shown in a perfect grid array, some of the grid pads may be skipped and preferably the central grid is missing to make wiring to the chip easier and more arbitrary non-symmetrical or even random appearing configurations are feasible.

Figure 24:
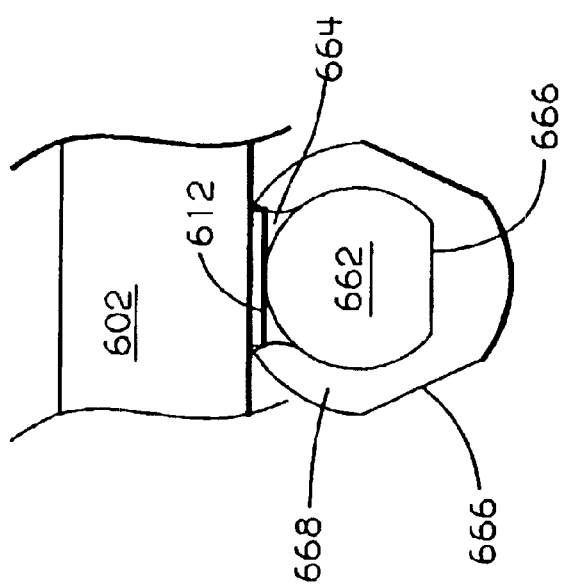

FIG. 24 shows a small section of an alternate embodiment of the flip chip in which a spherical preform 662 has been attached to pad 612. The preform may be attached to the pad by hot contact, welding, reflow of the preform, or more preferably by LJT solder 664. The exterior of HMT bump 662 may modified at 666 by cooling the bump after reflow in contact with a flat bottom surface of a cavity to which the joining material does not adhere. Alternately, the preform may be flattened as discussed below. The exterior of LJT material 668 has also been modified by cooling after reflow, in contact with tapered bottom or side walls of a cavity.

Figure 25:
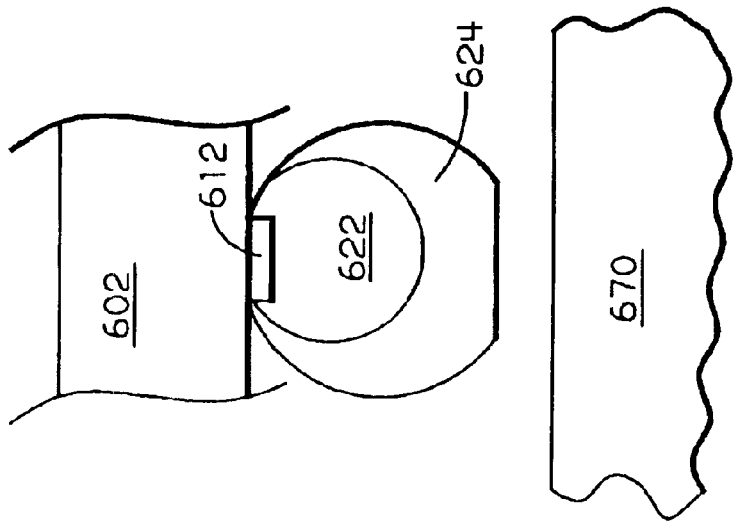

FIG. 25 illustrates another alternate embodiment of the flip chip in which the shape of the HMT bump and LJT bump has been flattened by anvil 670. This is especially advantageous in case the connectors on the carrier are hemispherical or if the distal ends of the bumps are not sufficiently planar and is useful if the connectors on the carrier are not sufficiently planer since the flattened shape of the HMT bump in FIGS. 24 and 25 caused the HMT ball to be more separated from the carrier and the flattened shape of the: LJT bump in FIG. 25 caused the bump to extend outward during reflow to connect the distal end of the bump to a connector which is previously spaced away from the bump.

Figure 26:
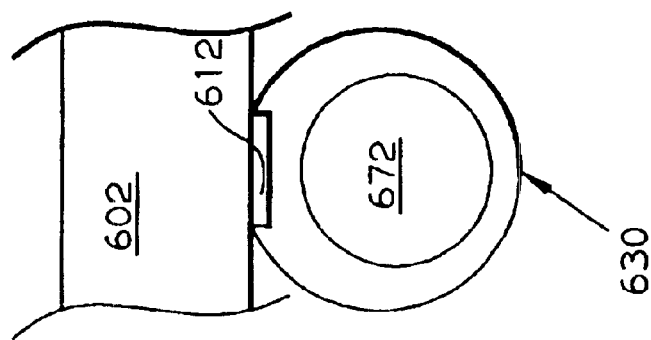
FIGS. 24–26 show alternate embodiments of the bumps of the flip chip of FIG. 21.

FIG. 26 portrays another embodiment in which a spherical preform 672 floats within bump 630. The HMT ball preform may originally have been attached as in FIG. 24 in the LJT joining material during placement or the ball may have been attached with LJT joining material and come off the pad during reflow to add the LJT material.

Figure 27:
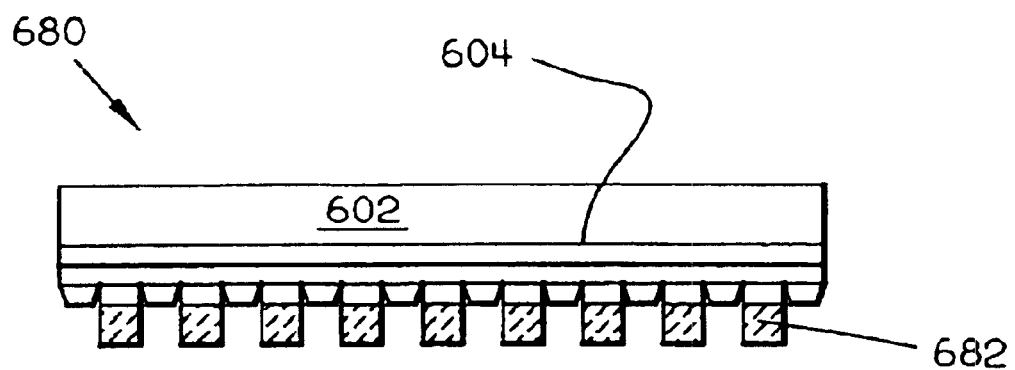
FIG. 27 illustrate another flip chip of the invention which includes circular or rectangular section bumps of uncured joining material.
Figure 28:
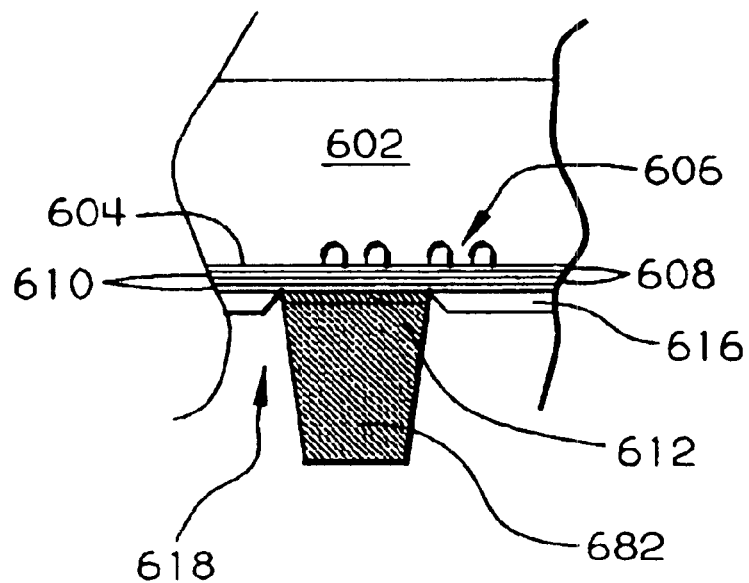
FIGS. 28–29 illustrate alternate specific embodiments of the flip chip of FIG. 27.

FIG. 27 illustrate another flip chip 680 of the invention which includes circular or rectangular section bumps 682 of uncured joining material. FIG. 28 illustrates a section of a specific embodiment of flip chip 680 with conical or pyramidal cross-section. As described above in reference to FIG. 22 the flip chip includes a substrate 602 with a semiconductor surface 604 having electronic devices 606; and two or more wiring layers 608 connected to the devices, separated by dielectric layers 610, and including multiple conductive metal pads 612 of high melting temperature, on the surface; and a passivation layer 616 coating the surface, with windows 618 at the pads. Bumps 682 of uncured paste have a joining temperature sufficiently lower than the melting temperature of the pads and lower than the maximum temperature of the electronic devices and passivation for solder reflow attachment without melting the pads or damaging the chip.

Bumps 682 may be a transient liquid phase (TLP) bond system of metal particles and carrier. Such TLP systems include particles of metals commonly used in solder alloys such as particles of essentially pure Pb, Cu, Ag, or Au or other about noble metal covered with a small percentage of essentially pure Sn, or mixed with a small percentage by weight of particles of essentially pure Sn which are preferably smaller than the noble metal particles. Where the different materials meet, eutectic mixtures of the materials grow and form connections between the particles. The carrier for a TLP system may be liquid such as water or alcohol or an uncured organic material such as a thermoset (preferably epoxy) or thermoplastic (preferably an adhesive) paste filled with conductive particles of a conductive metal such as Ag, Au or Cu to make it conductive. Alternatively the bumps may be an uncured conductive adhesive paste which contains a solvent preferably organic which must be evaporated (driven off) preferably by raising the temperature significantly above ambient.

Preferably, the uncured joining material is a solder paste of metal particles (alloy particles or mixtures of pure metal particles or a combination thereof) in a carrier such as a liquid (water or alcohol), and usually other ingredients, that form a molten solder alloy during reflow. For ceramic carriers preferably a HMT solder paste is used which includes the metal elements Pb and 2% to 15% Sn (by weight), more preferably 3% to 10% Sn. For organic substrates preferably a LJT solder paste is used with elements by weight of Pb and 40% to 90% Sn, more preferably 60% to 80%. Sn, most preferably around 67% Sn. Preferably, the solder paste includes a flux which results in a residue after reflow that can be removed by flushing with water (these are known as water-clean pastes), or more preferably the paste contains a flux such as adipic or citric acid that leaves only a small quantity of substantially inert residue (these are known as no-clean pastes) that does not have to be removed after reflow.

Figure 29:
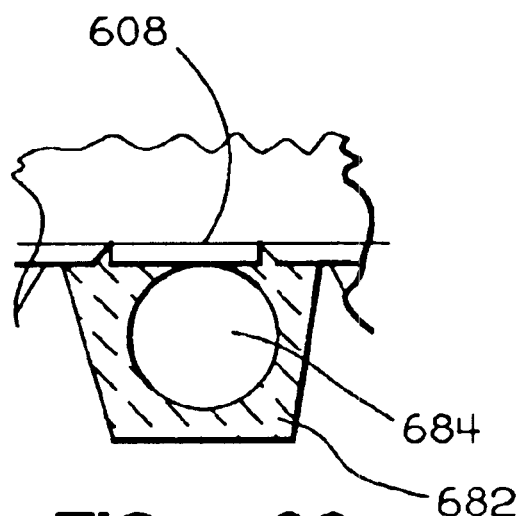

FIG. 29 shows an embodiment of bump 682 which includes a core 684 of HMT metal covered by uncured LJT joining material. The core may be a preform of HMT solder or a HMT bump formed as described above for bump 632. The uncured material may be partially cured to simplify handling or to permit separation from a screening stencil without the joining material slumping.

Figure 30:
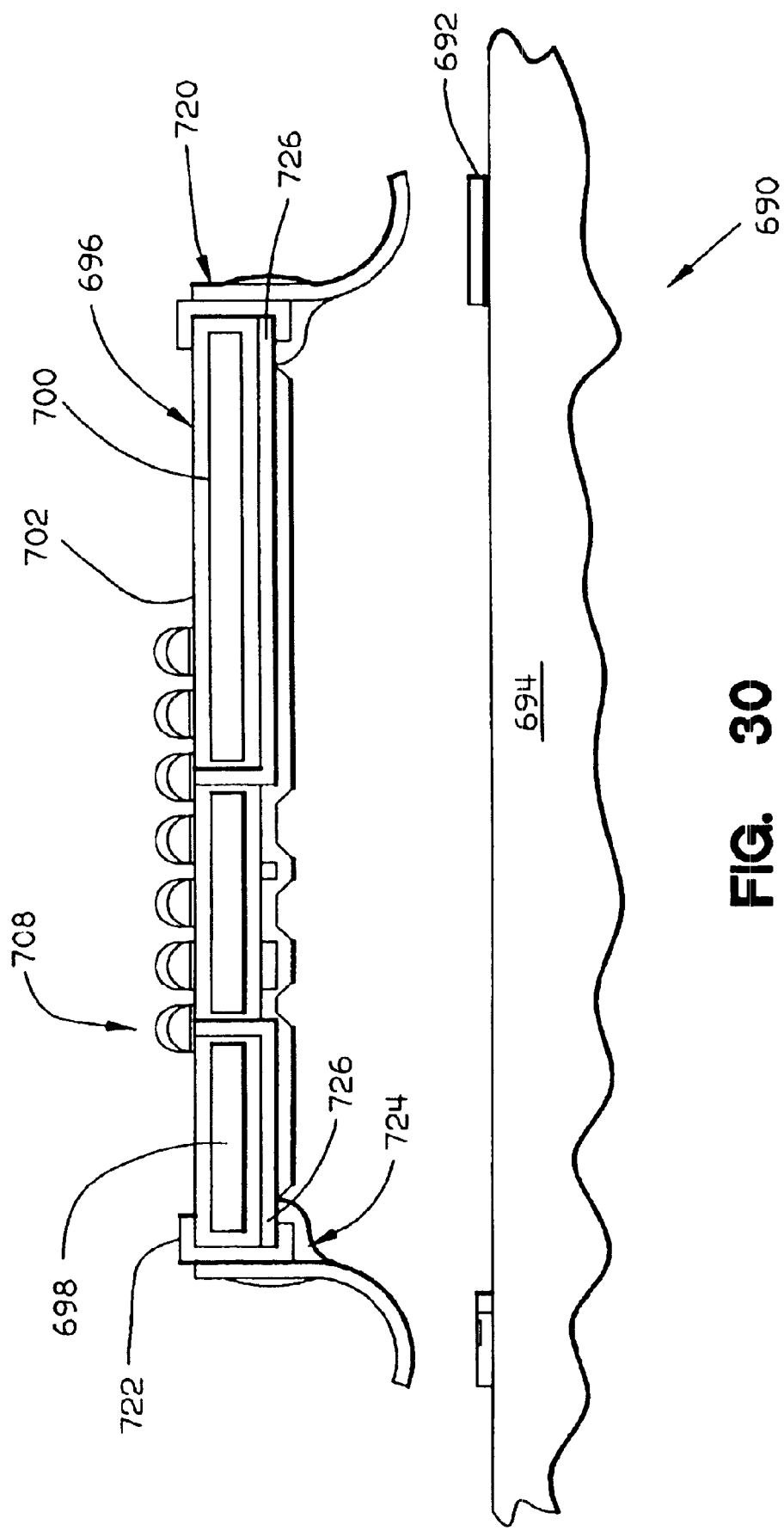
FIG. 30 portrays the flip-chip carrier of the invention for subsequent attachment to interconnectors of the circuit board, with bumps on top for chip attachment.

FIG. 30 portrays a flip-chip carrier 690 of the invention for subsequent attachment to interconnectors 692 of circuit board 694. Carrier substrate 696 includes a base 698 which may covered with a dielectric layer 700. The base may be a metallic such as INVAR, Cu-INVAR-CU, Al, or Cu which must be coated with dielectric before forming a wiring layer. The dielectric may be a coating of ceramic such as SiC or AlN, preferably with a dry deposited microstructure, or an organic such as a thermoset, thermoplastic, or preferably a wet spun or dry laminated film of polyimide. Preferably, the base is a ceramic such as beryllia, or preferably aluminum nitride, or more preferably alumina; or the base is a rigid or flexible organic substrates including a thermoset, thermoplastic, PTFE, or polyimide material. Rigid organic substrates are typically filled with dielectric fibers such as ceramic, glass, or PTFE, preferably woven to form a cloth which is coated with the organic resin. Flexible organic substrates include laminated structures of dielectric films such as polyimide which may be coated with metal preferably by sputtering, or they may be films of dielectric formed on copper film, or they may be a lamination of alternating layers of copper foil and dielectric film, preferably with a layer of adhesive between layers of film and foil.

Figure 31:
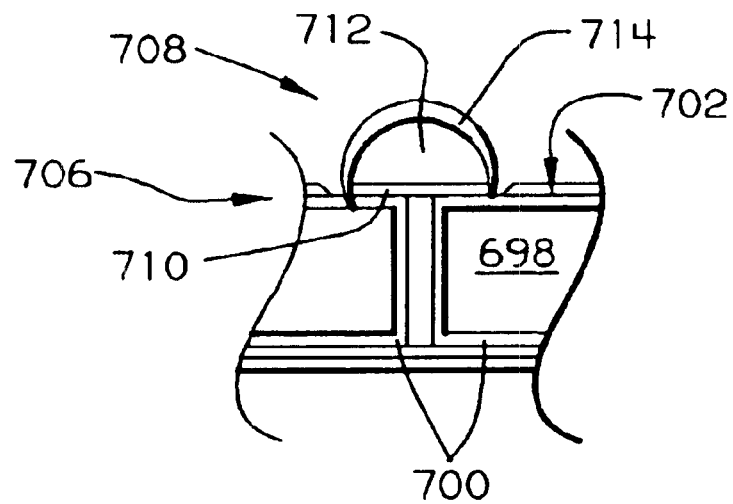
FIG. 31 illustrates an expanded view of one of the bumps of the module of FIG. 30.

FIG. 31 illustrates a small portion of the module of FIG. 30. The substrate; includes a dielectric chip bonding surface 702, with a wiring layer 706 the wiring layer may be a layer of metal with a microstructure indicating dry deposition such as an aluminum layer on ceramic or copper layer on ceramic or organic, preferably the wiring consists of a pattern of etched copper foil or copper deposited on the surface 702. The wiring pattern includes an array of chip couplers 708. The couplers preferably include flat metal pads 710 of the wiring layer 706 preferably copper; and bumps of HMT metal 712, preferably Pb solder with 3% to 10% Sn. Preferably, the HMT bump has a microstructure that indicates that it was formed from HMT solder paste and includes traces of residue of no-clean solder in the HMT bump or on its surface. The couplers preferably also include bumps 714 of LJT joining material extending on the pads or if provided, on the HMT bumps. The LJT material is preferably a metal solder, preferably Pb solder with 40% to 85% Sn.

In FIG. 30, terminals 720 extend from the carrier substrate for connection to interconnectors 692 of another substrate 694, and may have clips 722 for holding the terminal onto the carrier while joining material 724 is applied to connect the clip to pads 726 of the carrier.

FIG. 32 illustrates a flip chip module 730 of the invention which includes the carrier 732 similar to 690 described above in reference to FIGS. 31 and 32 and a flip chip 734 similar to chip 600 of FIGS. 21–26 or chip 680 of FIGS. 27–29. Joints 735 extend between carrier 732 and flip chip 734. The flip chip has connectors 736 including flat exposed pads 738 which are shown resting on HMT bumps 712 of couplers 708. Preferably, in the case of an organic carrier, an LJT joining material 740 attaches between the connectors and couplers to electrically and mechanically interconnect the chip to the carrier. The LJT material is the same as described above for material 634 for FIG. 22. Preferably (as best seen in FIG. 33), residue 742 of a no-clean flux is included in the reflowed solder paste or on the surfaces of bottom of the chip, or the top of the carrier or on the LJT solder.

The chip is preferably encapsulated with an organic material 744 preferably epoxy filled with dielectric particles 746 such as a ceramic or glass, selected to reduce fatigue in the joints 735.

Figure 33:
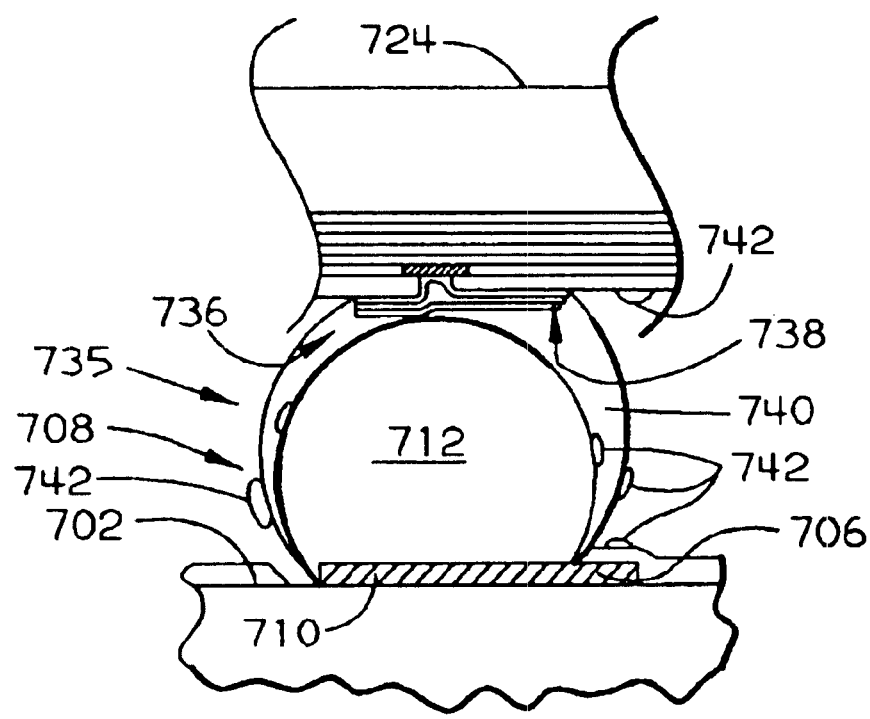
FIG. 33 shows a detailed view of one of the joints between the flip-chip and module of FIG. 32.
Figure 32:
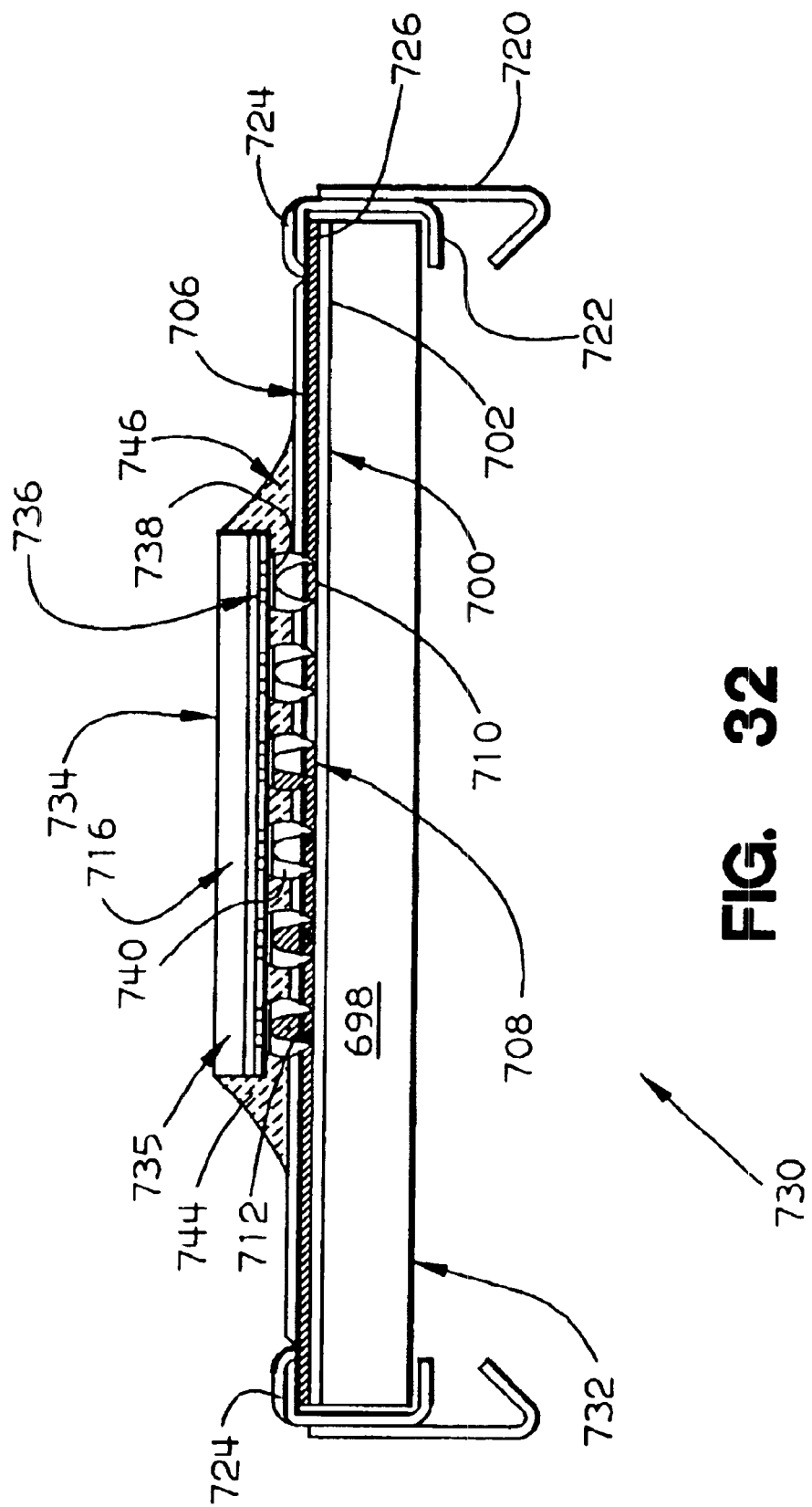
FIG. 32 illustrates a module of the invention with a flip-clip attached with joints of joining material.

FIG. 33 shows a detailed view of one of the joints 735 between the flip-chip and flip chip module of FIG. 32.

Figure 34:
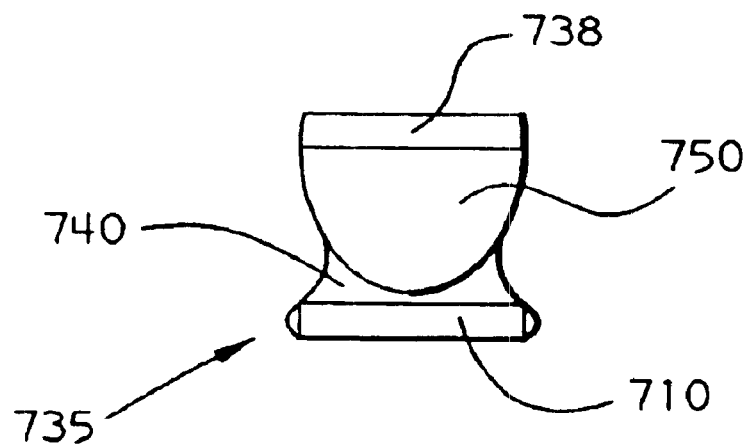
FIGS. 34–37 show alternate embodiments of the joint for FIG. 33.
Figure 35:
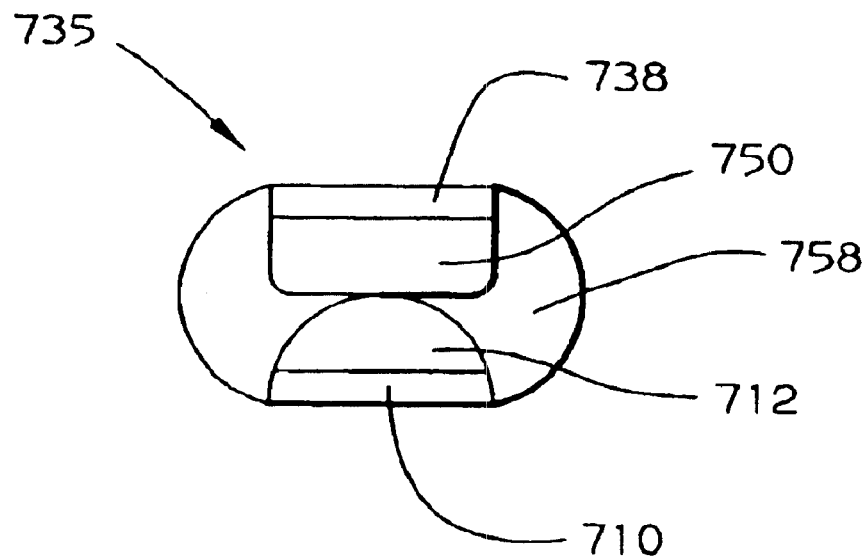
Figure 36:
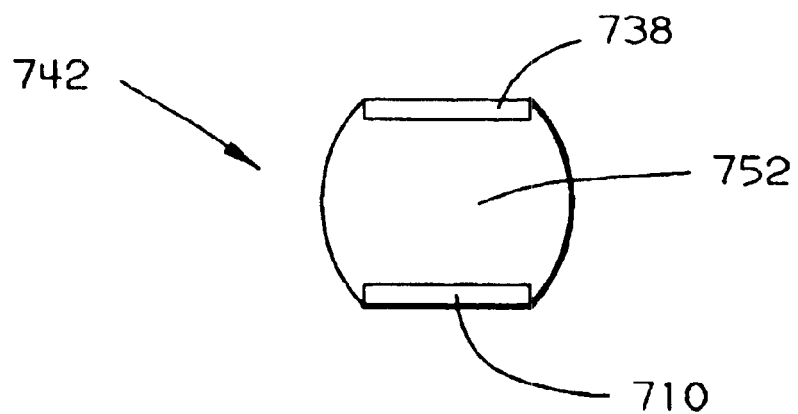
Figure 37:
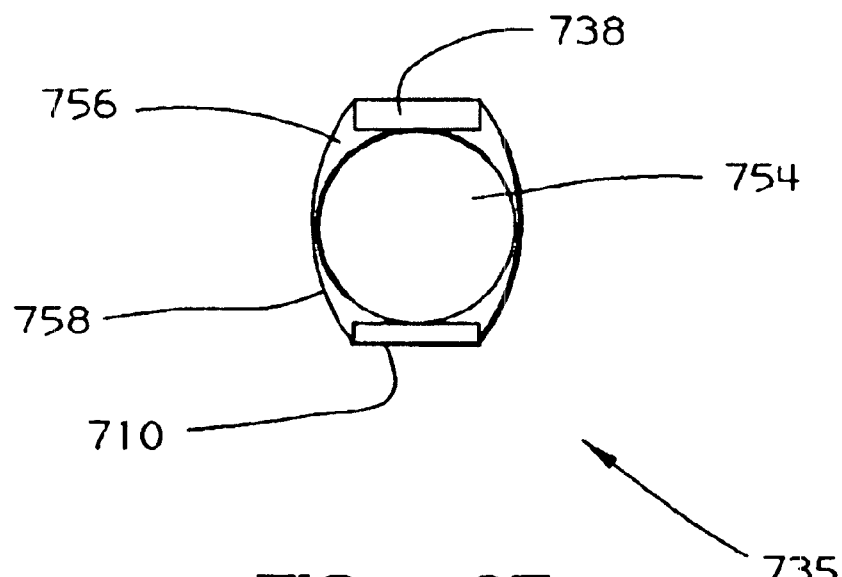

FIG. 34 depicts another embodiment of joint 735 in which connector 636 includes HMT bump 750 on flat pad 738, and is joined to flat pad 710 of coupler 708 by a small quantity of cured LJT joining material 740. FIG. 35 shows another embodiment of joint 735 with HMT bumps 712, 750 connected to the connector pad 738 of the chip and coupler pad 710 of the carrier respectively. Preferably, the bumps on either of the coupler pad or on the carrier (as shown) are flattened to reduce the tendency of curved surfaces biasing the chip out of place before reflow. The bumps are connected together by LJT material 758. Preferably, one or both of the HMT bumps exhibit the microstructure of a cured joining material and the LJT joining material exhibits the microstructure of a cured joining material. FIG. 36 portrays another embodiment of joint 735 with a cured HMT or LJT joining material 752 extending from a flat connector pad 738 of the chip to a flat coupler pad 710 of the carrier. For a ceramic substrate or metal coated with ceramic the joining material 752 is preferably an HMT solder; and for an organic or metal coated with organic the joining material is preferably LJT solder. FIG. 37 illustrates another embodiment of joint 735 containing a preform 754 of HMT metal preferably a sphere such as Cu, Cu covered with HMT solder, or preferably HMT solder. Cured LJT solders 756 and 758 connect the preform to the connector pad 738 and coupling pad 710 respectively. Preferably, the joining materials 756, 758 each have about the same reflow temperature and more preferably the same composition. Preferably, the joints 756 and 758 are molten at the same time so that the ball floats in a plane about parallel to pads 710,738, to a central position between the pads 710 and 738 to form a symmetrical joint which minimizes fatigue.

Figure 38A:
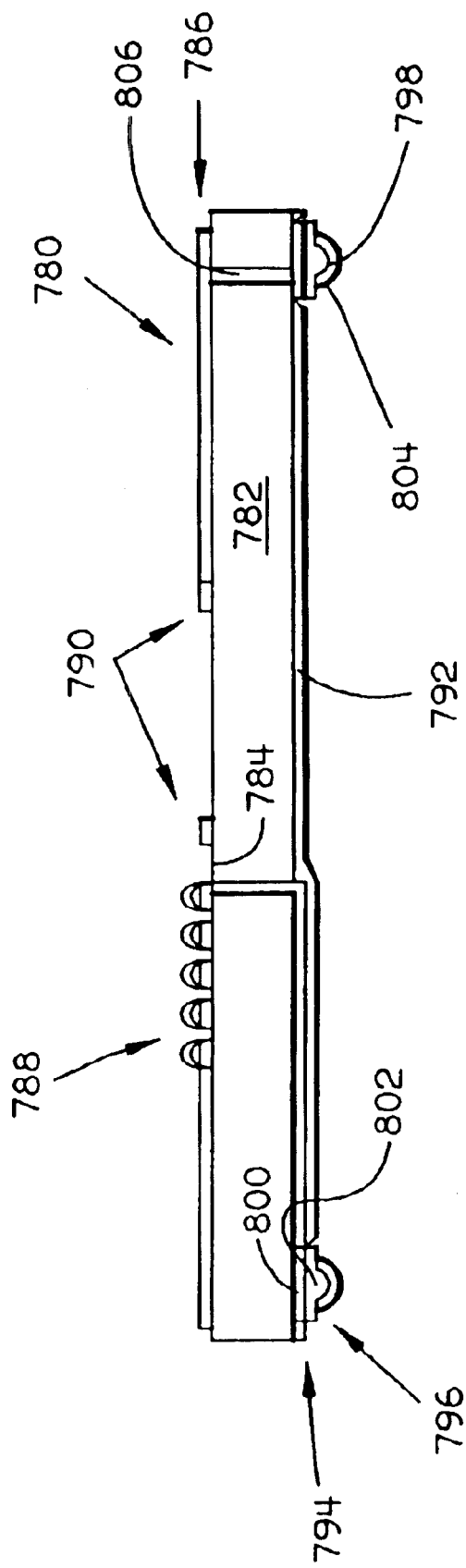
FIG. 38a shows a carrier of the invention with peripheral bumps for subsequent placement onto an interconnect structure.
Figure 38:
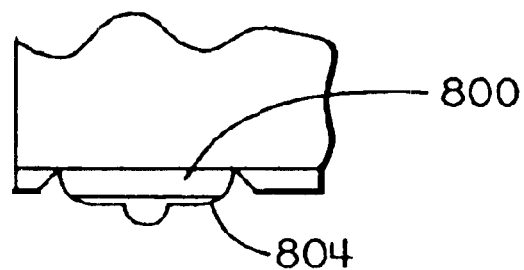

FIG. 38(*a*) shows a bumped carrier 780 for subsequent placement onto an interconnect structure. Attachment substrate 782 includes chip bonding surface 784 with a bonding wiring layer 786 including one or more arrays of chip couplers 788, 790 for respective chips. The attachment substrate may be an organic, ceramic, or metal based substrate as previously discussed for substrate base 698. The carrier also includes attachment surface 792 with attachment wiring layer 794 including metal connectors 796 extend from the attachment surface to distal ends 798. The connectors include flat pads 800 of copper and preferably for ceramic or ceramic coated metal substrates include HMT bumps 802. The connectors may have a rectangular c-ross section or a round cross section. A LJT joining material 804 extends on the distal end of the connectors.

The chip bonding surface and attachment surface can be on the same side of the attachment substrate or on opposite sides as shown. Where they are on opposite sides, vias 806 are holes through the substrate filled with conductive material which electrically connect between bonding wiring layer 786 and attachment wiring layer 794.

Figure 39:
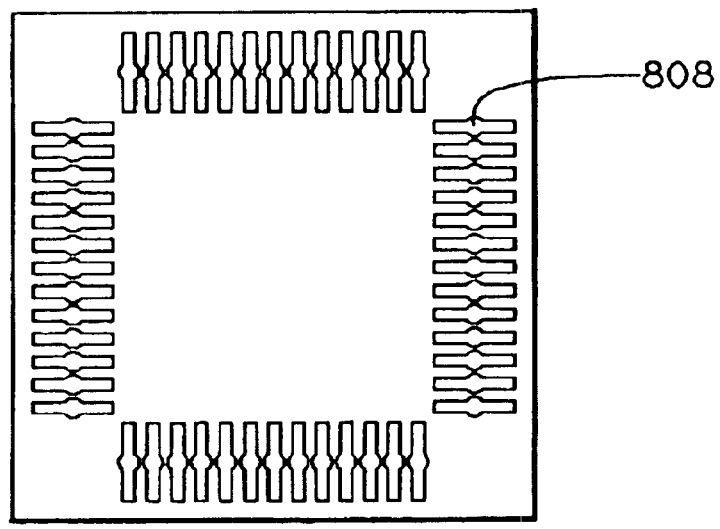

In one specific embodiment of the bumped carrier the array or couplers of rectangular cross section is arranged as shown in FIG. 38(*b*) and FIG. 39 which preferably is a mirror image of the configuration of interconnectors on a circuit board for surface mount connection of a quad flat pack. Preferably, oblong bumps 808 of LJT solder are formed about in the middle of pads 800 by providing a critical quantity of LJT solder on the pads which is best determined by experimentation.

Figure 40:
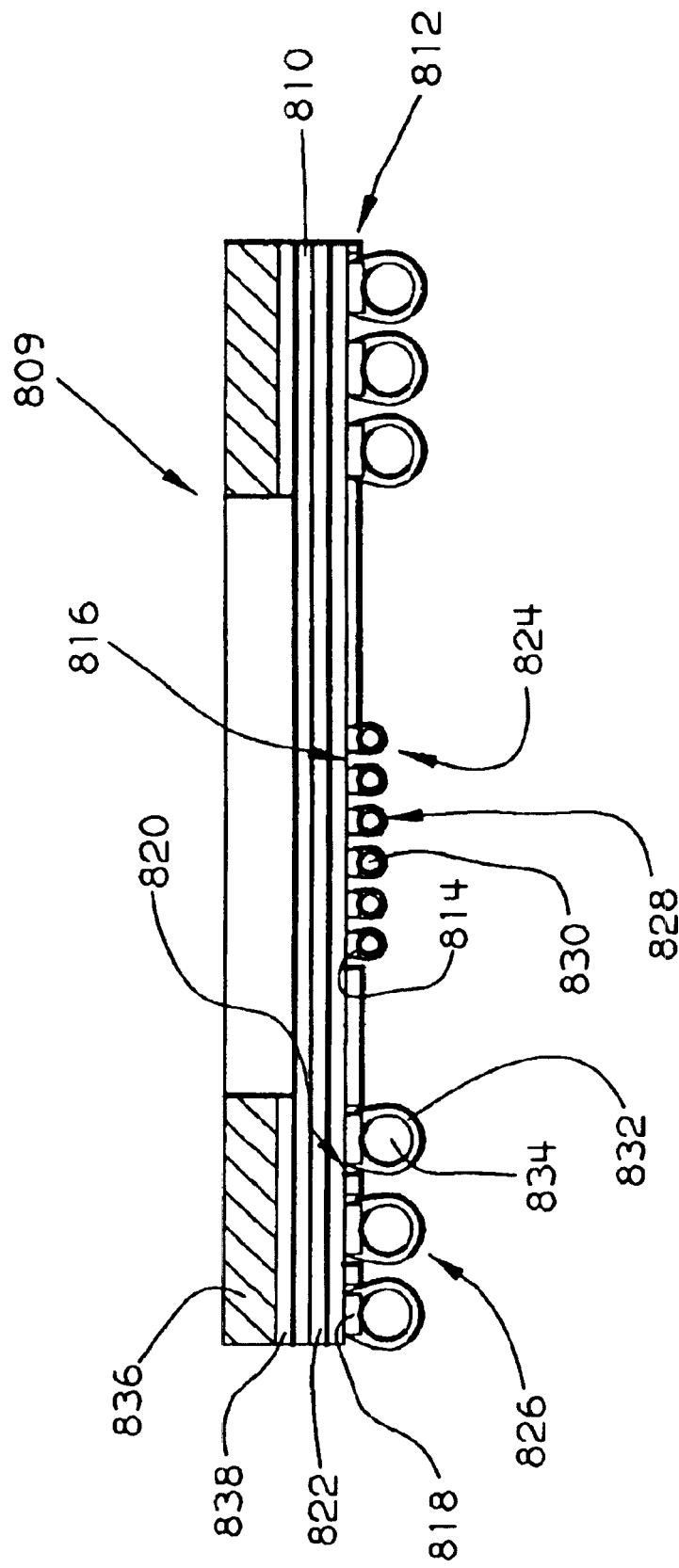
FIG. 40 hows another specific embodiment of a bumped carrier of the invention, similar to FIG. 38 a but with multiple rows of bumps and bottom chip attach.

FIG. 40 shows another specific embodiment of a bumped carrier 809 of the invention with a flexible substrate of organic film 810 and a metal film 812 including coupling pads 814 on a coupling surface 816 of the dielectric film and connection pads 818 on a connection surface 820 of the dielectric film. The metal film may be dry deposited on the organic film (e.g. by sputtering) or may be a patterned metal foil laminated to the organic film directly or by using an adhesive layer 822. Preferably, the metal foil is copper foil and the dielectric layer is a dry layer of polyimide and they are laminated with a dry layer of stay stick adhesive. Couplers 824 include pads 814, hemispherical bumps of LJT solder 828 and may include spherical preforms 830. Similarly, connectors 826 include pads 818, hemispherical bumps of LJT solder 832 and may include spherical preforms 834. A metal frame 836 such as copper (which may be coated with nickel) or aluminum which may be coated by anodizing or chromate conversion is laminated to the dielectric film at the connection surface to hold connectors 826 in a flat plane. An adhesive layer 838 preferably a dry adhesive may be provided if required for lamination.

Figure 41:
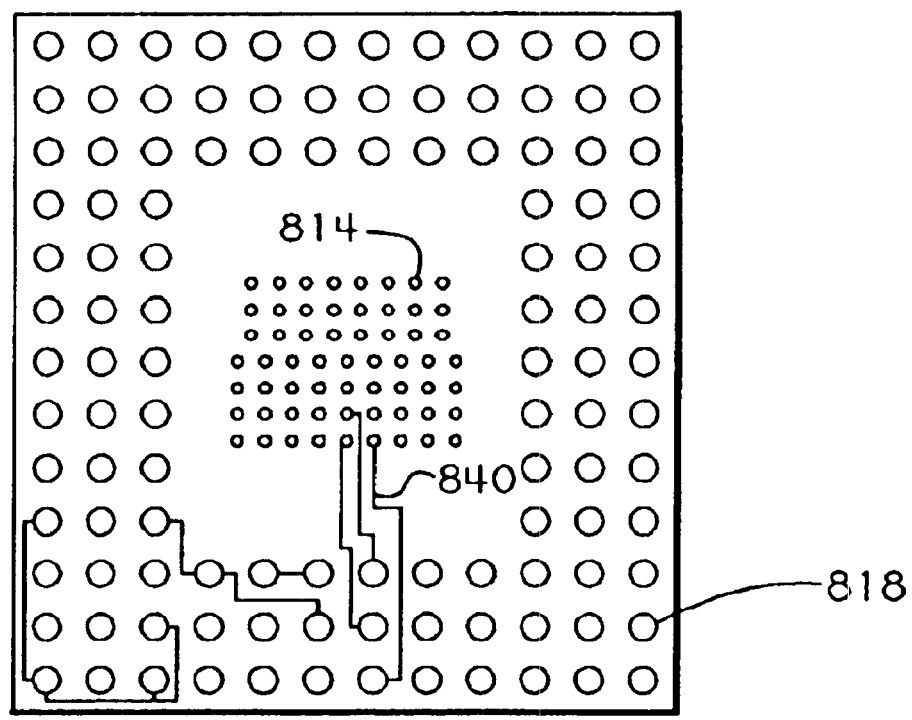
FIG. 41 shows the arrangement of bottom pads and of the bottom wiring layer of the specific embodiment of FIG. 40.

FIG. 41 shows the arrangement of bottom pads 814 and 818 of wiring layer 812 with only a few of the multitude of wires 840 interconnecting between pads 814 and 816 shown.

Figure 42:
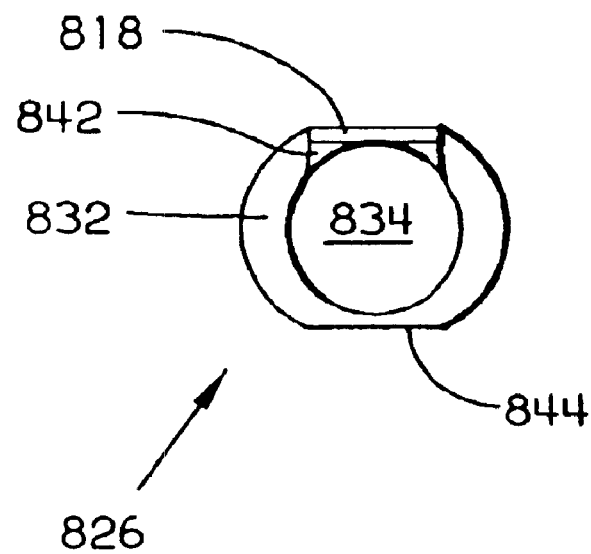
FIGS. 42–45 shows various specific embodiments of connectors on the bottom of the carrier of FIG. 40.
Figure 43:
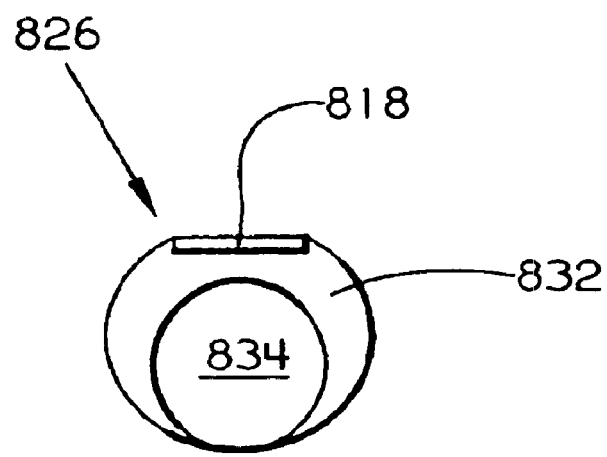
Figure 44:
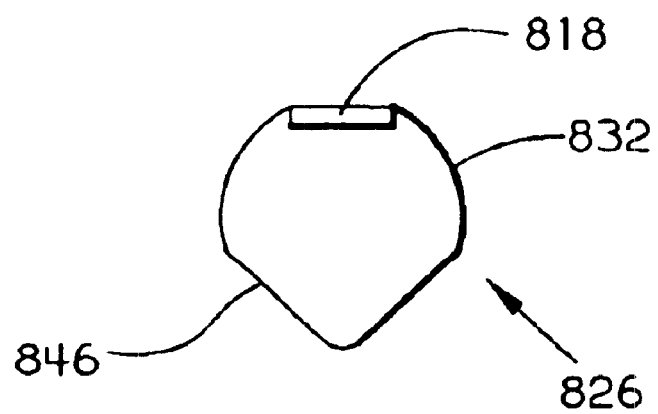
Figure 45:
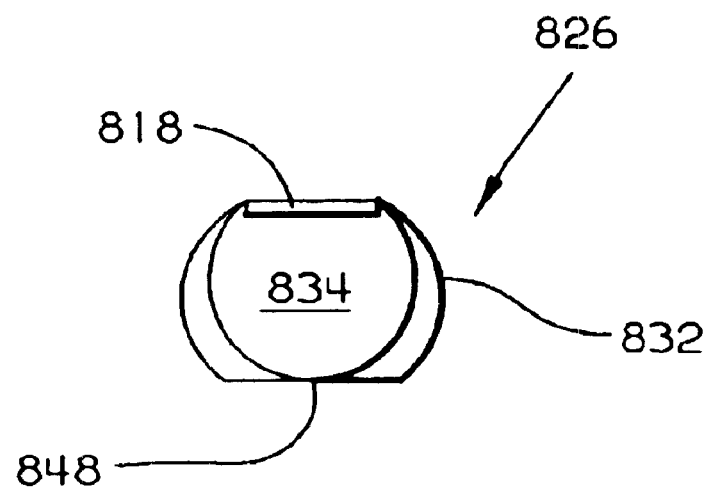

FIGS. 42–45 shows various specific embodiments of connectors 826 of FIG. 40. FIG. 42 shows preform 834 connected to pad 818 with solder 842. Preferably, solder 842 has an intermediate melting temperature between a solder of preform 834 and a solder of 832, preferably this is accomplished by providing a eutectic Pb/Sn solder for 842 and a high Pb solder for ball 834 and during reflow to connect the ball to the pad the temperature is held at a high value to dissolve additional Pb into solder 842 to raise its melting temperature (liquidus). The connector may be flattened by pressing a hard metal plate against the connector to form an about flat region 844 at the distal end of the connector. FIG. 43 shows a version where the preform floats free in the LJT material. FIG. 44 shows a connector without any HMT preform and with an exterior portion 846 of the LJT, shaped by cooling in contact with conical or pyramidal walls of holes of a transfer substrate. FIG. 45 shows the HMT preform reflowed or welded or hot contact connected to pad 818 and LJT material 832 with a flat bottom formed by cooling in contact with the flat bottom wall of a hole in a transfer substrate.

Figure 46:
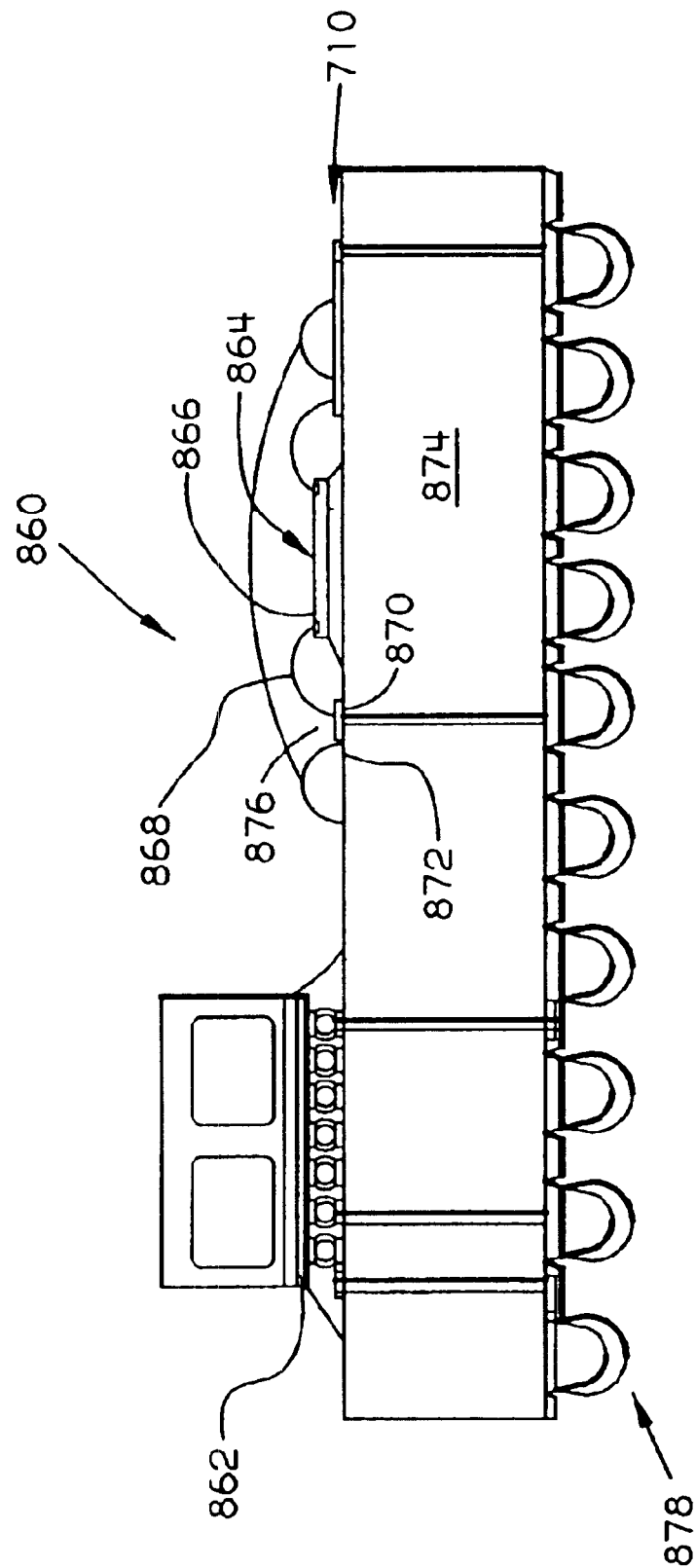
FIG. 46 illustrates the bumped module of the invention.

FIG. 46 illustrates a bumped module 860 of the invention. Such module include the bumped carriers 780 and 809 of FIGS. 38 and 40 respectively, with either one or more flip chips 862 and/or one or more wire bond chips 864 connected to the carrier.

The flip chip may be connected using dry deposited, preformed, injected, or electroplated solder, or reflowing solder squeegee into holes in a photo resist coating on an attachment surface; or more preferably by the hot transfer method of the invention that results in the joint microstructure of reflowed solder paste and traces of no-clean residue as previously discussed.

Wire bond chip 864 includes peripheral rows of wire bond pads 866 which are similar to the aluminum wiring pad 614 in FIG. 22 except usually much larger. A bond wire 868 (such as aluminum) extends between each wire bond pad of the chip and a corresponding wire bond pad 870 on an coupling surface 872 of an attachment substrate 874. Preferably, the wire bond chip, bond wires, and coupling pads are encapsulated with an organic material 876.

Figure 48:
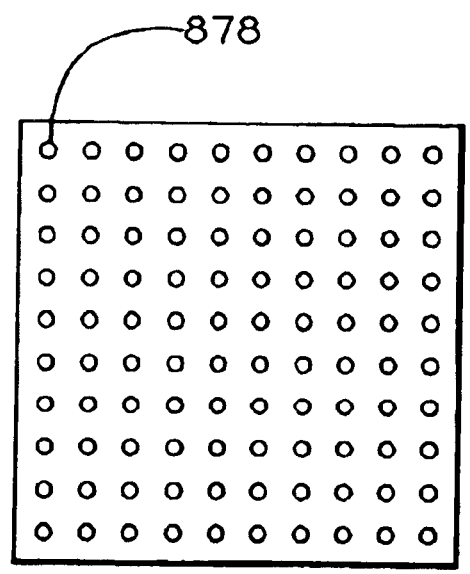
FIG. 48 shows a filled grid array of connectors on the bottom surface of the carrier or module of FIGS. 40 and 46.
Figure 47:
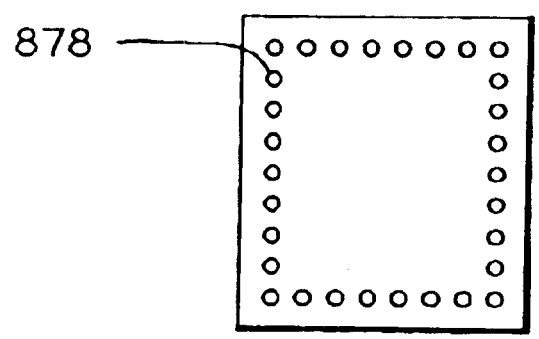
FIG. 47 shows a peripheral row of connectors along each edge a bottom surface of the carrier or module of FIGS. 40 and 46.

FIGS. 47 and 48 illustrate other embodiments of the arrangement of connectors 878 on the bottom surface of the carriers or modules of the invention. The couplers could be any of the embodiments shown in FIGS. 38, 40, or 42–45 or combinations of such embodiments. FIG. 47 shows a peripheral row of connectors along each edge of a bottom surface of the carrier or module. FIG. 48 shows a filled grid array of connectors on the bottom surface of the carrier or module.

Figure 49:
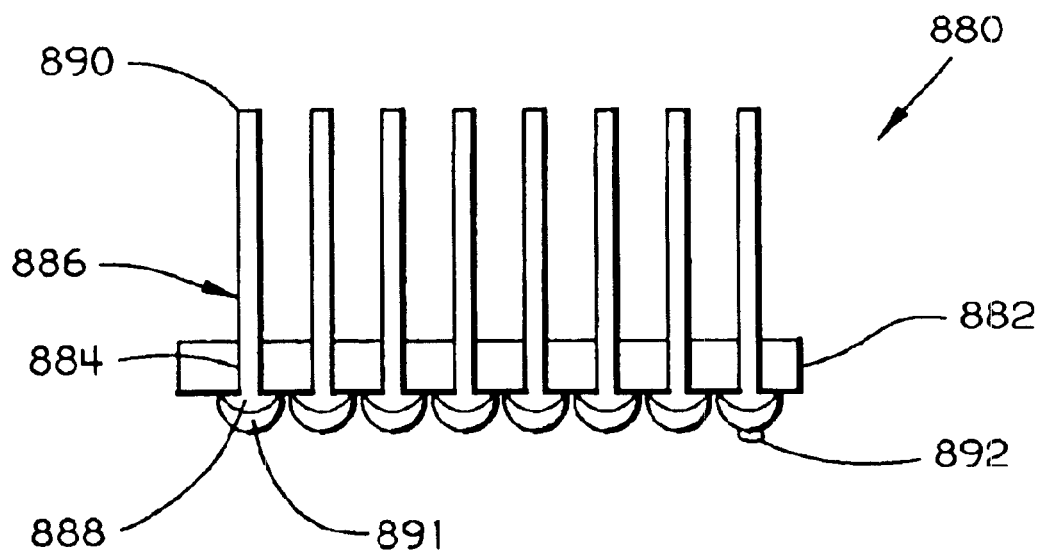
FIG. 49 sows the pin header of the invention.

FIG. 49 shows a pin header 880 of the invention. A substrate which is preferably ceramic or rigid organic has through holes 884 which are preferably round. Pins 906 which are preferably round copper wires which have been hot or cold swaged to form heads at a connection end 888, extend from the connection end through the holes and out from the substrate to a distal ends 890 of the pins. A hemisphere of joining material 891 connected to the connection end of the pins. The joining material may be uncured including partially cured to allow a stencil to be removed without damaging the deposit. The uncured material may be solder paste especially about Pb/Sn eutectic solder. Preferably, the joining material is reflowed LJT solder, preferably of Pb and 35% to 85% Sn, more preferably 55% to 75% Sn. Preferably, a residue 892 of a no-clean flux is included on or in the reflowed solder paste or on the bottom surfaces of substrate; and the microstructure of the joining material indicates that it was produced by reflowing solder paste.

Figure 50:
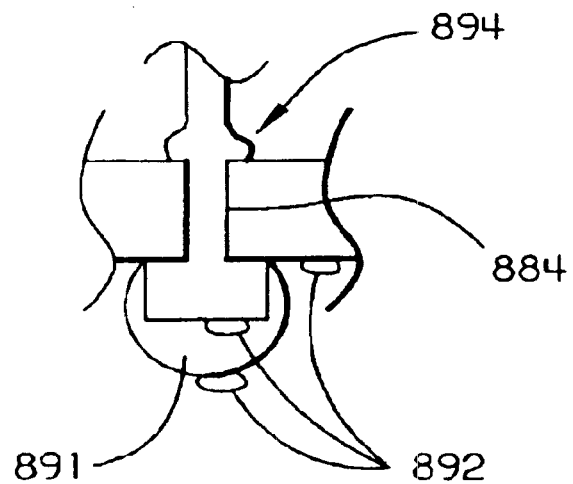
FIG. 50 shows an alternate embodiment of the pin head of the pin-header of FIG. 49 in which the pin head is cylindrical.

FIG. 50 shows another embodiment of the pin head of the pin-header of FIG. 49 in which pin heads 893 are cylindrical. The pin in this embodiment has a thickened portion 894 to hold the pin in position so the pin does not have to be bonded or force fit into the hole 804.

Figure 51:
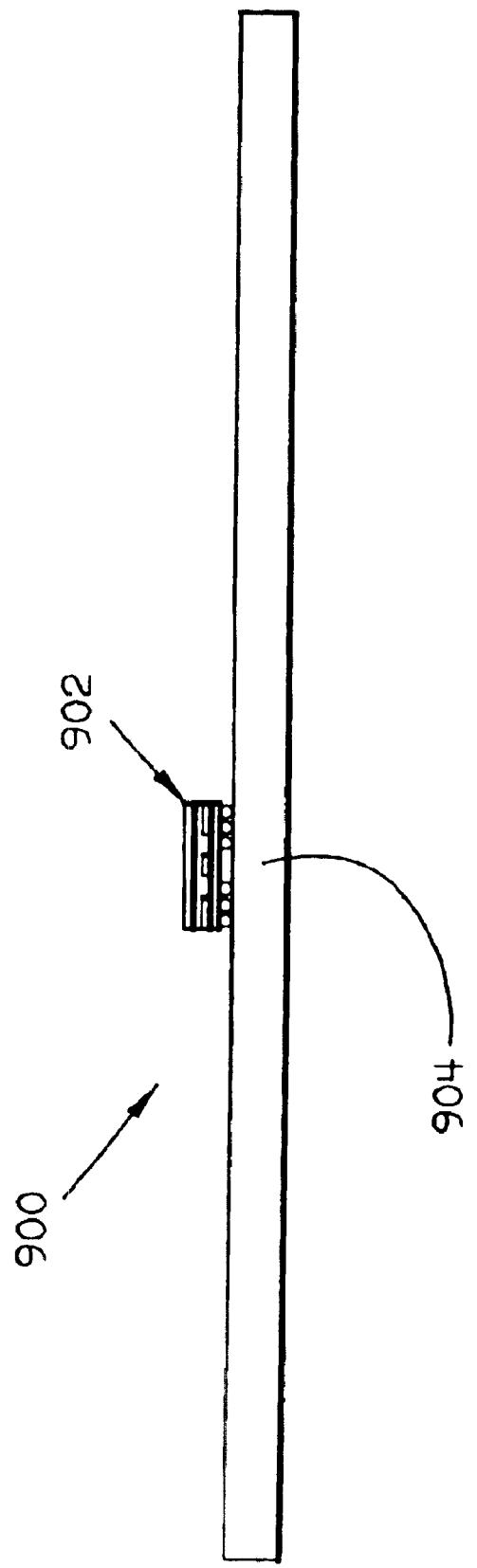
FIG. 51 shows an interconnect structure of the invention in which a chip carrier module is connected to a circuit board.
Figure 52:
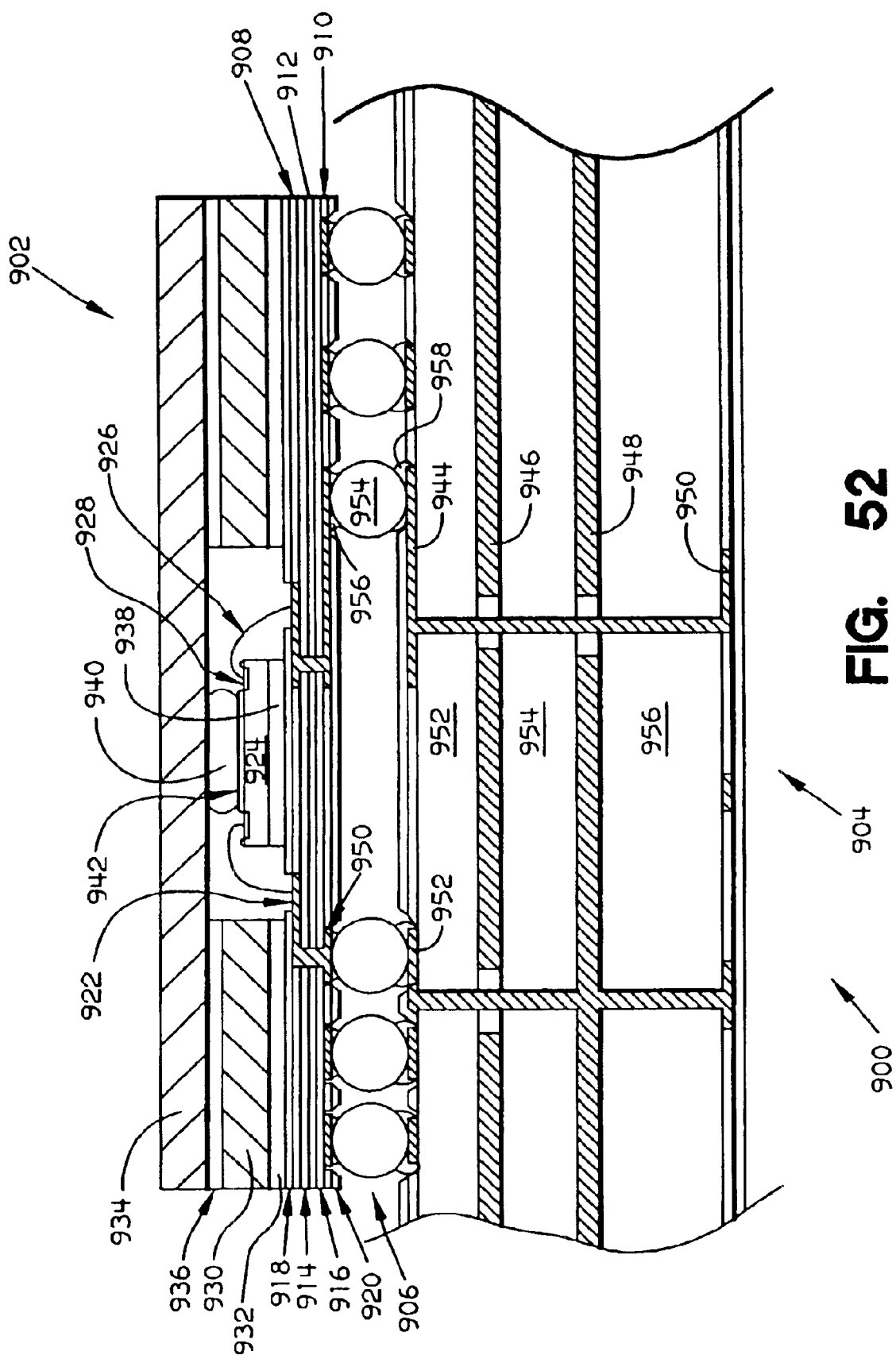
FIG. 52 shows a partial section of the interconnect structure of FIG. 51, with joints connecting between the module and the board.

FIG. 51 shows an interconnect structure 900 of the invention in which the chip carrier module 902 is connected to a circuit board 904. FIG. 52 shows a more detailed portion of the interconnect structure with joints 906 connecting between the module and the board. The module includes a flexible carrier substrate of two layers 908, 910 of patterned copper foil, laminated to a layer 912 of polyimide film by layers 914 and 916 of dry adhesive film. The exterior of the metal foil and exposed adhesive is coated with a wet application of dielectric 918, 920 such as solder resist. Alternatively, one or both of the layers 908, 909 of copper are dry deposited onto layer 912 of polyimide without any adhesive or one of the layers of copper is deposited onto polyimide layer 912 and the other layer of copper is laminated (by heat and pressure) onto another dry layer of polyimide which replaces one of the wet applied dielectric layers 918, 920. Also, dry polyimide film may be used in place of wet applied polyimide for one or both of layers 908, 920. Wiring layer 918 includes connection pads 922 (preferably copper) for wire bonding the chip 924 onto the carrier to form module 902. Wire bond wires 926 extend between pads 922 and chip wire bond pads 928, preferably aluminum. Frame 930 is laminated to the carrier substrate using adhesive 932 and holds the connection pads in a horizontal plane. Discussion of frame 836 and adhesive 838 of FIG. 40 is generally applicable to frame 930. Heat sink 934 is attached to the frame by adhesive 936. The chip is bonded to the flexible substrate by adhesive 938 and thermal conductor 940 extends between the heat spreader 934 and passivation layer 942 protecting electronic components of the chip.

Interconnect substrate 904 includes at least one and more preferably two or more wiring layers 944, 946, 948, and 950 with each adjacent pair of wiring layers being separated by a dielectric layer 952, 954, and 956. Interconnect substrate 904 may be a rigid or flexible organic substrate and may include dielectric layers of thermoset, thermoplastic, PTFE, or polyimide. A flexible organic substrate embodiment may be a laminated structures of one or more dielectric films such as polyimide which may be coated with metal preferably by sputtering, or they may be dielectric coatings formed on copper foil, or they may be a lamination of alternating layers of copper foil and dry dielectric film, preferably with a layer of adhesive between layers of film and foil. A rigid organic substrate as shown, includes layers of patterned copper foil or deposited copper separated by rigid dielectric layers filled with dielectric reinforcing fibers such as ceramic, glass, or PTFE, preferably woven to form a cloth which is coated with the organic resin. The interconnect substrate whether rigid or flexible, may include multiple layers of metal wiring.

Joints 906 include pads 950 of wiring layer 910 and pads 952 of wiring layer 944. A spherical preform 954 of HMT metal separates the pads by a predefined distance, and deposits of LJT joining material 956, 958 electrically and mechanically-connects the preform to pads 950, 952 respectively.

Figure 53:
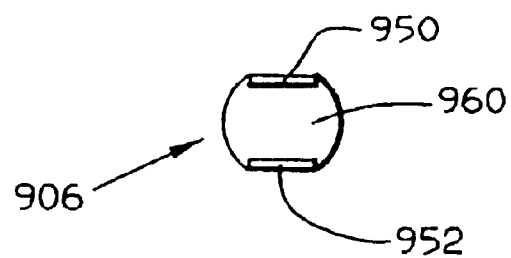
FIG. 53 shows an alternate embodiment of a joint of FIG. 52 between the module and board.

FIG. 53 shows an alternative embodiment of joint 906 in which a joining material 960 extends between pads 950 and 952. If either the carrier substrate or interconnect substrate is organic or metal coated with organic then preferably the joining material is an LJT material. Otherwise, preferably material 960 is an HMT metal.

Figure 54:
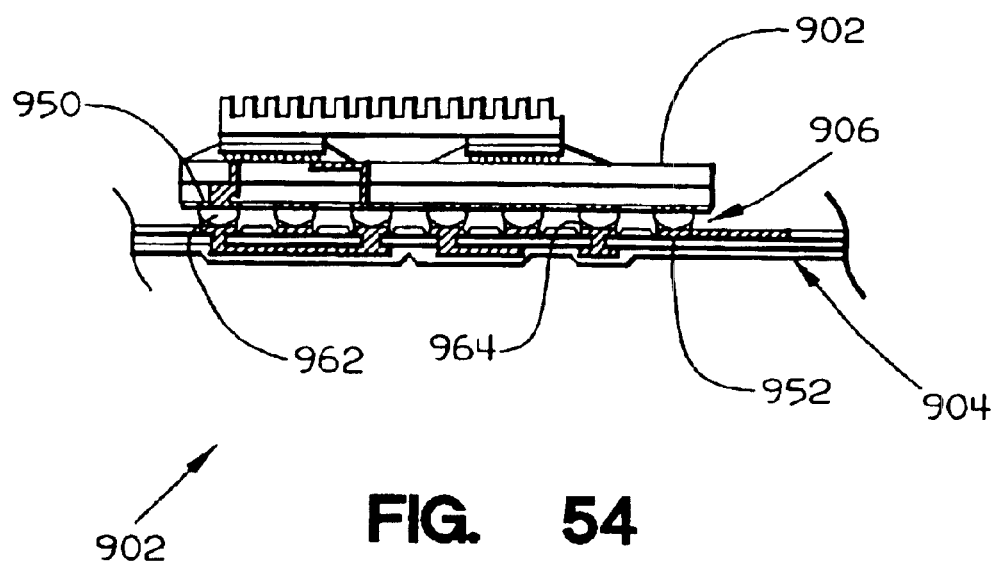
FIG. 54 shows another alternative embodiment of the structure FIG. 51, in which the the module is a multi-chip multi-layer ceramic module and the circuit board interconnect structure is a flexible organic substrate with two layers of metal.

FIG. 54 shows another alternative embodiment in which the module 902 is a multi-chip multi-layer ceramic module and interconnect structure 904 is a flexible organic substrate with two layers of metal. In this case the joints may include hemispherical reflowed HMT solder bumps 962 on pads 950. LJT joining material 964 extends between bumps 962 and pads 952.

Figure 55:
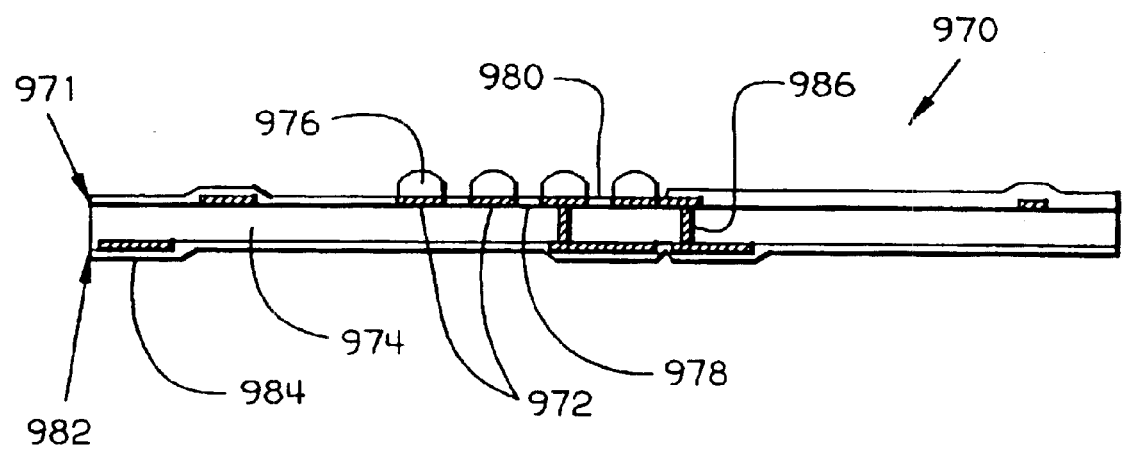
FIG. 55 illustrates the interconnect structure of the invention with a wiring layer including HMT metal pads on a substrate.

FIG. 55 illustrates the interconnect structure 970 of the invention with a wiring layer 971 including HMT metal pads 972 on a substrate 974. The discussion of interconnect substrate 904 with respect to FIGS. 52 and 54, generally applied to substrate 974. Most preferably substrate 974 includes woven fiberglass filled with organic thermoset such as epoxy. A plurality of pads 972 (preferably copper) are covered by bumps of LJT joining material 976 which is preferably solder paste which has been reflowed. Preferably, the bump is about eutectic 37%/63% Pb/Sn solder alloy and preferably residue of the no-clean flux is in the solder or on the bump or on the surface of the board 978 or on a coating of solder resist 980 that covers wiring layer 971 and has windows for the pads 972. A second wiring layer 982 on the opposite side of substrate 974 is covered by a second layer of solder resist 984. Conductive vias 986 extend between the wiring layers to connect between the pads and the second wiring layer.

Figure 56:
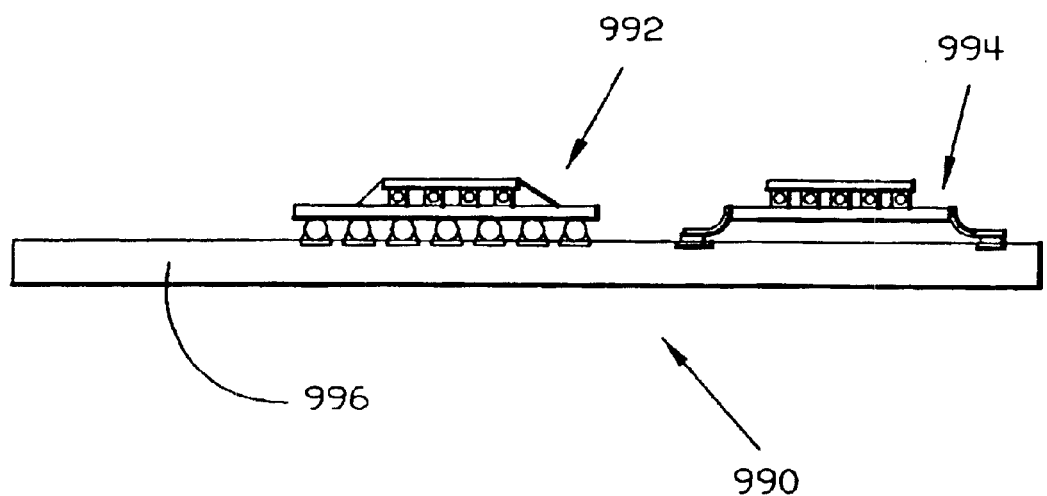
FIG. 56 shows a specific embodiment of the interconnect connect assembly of the invention.

FIG. 56 shows a specific embodiment of the interconnect assembly 990 of the invention. Modules 992 and/or 994 are connected to interconnect substrate 970 to form the assembly. The substrate is similar to substrate 904 described for FIG. 52. One or more of the modules include flip chips connected to a carrier as described above for module 730 in FIG. 32. The joints between the flip chips and the modules includes solder with a microstructure indicating that the solder is reflowed solder paste. There may be a residue of no-clean flux on the bottom of the flip chips, on the top of the modules or within or on the joints.

Figure 57:
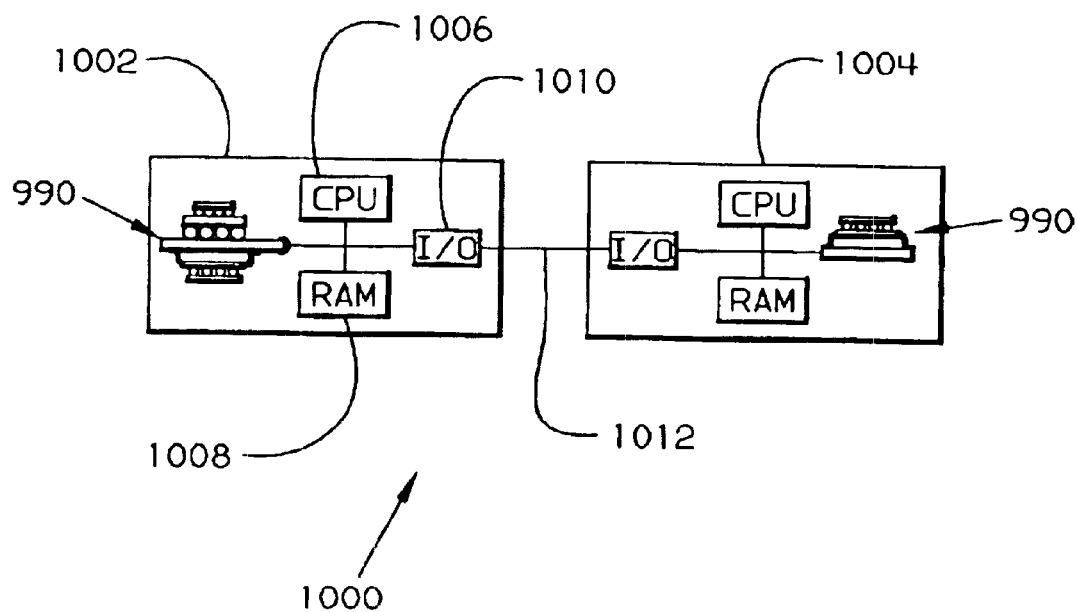
FIG. 57 illustrates the information handling system of the invent which one or more nodes may be interconnected a network.

FIG. 57 illustrates the information handling system 1000 of the invention in which one or more nodes 1002,1004 may be interconnected in a network. One of more of the nodes include a central processing unit (CPU) 1006, communicating with RAM 1008 for directing the processing of the CPU and communicating with an input and output processor (I/O) 1010. The communication between nodes may be by cable 1012 (electric or optical) or may be by sound or broadcast electromagnetic waves. The CPU also communicates with an interconnect assembly 990 of the invention to provide a high reliability high speed system.

Figure 58:
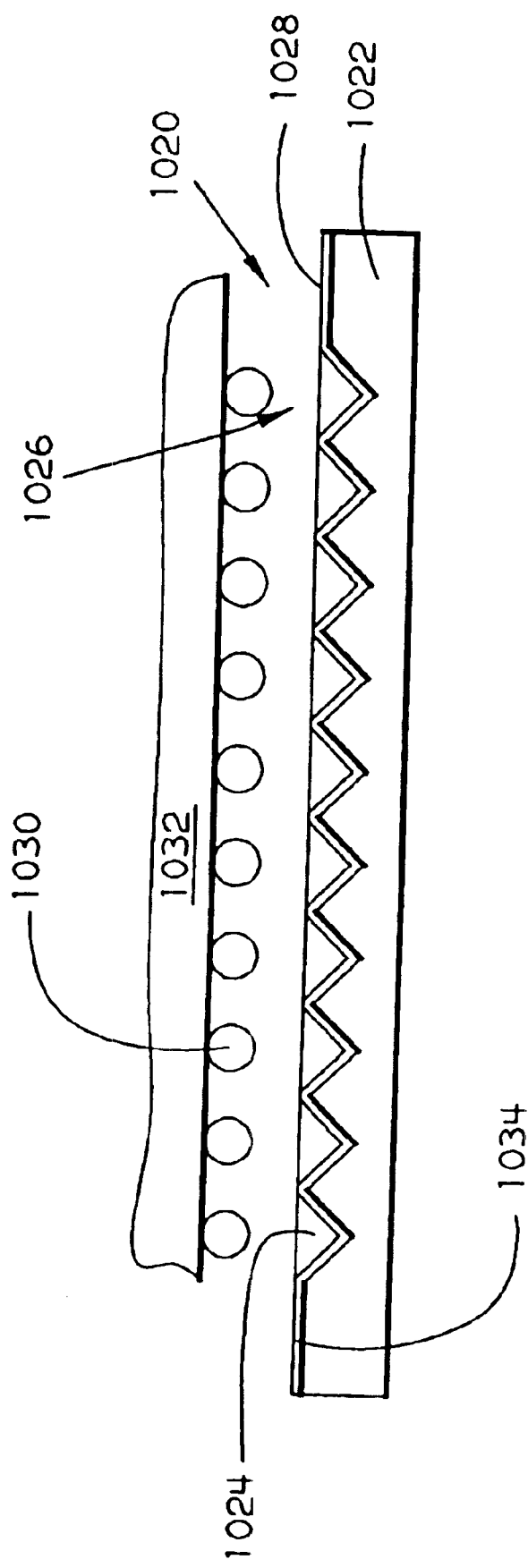
FIG. 58 illustrates a specific embodiment of the joining material holder of the invention.

FIG. 58 illustrates a specific embodiment of the joining material holder 1020 of the invention. The material of holder base 1022 remains rigid at the joining temperature of joining material 1024. HMT materials have joining temperatures that are too high for common organic materials typically above 230° C. For HMT joining materials a base of metal or ceramic is preferred. For LJT joining materials the base may include an organic material. Holes 1026 are formed in a transfer surface 1028 on one side of the material holder. The joining material does not significantly adhere to walls of the holes and preferably also not to the transfer surface, when heated to the joining temperature, or to holes 1028 or to the walls of holes in the transfer surface. The holes are in a mirror image arrangement to the arrangement of terminals 1030 of a component 1032 in order to transfer the joining material to the terminals of the component.

The base may be of a material to which the joining material inherently does not significantly adhere or the walls of the holes and preferably also the transfer surface may have a coating 1034 of a material to which joining material 1024 does not significantly adhere. Also the surfaces (of the holes and attachment surface) may be treated to reduce adhesion by applying a lubricant or releasing material such as the releasing materials used in casting and molding of respective materials. Alternately, these surfaces may be treated by micro-etching.

For joining materials of HMT solder the base material of the transfer substrate is preferably titanium, molybdenum, or nickel (Which has been oxidized), stainless steel, or more preferably high chromium stainless steel or a ceramic such as SiC or AlN to which molten solder does not wet. Alternately a coated substrate may be used with a base of iron, INVAR, Cu-INVAR-Cu or more preferably for transfer to a silicon attachment substrate, a silicon transfer substrate. These materials may be coated by another metal or ceramic to which molten solder does not significantly wet and which can be reliably deposited on the base material preferably by dry deposition preferably sputtering. Such materials include chromium, molybdenum, titanium, tungsten, nickel (which has been subsequently oxidized) and combinations thereof and preferably ceramics such as titanium nitride.

For LJT materials such as conductive adhesives or eutectic Sn/Pb solder, or TLP systems, organic substrates such as epoxy filled with woven fiberglass or polyimide substrates are preferred. Also for LJT materials, organic coatings such as organic solder resist may be used over a metal or organic base for such LJT materials. For example, to apply LJT material to flip chips a silicon base may be coated with polyimide and holes are formed by photolithography or are laser drilled.

Figure 59:
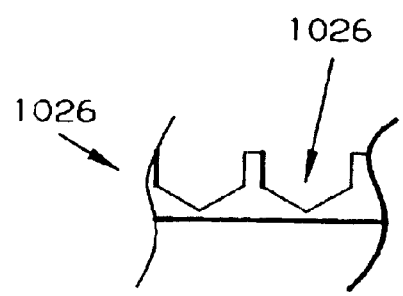
FIGS. 59, 60, and 61 show alternate embodiments of holes of the holder of FIG. 58.
Figure 60:
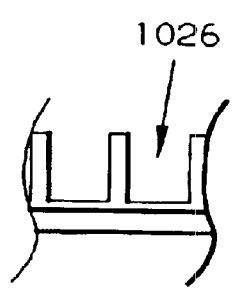
Figure 61:
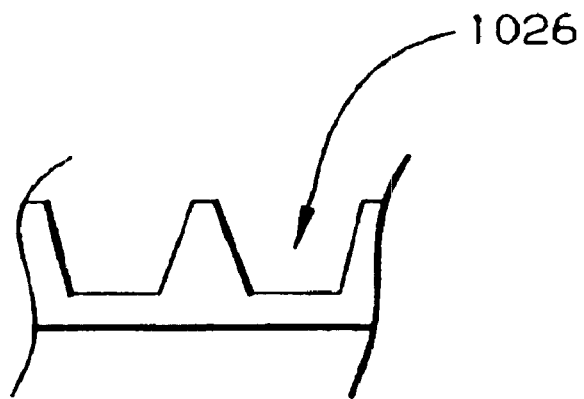
Figure 62:
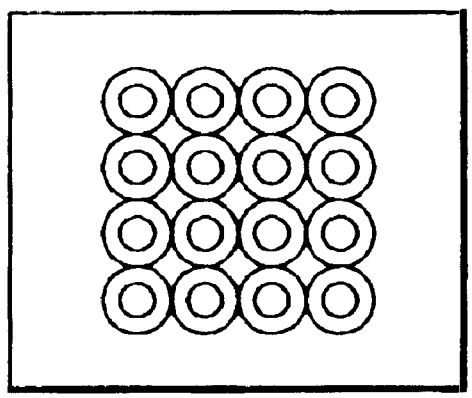
FIGS. 62 and 63 show different embodiments of the holder of FIG. 58 with the holes of round or rectangular cross sections respectively.
Figure 63:
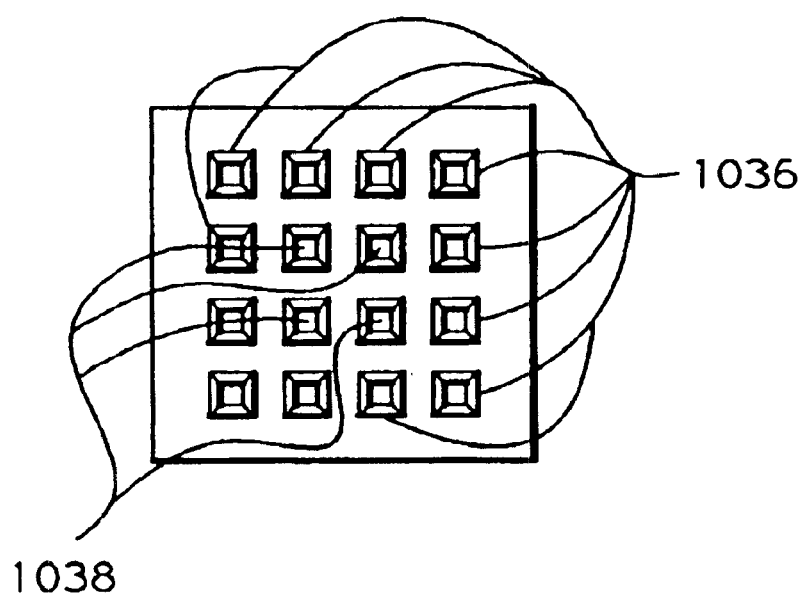

FIGS. 59, 60, and 61 show alternate embodiments of holes 1026. The holes can have round or rectangular cross sections as shown in FIGS. 62 and 63. Preferably, the walls are at least 0.050 mm thick between rectangular holes and 0.025 mm thick between round holes. Preferably, the holes include boundary holes 1036 defining the boundary of a rectangle; and inner holes 1038 within the rectangle with a plurality of the inner holes spaced significantly away from the boundary holes, preferably spaced away from the boundary at least about the minimum distance along the boundary between the boundary holes.

Figure 64:
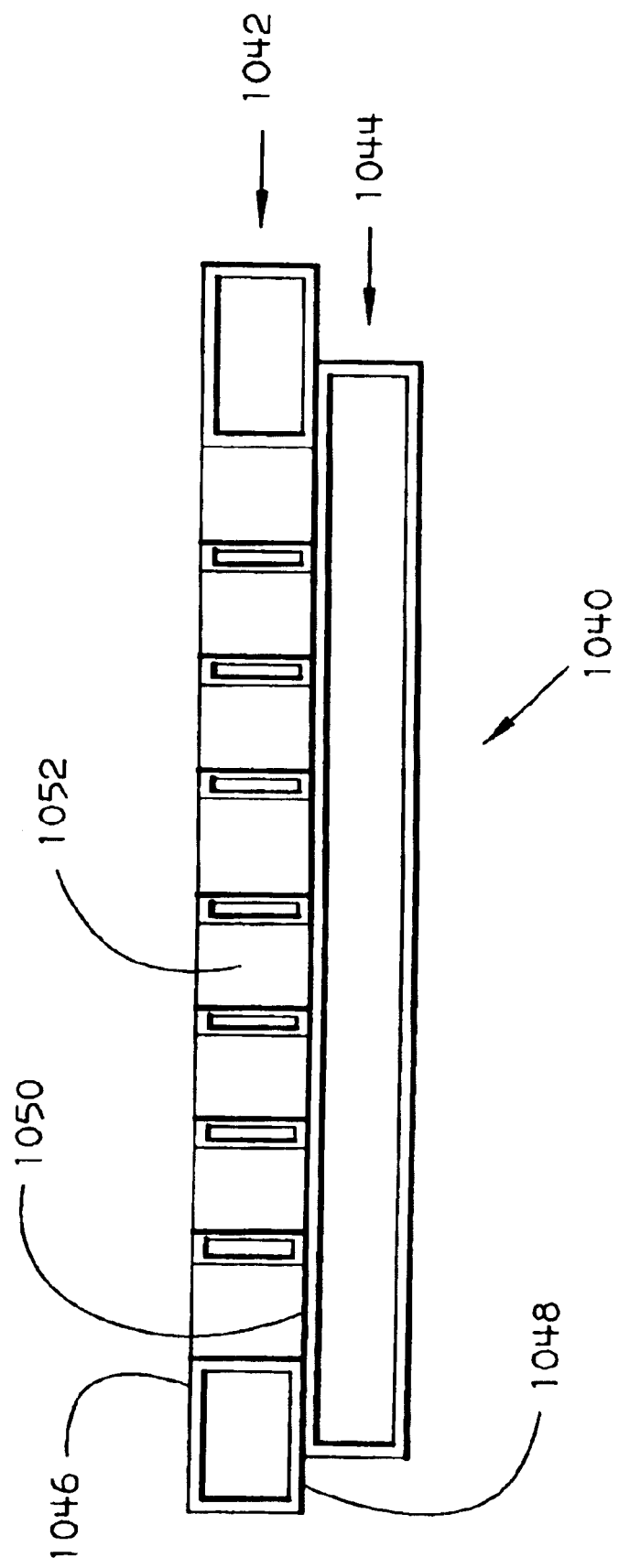
FIG. 64 shows a layered adhesive material holder in another specific embodiment of the invention which includes a front substrate and a back substrate.

FIG. 64 shows a layered adhesive material holder 1040 in another specific embodiment of the invention which includes a front substrate 1042 and a back substrate 1044. Transfer surface 1046.is on the front side of the front substrate, and back surface 1048 of the front substrate is positioned against the backing surface 1050 of the back substrate to form blind holes 1052. The discussion of materials for substrate 1022 and surface 1028 are generally applicable to substrates 1042 and 1044 and to surfaces 1046 and 1050. The through holes in the front substrate are a mirror image of the terminals of a component, onto which the joining material is to be transferred.

Figure 65:
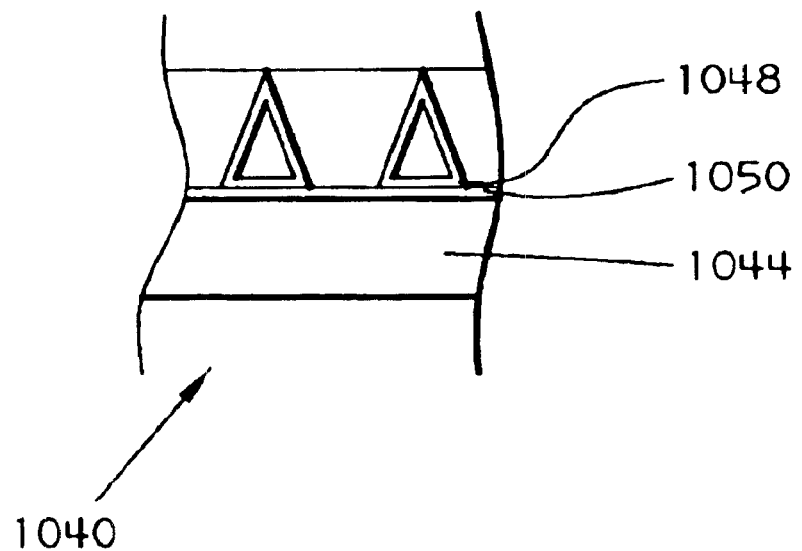
FIG. 65 shows an alternate embodiment of the layered holder of FIG. 65.

FIG. 65 shows an alternate embodiment of the layered holder 1040 in which the holes are shaped as frustrums of pyramids or cones. Preferably, if the cured joining material is against the side walls of the holes when cooled then the walls should be tapered sufficiently to provide easy separation, preferably at an angle of 5° to 45° to a central axis of the holes, more preferably at 10° to 20° to the axis.

Preferably, the front plate is biased against the back plate by mechanical spring or magnetic forces or by stretching the front plate over a round back plate or by vacuum or otherwise to prevent sufficient separation of the plates during hot transfer to form conductive bridges between the plates from one hole to another remaining after cooling. Magnetic forces may be applied by providing a front plate of a magnetic material such as iron or magnetic stainless steel and providing isolated magnets or a magnetized plate in or under the back plate to attract the front plate toward the back plate.

Figure 66:
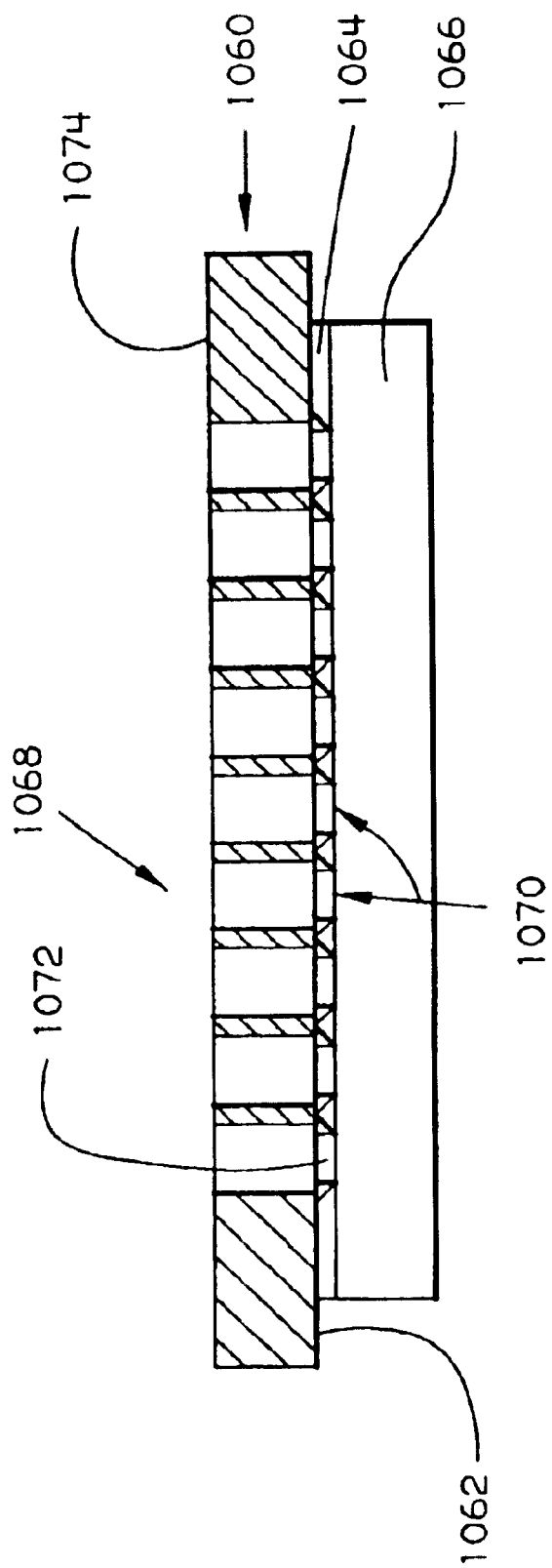
FIG. 66 shows an embodiment of the screen of the invention with holes over contacts on a component.

FIG. 66 shows screen 1060 with a transfer surface 1062 against a dielectric coating 1064 on component 1066. Holes 1068 in the screen align with windows 1070 in the coating. The windows each contain a pad 1072 of a HMT material such as copper onto which joining material (not shown) which will be moved from a screening surface 1074 into the holes, will be deposited. Stencil 1060 is similar to front plate 1042 in FIGS. 64 and 65 and above discussion of the transfer plate of FIGS. 58, 62, and 63, and front plate of FIGS. 64 and 65 are generally applicable to the screen.

Figure 67:
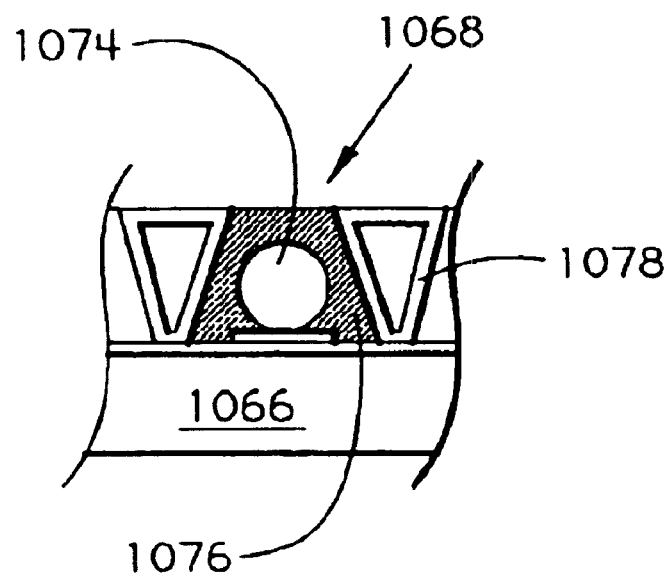
FIG. 67 shows another embodiment of the holes of the screen in FIG. 66, in which the holes are tapered from the screening surface outward to the transfer surface.

FIG. 67 shows another embodiment of the holes 1066 of FIG. 66, in which the holes are tapered from the screening surface 1074 outward to the transfer surface 1062 at an angle between about 5° and about 45°, more preferably between about 10° and about 25°. Each hole contains a spherical preform 1074 of HMT metal and LJT solder paste 1076. The walls of the, holes may be covered by a thin layer 1078 of material to which the reflowed solder paste does not significantly adhere so that the stencil can be separated from the reflowed paste before or after cooling with substantially all the solder remaining on component 1066.

FIG. 68 shows a printing machine 1100 of the invention. A component 1102 or backing plate is held in a fixed position with respect to the machine by bottom plate 1104 and screws or pins 1106 extending from the bottom plate. A screen 1108 or transfer plate is held in place on the top of the component by pins or preferably screws 1110. The bottom plate is held in frame 1112 of the printing machine by pins or screws 1114. The component, and the screen can be removed from the machine together as one unit 1116 which can be loaded into a reflow oven. The machine also includes a blade 1118 which is preferably a hard rubber squeegee which is forced to slide across the screen by motor 1120 and screw 1122 which together form a linear motor. The blade deposits joining material paste 1124 into the holes 1126 in the screen.

Figure 69:
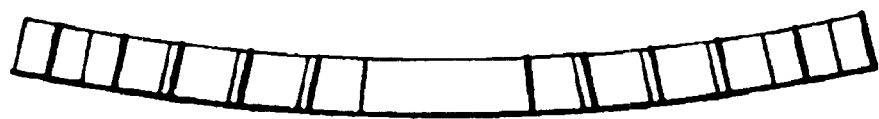
FIG. 69 shows the bowed stencil of the invention that when held against the flat component surface is biased against the component by a spring force.

Preferably, the stencil is bowed as shown in FIG. 69 so that when screwed against the component it is biased against the component by a spring force. During screening gravity and the blade also bias the stencil against the component. When the unit is removed then the spring force continues to bias the screen against the component to prevent joining material bridges between the holes from forming between the stencil and the component during heating to transfer the joining material.

Alternately, or in addition backing plate 1102 or bottom plate 1104 is a magnet and front plate or stencil 1108 is made of a magnetic material that is attracted to bias the stencil against the component.

Figure 70:
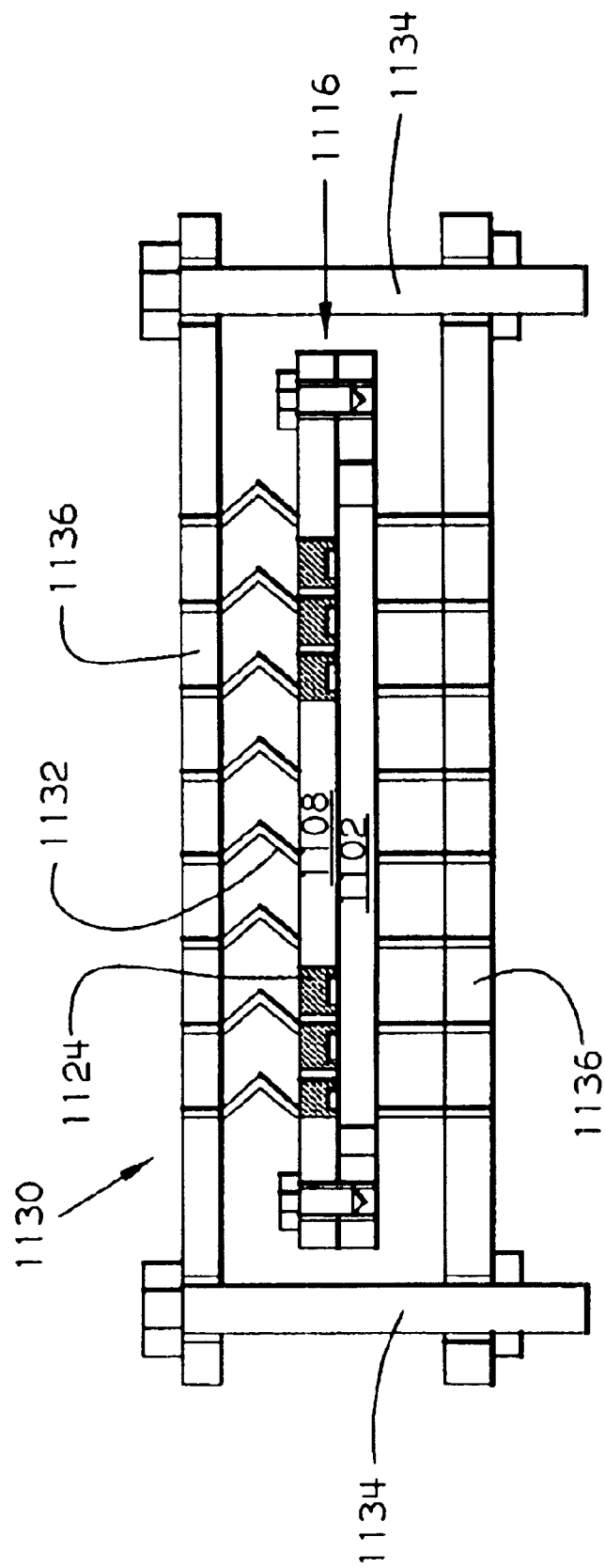
FIG. 70 shows a fixture of the invention which holds a unit for biasing the screen against the component as paste is heated and transferred from the screen to the component.

FIG. 70 shows a fixture 1130 which holds unit. 1116 and biases screen 1108 against component 1102 as paste 1124 is heated and transferred. The fixture includes mechanical springs 1132 to apply the force to bias the screen against the component. The springs are preset by bolts 1134 which force spring support plates 1136 together.

Figure 71:
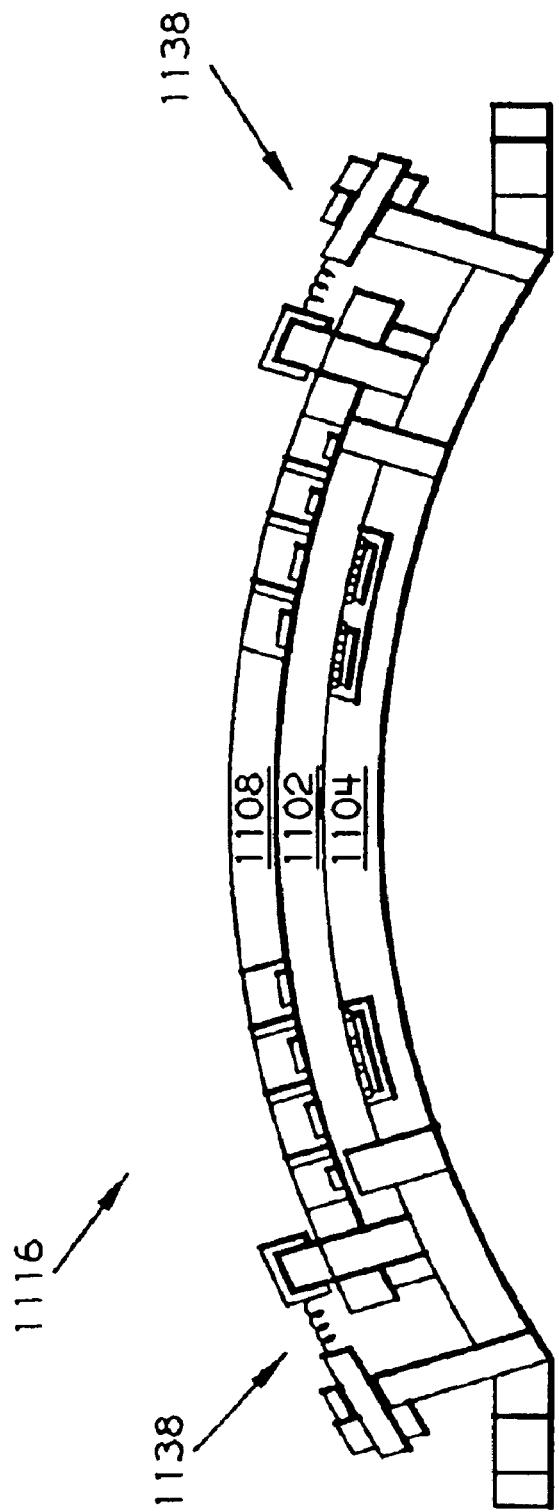
FIG. 71 shows another embodiment of the unit of FIG. 68 for biasing,the stencil against the component.

FIG. 71 shows another embodiment of unit 1116 for biasing stencil 1108 against component 1102. This unit also includes the bottom plate 1104 which is bent and an adjustable springs 1138 to tension the stencil to bias the stencil against the component. This embodiment can be used when component 1102 is a rigid organic circuit boards that is sufficiently flexible and is especially useful when the component is a flexible circuit board. Generally this method is not as useful for ceramic components which tend to be very stiff or when 1102 is a backing plate and an area array component needs to be placed on top of a front plate 1108.

Preferably, the backing plate is a rigid organic or ceramic and not a metal in order to reduce the heat capacity and allow rapid heating and cooling of unit 1116.

Figure 72:
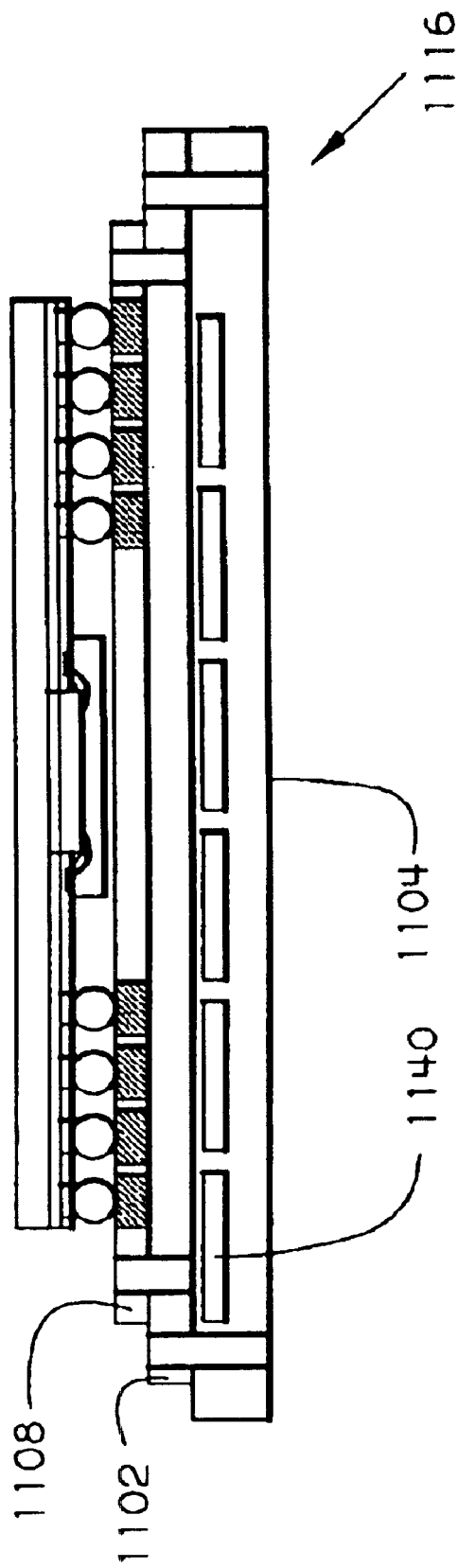
FIG. 72 hows another embodiment of unit of FIG. 68 in which magnets bias a magnetic stencil against the component.

FIG. 72 shows another embodiment of unit 1116. This unit includes a bottom plate 1104 containing discrete magnets 1140 embedded in the bottom plate for attracting a magnetic stencil 1108 against backing plate or component 1102. Preferably, the magnets are as close to the stencil as possible, more preferably the magnets are positioned against the backing plate and the backing plate is also a magnetic material or is eliminated.

FIGS. 73(a)–73(h) illustrate specific embodiments of apparatus for producing the flip chips of the invention. In 73a a ceramic crucible 1200 containing liquid silicon metal 1202 sits on a turntable 1204 driven by motor 1206. Motor 1208 slowly withdraws crystal seed 1210 from the crucible to form a cylindrical crystal 1212 of silicon. In 73b a band 1220 or EMD: electrode is driven around pulleys 1222 by motor 1224 as silicon crystal 1226 is moved on table 1228 by motor 1230 to form wafers 1232 of silicon. In 73c light is directed by lease 1234 from source 1236 through mask 1238 to expose photoresist layer 1240 on wafer 1232. In 73d wafer 1232 with the exposed photoresist is rinsed or etched by liquid 1242 delivered by pump 1244 through spray head 1246 to strip the exposed or unexposed photoresist to produce a photoresist pattern on the wafer. In 73e dopant 1250 is electrically heated by filament 1252 in vacuum chamber 1254 to evaporate and then be absorbed by the exposed surface 1256 of wafer 1232 then photoresist pattern is stripped by apparatus 73d. The chamber also includes a vacuum pump 1258 and valve 1260. Apparatus 73c–73e are repeatedly used to form electronic devices (not shown) on the wafer. The apparatus of 73c and 73d are also used to form photoresist patterns for sputtering to form wiring layers and dielectric layers. In 73f a cathode 1262 is charged in vacuum chamber 1264 to release ions which are deposited on the exposed surface 1256 of wafer 1232. The apparatus of 73c, 73d, and 73f are repeatedly used to form aluminum wiring layers, silicon dioxide layers with vias separating the wiring layers, the passivation layer, with windows, and to form pads of chromium, copper, and aluminum on the passivation layer at the windows (see discussion of FIGS. 21 and 22 above). In 73g laser 1300 delivers a beam through optic cable 1302 to head 1304 positioned by robot 1306 to form holes through a plate 1308 to form a stencil 1310 or front plate. Alternatively the stencil or front plate may be formed photo-lithographically by the apparatus of 73c and 73d.

The wafer and stencil or front plate are positioned together in a fixture as described above in reference to FIGS. 68–72, and joining material paste is screened to fill the holes in the stencil as shown in FIG. 68. Then in 73h stencil 1310 is held biased against wafer 1232 by one of the apparatus described in relation to FIGS. 68–72, and they are placed together on conveyer 1320 and moved by motor 1322 into an oven 1324 where infrared elements 1326 heat the joining material sufficiently to transfer such material onto the pads on the wafer. The wafer can be diced to form chips using the same band saw or EMD saw in 73b that was used to produce the wafers.

FIGS. 74(a)–74(i) illustrates specific embodiments of apparatus for producing modules with rigid organic carrier substrates. In FIG. 74a fiberglass cloth 1340 is moved through a reservoir 1342 of uncured liquid epoxy, and partially cured by heaters 1344, and cut with a knife 1346 to form prepregs 1348. In FIG. 74b a hydraulic press 1350 with heating elements 1352 laminates prepregs 1348 and copper foil 1354 together to form substrates 1356. In FIG. 74c a motor 1360 operates multiple drills 1362 which a hydraulic reservoir, pump, and control valve system 1364 lowers to form holes through substrate 1356. Alternately, the holes could be drilled using the laser system of FIG. 73g. In FIG. 74d drilled substrate 1356 is placed in an electoless bath 1366 and a flash layer of copper is deposited on the surface and in the holes. Photoresist is provided over the flash layer using the apparatus of FIGS. 73c and 73d in a pattern to form wiring layers. In FIG. 74e copper flash coated substrate 1356 is placed in a electroplating bath 1368 and copper is electroplated into the holes and onto the surface to form wiring layers. The photoresist is stripped and the exposed flash is etched off using the apparatus of FIG. 73d to form the carrier substrate 1370.

In FIG. 74f substrate 1370 is placed onto a transfer substrate 1380 with blind holes 1382 similar to those described in FIG. 59, formed by the mechanical drill of 74c, which are filled with eutectic Pb/Sn solder paste by the screener of FIG. 68. A stencil substrate 1384 of magnetic material, with through holes 1386 also filled with eutectic solder paste,: is produced by the laser drill of 73g or photolithographic system of 73c and 73d, and placed on the top of the carrier substrate. Magnets 1388 in the transfer substrate bias the stencil against the carrier substrate. The assembly is moved through a reflow oven of 73f to form solder bumps on the top and bottom surfaces of the carrier substrate. In FIG. 74g hydraulic bump flattener 1390 forces anvil 1392 against the eutectic bumps on the top of carrier 1370 to flatten them as shown prior to connecting a flip-chip on the flattened bumps on top of the carrier using the oven of 73f.

Figure 74:
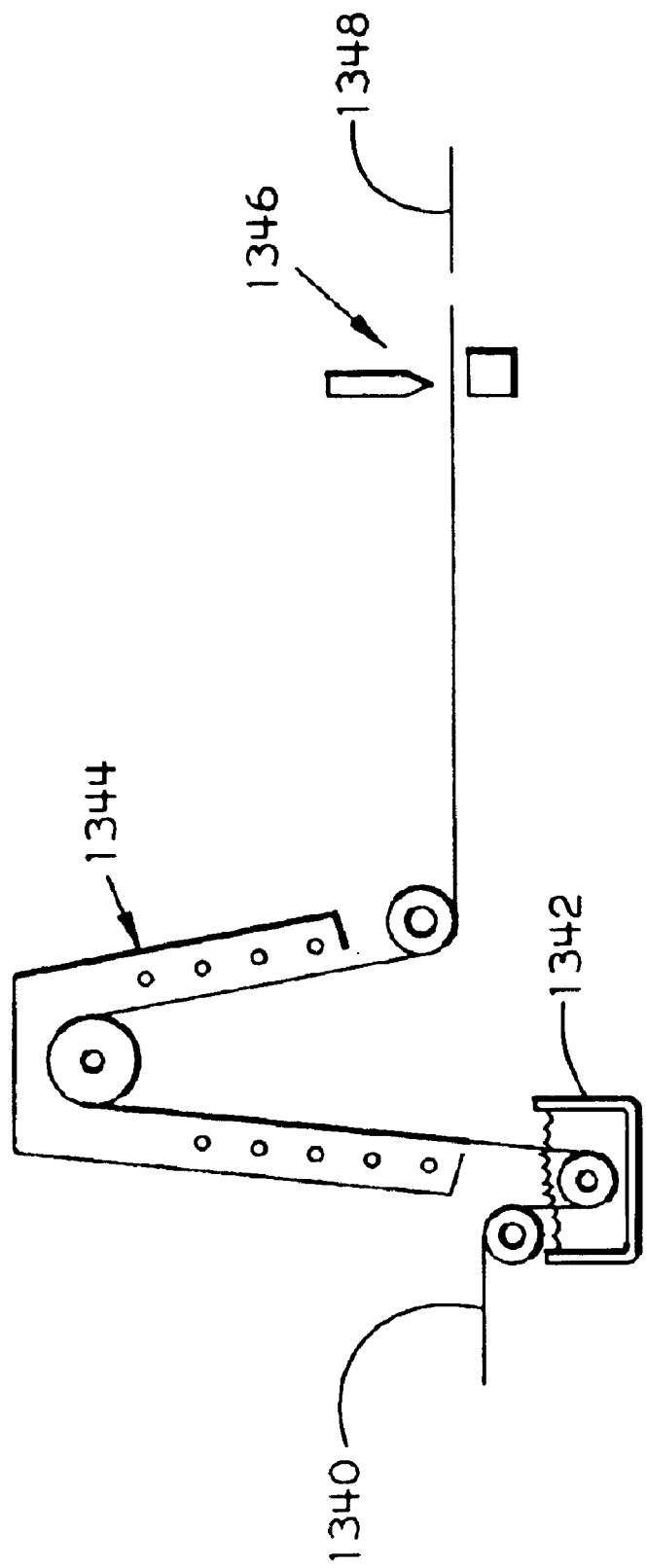
Figure 74:
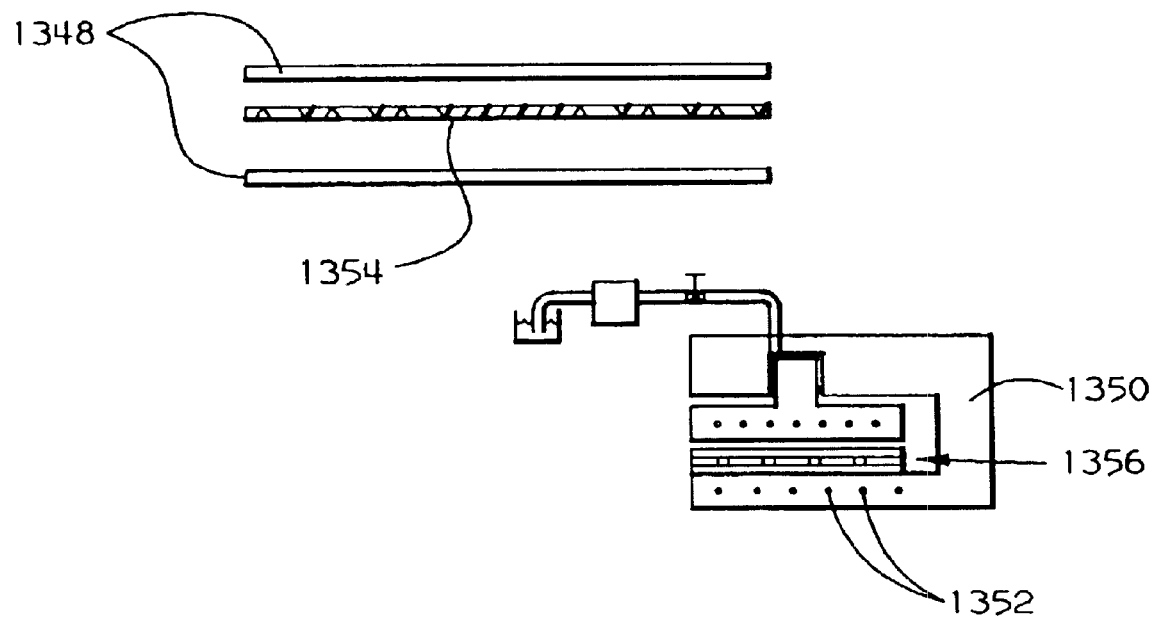
Figure 74:
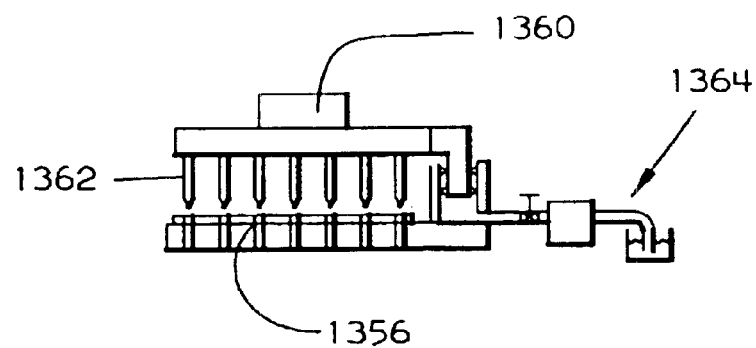
Figure 74:
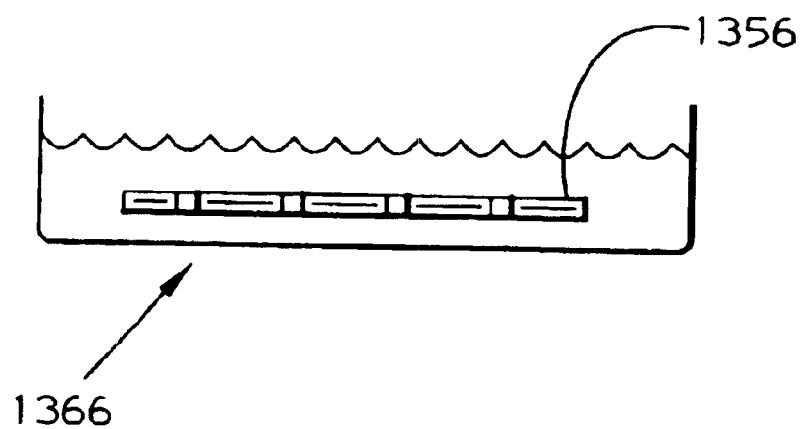
Figure 74:
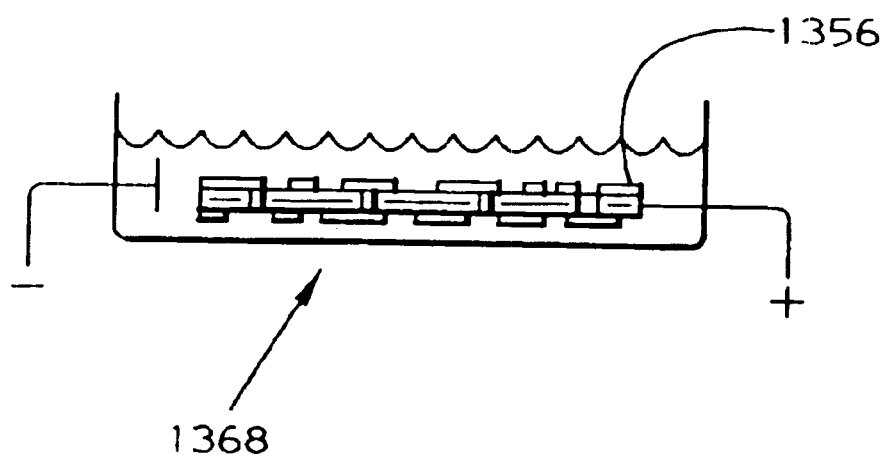
Figure 74:
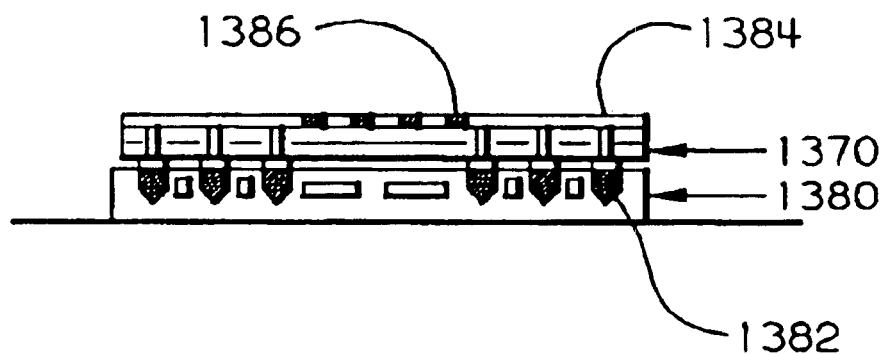
Figure 74:
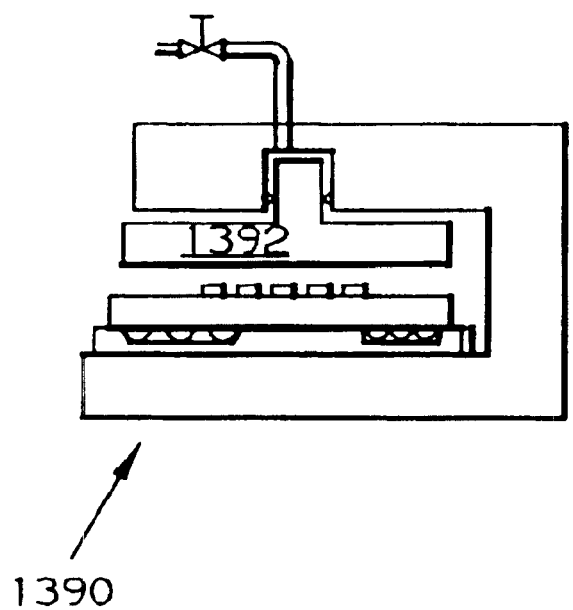
Figure 74:
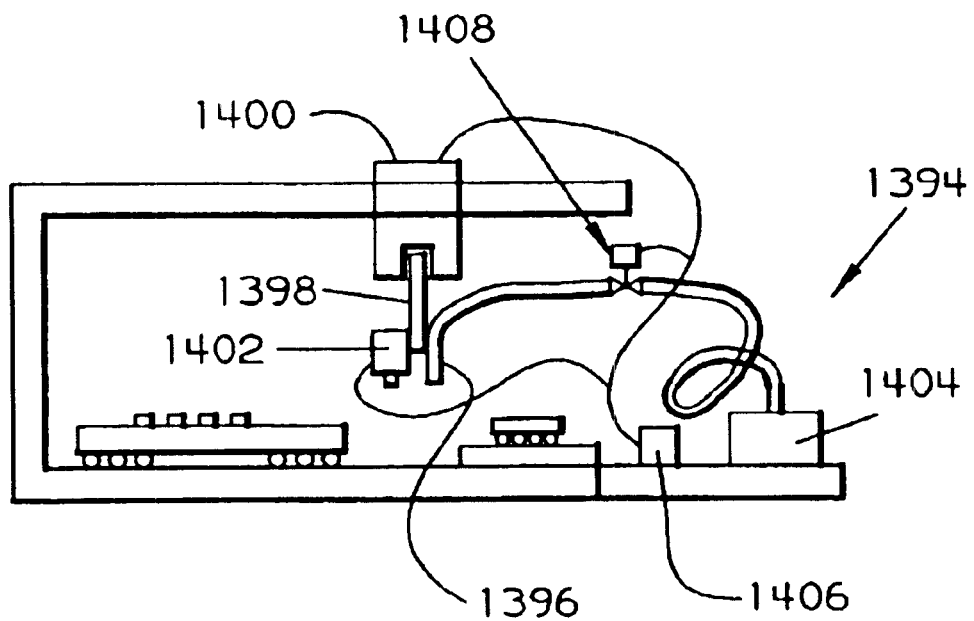
Figure 74:
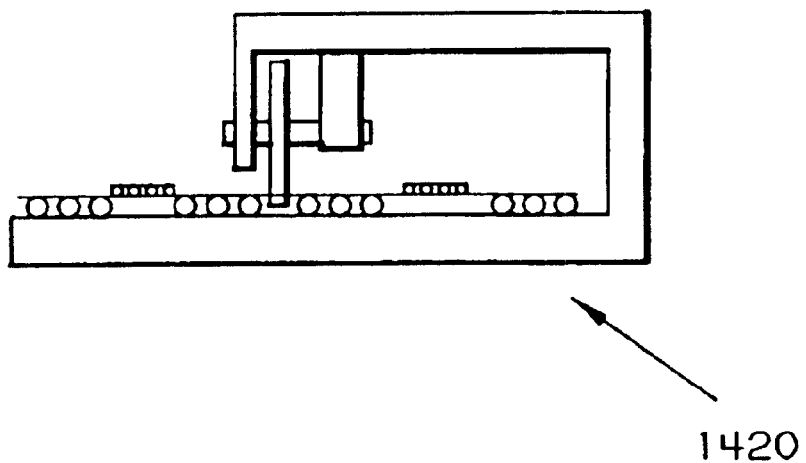

In 74h pick-and-place machine 1394 uses a vacuum probe 1396 and robot arm 1398 moved by motor 1400 to pick up a flip-chip, and a vision system 1402 to very accurately place it on the carrier substrate. The vacuum is provided by pump 1404. A computer controller 1406 is connected to solenoid valve 1408 to control the vacuum at the probe to place the chip and is also connected to the vision system to receive signals and to the motor to control positioning of the chip. In FIG. 74i a grinder or router 1420 cuts a larger panel into multiple carrier modules. The apparatus of FIG. 74 can also be used to produce circuit boards for attachment of chip carrier modules.

Figure 73:
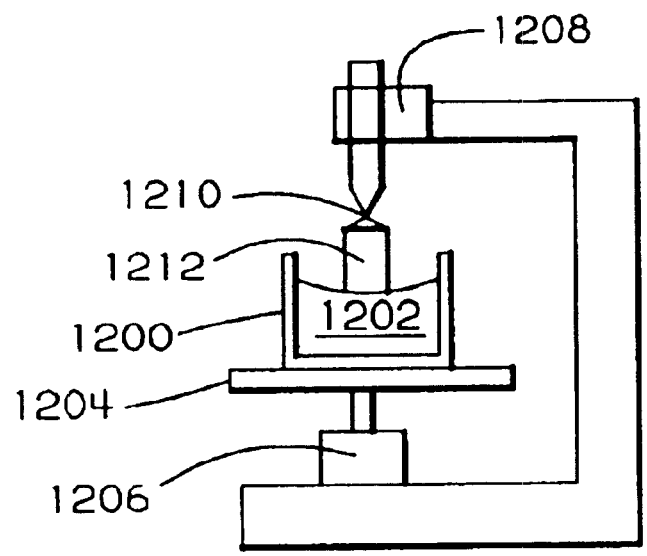
FIGS. 73(a)–73(h) schematically illustrates specific embodiments of apparatus for producing the flip chips of the invention FIGS. 74(a)–74(i) schematically illustrates specific embodiments of apparatus for producing modules of the invention wit rigid organic carrier substrates.
Figure 73:
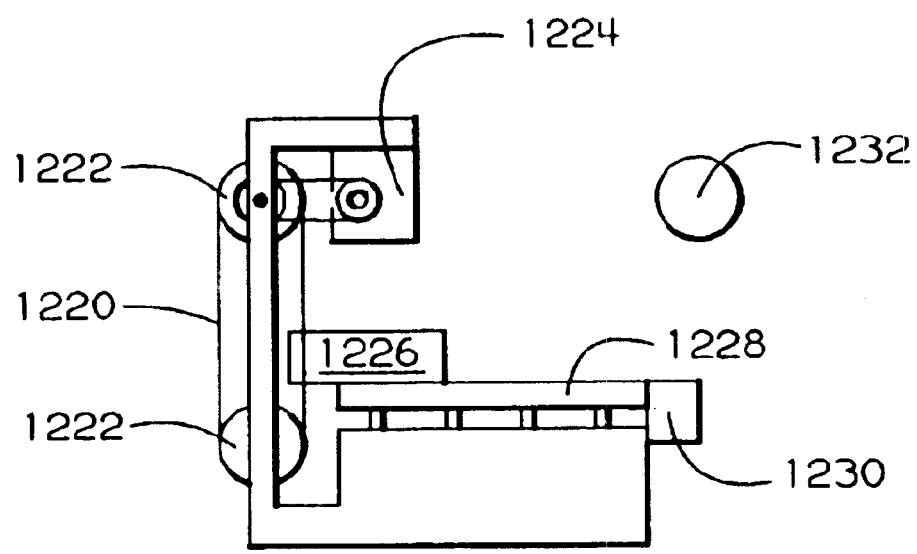
Figure 73:
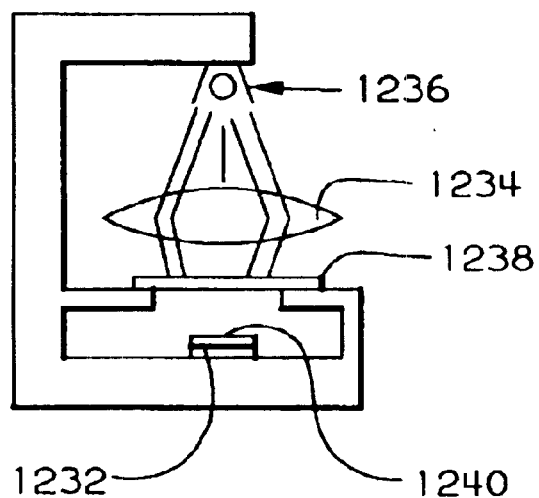
Figure 73:
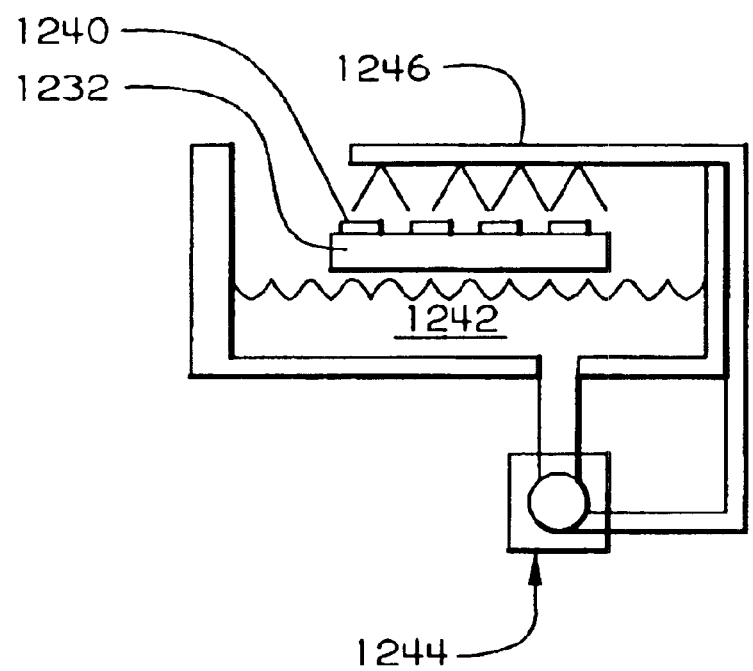
Figure 73:
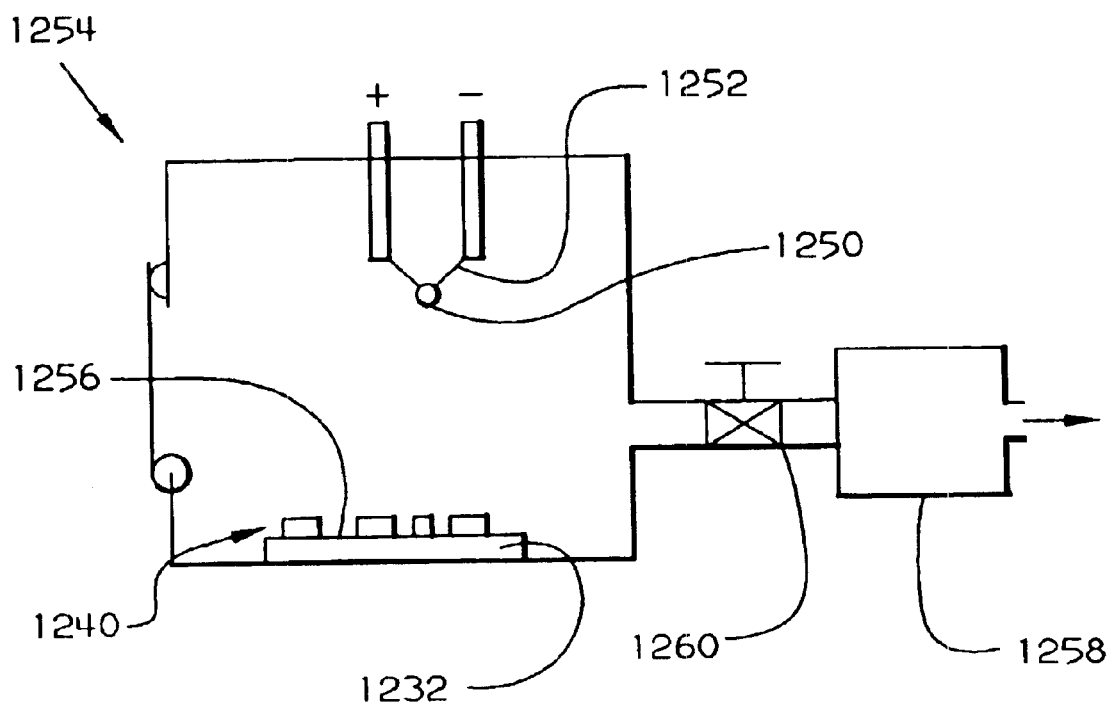
Figure 73:
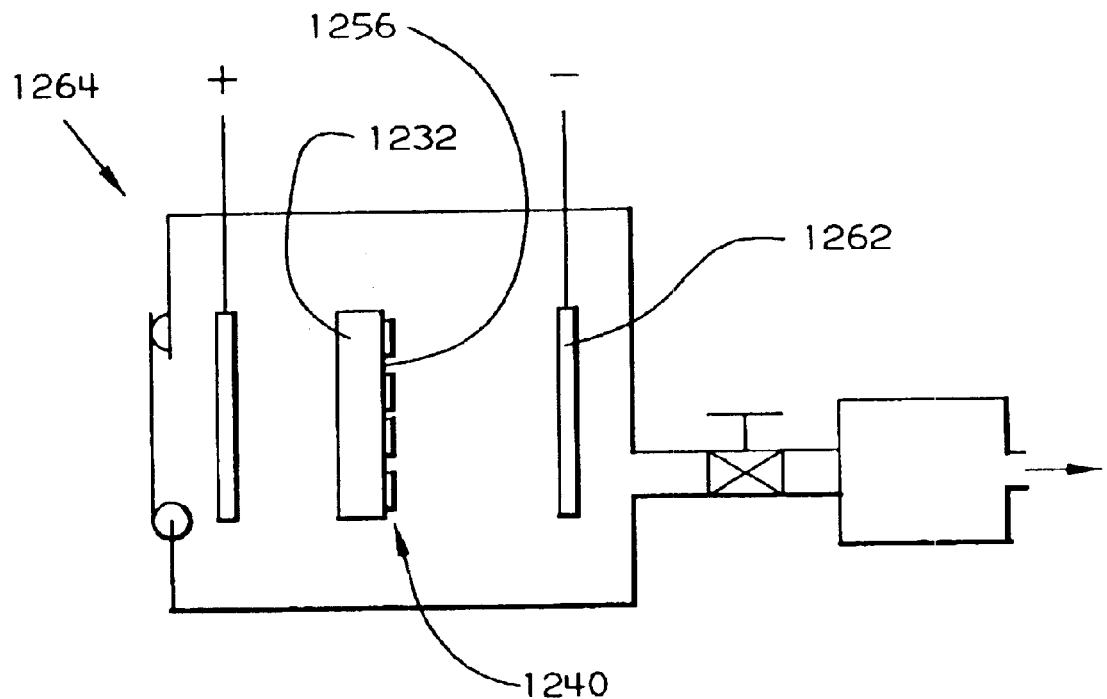
Figure 73:
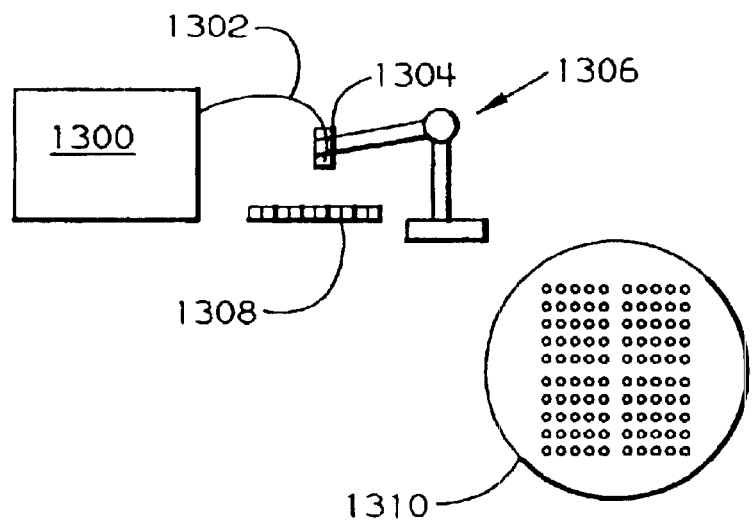
Figure 73:
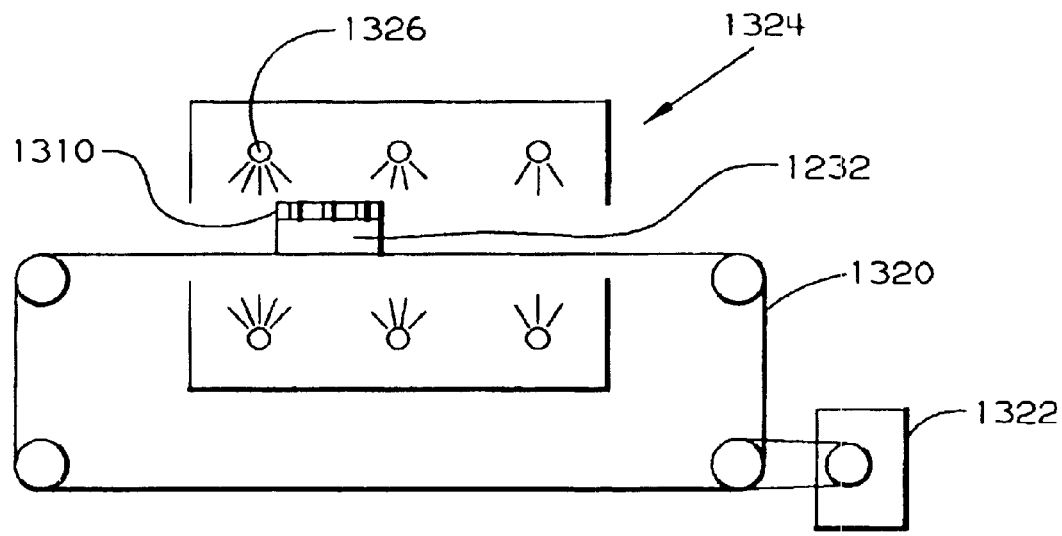

Apparatus of the type described in FIGS. 73 and 74 could also be used for producing flexible carrier substrates or flexible circuit boards. The press of 74b can be used for laminating sheets of polyimide and pre-patterned copper foil to form flexible substrates. A punch similar to that in FIG. 74c can be used to punch through holes in the flexible substrate. Then the flexible substrates could be processed in a manner similar to rigid substrates in FIGS. 74d–74h.

Figure 75:
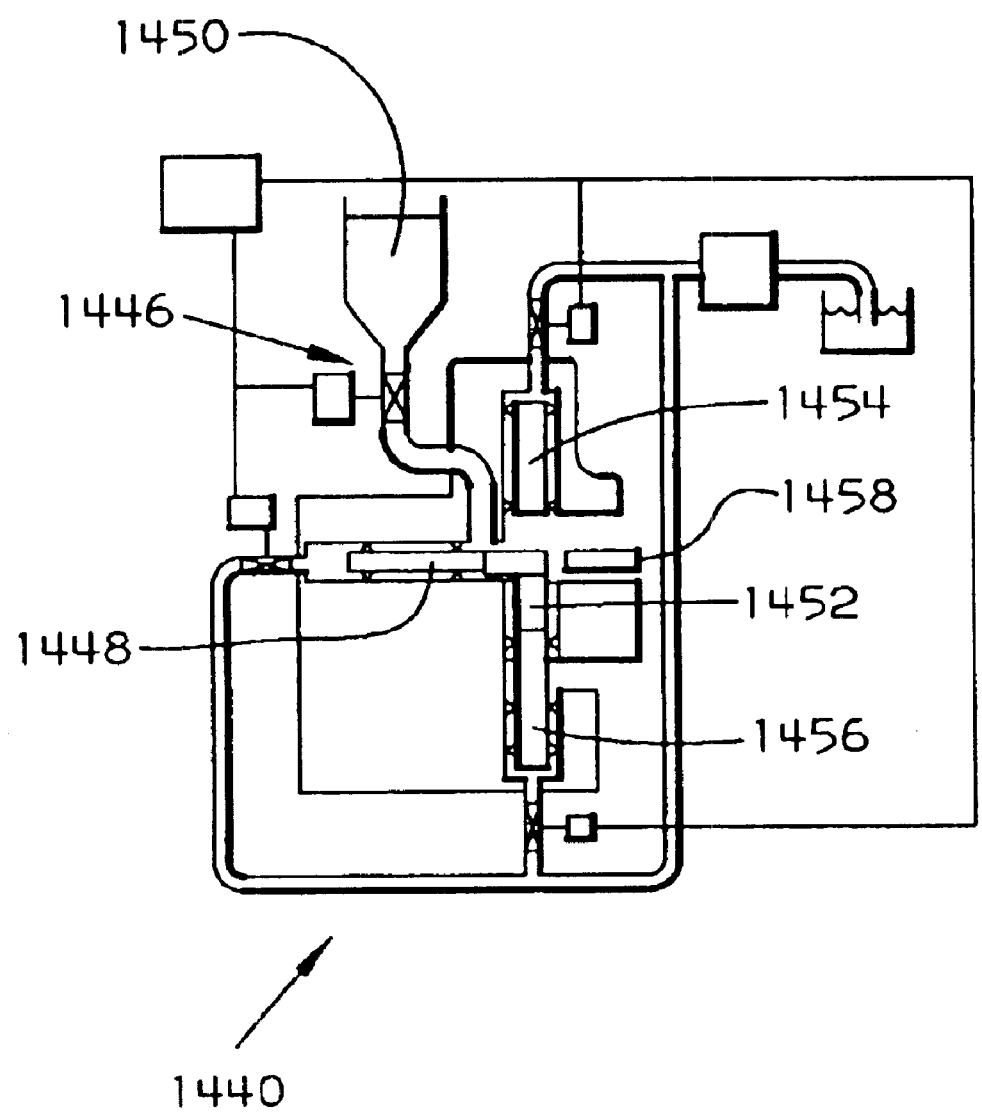
FIGS. 75(a)–75(c) schematically shows specific embodiments of apparatus for producing modules of the invention with ceramic substrates.
Figure 75:
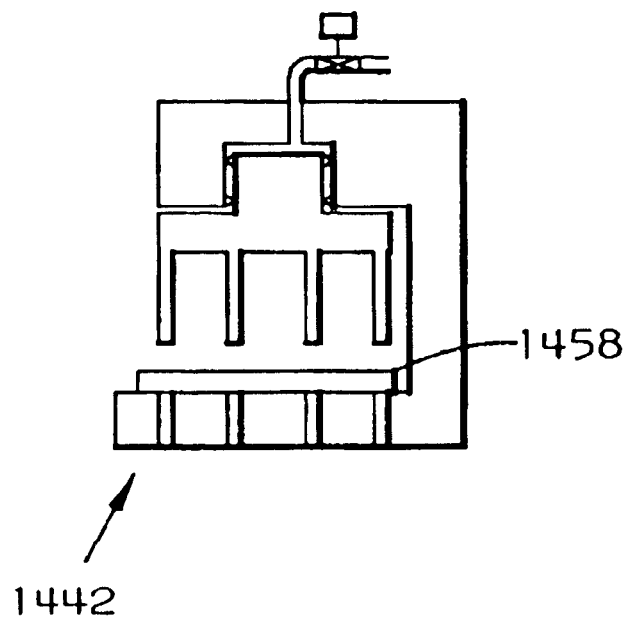
Figure 75:
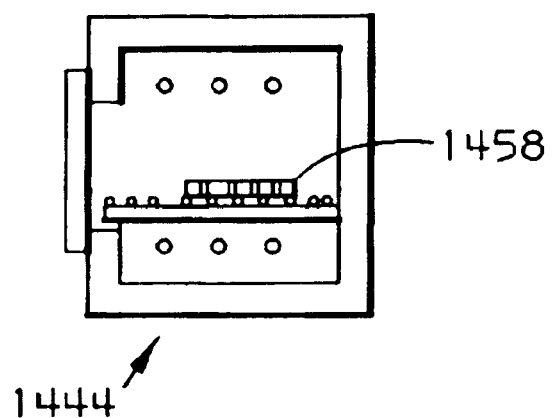

FIGS. 75(a)–75(c) shows apparatus for making ceramic substrates including dry press 1440 in FIG. 75a for forming green sheets, hole punch 1442 in FIG. 75b to form vias through sheets 1458, and kiln 1444 in FIG. 75c for firing the green sheets 1458 to produce ceramic substrates. After the ceramic substrates are formed the apparatus of FIGS. 73c–73f can be used to produce the ceramic modules of the invention in a manner similar to that described above for wafers. Valve 1446 and ram 1448 deliver dry powder from hopper 1450 through a hose into a die chamber 1452. Rams 1454 and 1456 compress the powder into a green sheet 1458 and rams 1456 work together with ram 1448 to eject the green sheet from the press.

While the present inventions have been disclosed with respect to specific preferred embodiments, the invention is not limited by the specific arrangements of apparatus and steps described above. Various modifications can be made by those skilled in the art without departing from the spirit of these inventions, only limited by the following claims and their equivalents.

What is claimed is:

1. A module, for subsequent placement onto an interconnect structure, comprising:

a substrate having a chip bonding surface;

an array of chip bonding pads on the chip bonding surface;

a computer chip bonded to the bonding pads;

a wiring layer on the substrate including flat metal terminals, said flat metal terminals physically separated and different from said bonding pads;

first bumps of a different metal having a melting temperature substantially lower than the melting temperature of said metal terminals, said first bumps in direct contact with and attached to said metal terminals;

second bumps of a solder material having a melting temperature substantially lower than said melting temperature of said different metal of said first bumps, said second bumps covering said first bumps.

2. The module of claim 1 wherein said substrate comprises a flexible substrate of organic film.

3. The module of claim 1 wherein said chip bonding surface and said wiring layer are on the same side of the substrate.

* * * * *